United States Patent
Inoue et al.

(10) Patent No.: US 7,952,909 B2
(45) Date of Patent: May 31, 2011

(54) NONVOLATILE SEMICONDUCTOR MEMORY DEVICE

(75) Inventors: Kohji Inoue, Osaka (JP); Yasunari Hosoi, Osaka (JP); Shigeo Ohnishi, Osaka (JP); Nobuyoshi Awaya, Osaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 181 days.

(21) Appl. No.: 12/517,025

(22) PCT Filed: Nov. 5, 2007

(86) PCT No.: PCT/JP2007/071501
§ 371 (c)(1),
(2), (4) Date: May 29, 2009

(87) PCT Pub. No.: WO2008/068991
PCT Pub. Date: Jun. 12, 2008

(65) Prior Publication Data
US 2010/0080037 A1   Apr. 1, 2010

(30) Foreign Application Priority Data

Dec. 6, 2006 (JP) ................................. 2006-330045

(51) Int. Cl.
*G11C 11/00* (2006.01)
(52) U.S. Cl. .................. 365/148; 365/175; 365/189.09
(58) Field of Classification Search .................. 365/148, 365/175, 189.09
See application file for complete search history.

(56) References Cited

U.S. PATENT DOCUMENTS

| 6,930,909 B2 * | 8/2005 | Moore et al. ................... 365/148 |
| 6,937,528 B2 * | 8/2005 | Hush et al. ................ 365/189.07 |
| 2006/0067106 A1 | 3/2006 | Mori et al. |
| 2009/0052225 A1 | 2/2009 | Morimoto |

FOREIGN PATENT DOCUMENTS

| JP | 2006-99882 A | 4/2006 |
| JP | 2006-190376 A | 7/2006 |

(Continued)

OTHER PUBLICATIONS

H. Pagnia et al., "Bistable Switching in Electroformed Metal-Insulator-Metal Devices", Physica Status Solidi (a), 108, pp. 11-65, 1988.

(Continued)

*Primary Examiner* — Tuan T Nguyen
*Assistant Examiner* — Toan Le
(74) *Attorney, Agent, or Firm* — Birch, Stewart, Kolasch & Birch, LLP

(57) ABSTRACT

Provided is a nonvolatile semiconductor device capable of performing writing operations of different resistance changes for memory cells having variable resistive elements whose resistive characteristics are changed by voltage applications, individually and simultaneously. The device includes: a load resistive characteristic variable circuit for each bit line connected commonly with the memory cells on the same column for selecting one of two load resistive characteristics according to a first writing operation where the resistive characteristics of the variable resistive element to be written transit from a low resistance state to a high resistance state or a second writing operation where they transit reversely; and a writing voltage pulse application circuit for applying a first voltage pulse in a first writing operation and a second voltage pulse in a second writing operation to the memory cells to be written through the load resistive characteristic variable circuits and the bit limes.

11 Claims, 27 Drawing Sheets

FOREIGN PATENT DOCUMENTS

JP          2006-203098 A      8/2006

OTHER PUBLICATIONS

W. W. Zhuang et al., "Novell Colossal Magnetoresistive Thin Film Nonvolatile Resistance Random Access Memory (RRAM)", IEDM Technical Digest, pp. 193-196, Dec. 2002.

W. Y. Cho et al., "A 0.18μm 3.0V 64Mb Non-Volatile Phase-Transition Random-Access Memory (PRAM)", 2004ISSCC Digest of Technical Papers, pp. 40-41, Feb. 2004.

* cited by examiner

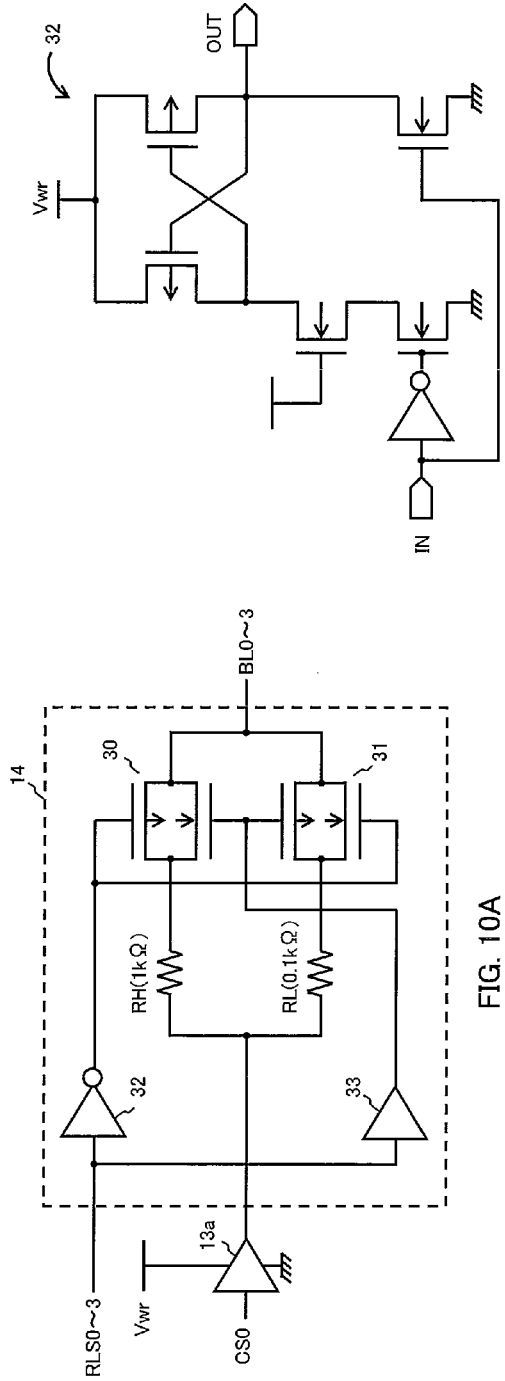
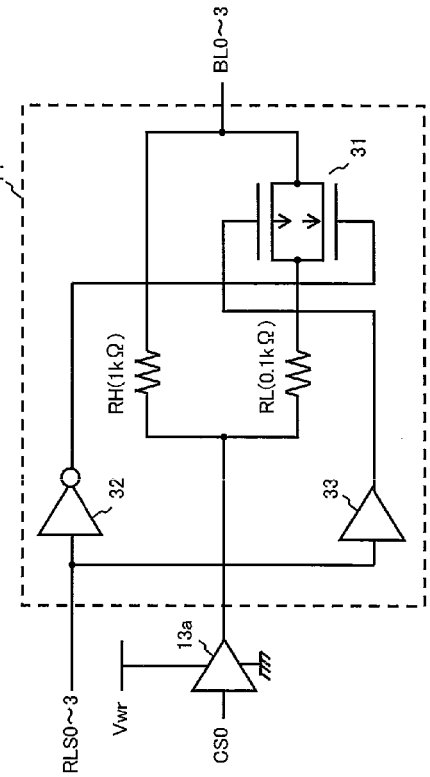
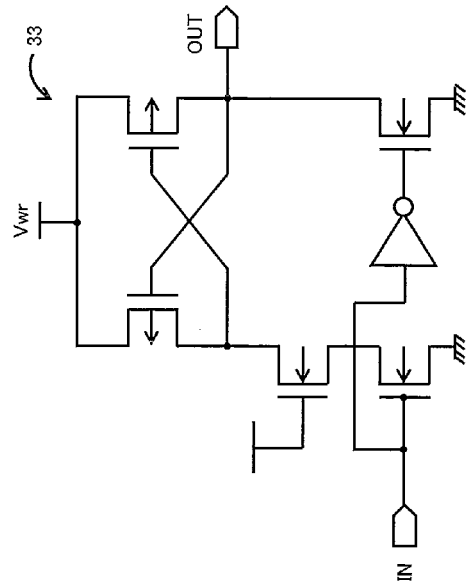
FIG. 10A
FIG. 10B
FIG. 10C
FIG. 10D

NONVOLATILE SEMICONDUCTOR MEMORY DEVICE

CROSS-REFERENCE TO RELATED APPLICATIONS

This application is a National Phase filing under 35 U.S.C. §371 of International Application No. PCT/JP2007/071501 filed on Nov. 5, 2007, and which claims priority to Japanese Patent Application No. 2006-330045 filed on Dec. 6, 2006.

TECHNICAL FIELD

The present invention relates to a nonvolatile semiconductor memory device comprising a variable resistive element whose resistive characteristics varies in accordance with application of voltage.

BACKGROUND ART

Nonvolatile semiconductor memory devices have been applied to portable phones, personal computers, household electrical appliances, gaming devices or the like, and widely used in the industrial world. The main nonvolatile semiconductor memory device currently being utilized in the industry is flash memory. In principle, flash memory is expected to face limit of miniaturization, and thus research on new nonvolatile semiconductor memory devices that will replace flash memory has been widely carried out. Among them, a study of resistance change memory that utilizes the phenomenon that application of voltage to a metal oxide film causes resistance to change (RRAM: Resistance controlled Random Access Memory) has been actively conducted recently, because the memory is more advantageous than flash memory in terms of limitation of miniaturization and because it is also capable of writing data at a high speed.

Although the study of the phenomenon that application of voltage to metal oxides such as nickel, iron, copper, titanium or the like changes resistance had been under way since 1960s (refer to Non-Patent Document 1), then, it was never put into practical use in actual devices. At the end of 1990s, it was proposed to apply to nonvolatile semiconductor memory device the fact that by giving voltage pulse for a short time to such oxides of manganese or copper having the Perovskite-type structure, deterioration of materials can be minimized and resistance can be increased or decreased. Then, it was demonstrated that a memory array of nonvolatile unit memory devices in which variable resistive elements using these metal oxides were combined with a transistor or a diode could be really formed on a semiconductor chip. This was reported in IEDM (International Electron Device Meeting) in 2002 (refer to Non-Patent Document 2), which triggered wide research to be undertaken in the semiconductor industry. Later, a similar approach was also taken in the research on oxides of nickel or copper carried out in 1960s, and memory devices produced by being combined with a transistor or diode were also reported.

All of these technologies are basically considered a same technology as they utilize resistance change in a metal oxide film to be induced by application of voltage pulse and use different resistance states as stored information in nonvolatile memory devices.

In addition, switching characteristics of the variable resistive element using the resistance change of the metal oxide film in accordance with the application of the voltage pulse include a bipolar type and a unipolar type. The switching characteristics of the both and practical applications thereof have already been reported in IEDM (refer to Non-Patent Document 2).

The bipolar switching implements switching between two resistance states by utilizing voltage pulses having two different polarities of plus and minus, having resistance of a variable resistive element transit from low resistance state to high resistance state with voltage pulse of any one of the polarities, and then having it transit from the high resistance state to the low resistance state with voltage pulse of the other polarity.

In contrast, the unipolar switching implements switching between two resistance states by utilizing voltage pulses having a same polarity and two different durations of long and short application (pulse width), having resistance of a variable resistive element transit from the low resistance state to the high resistance state with voltage pulse of one duration of application and then having it transit from the high resistance state to the low resistance state with voltage pulse of other duration of application.

Switching operations based on the two switching characteristics described above have benefits and problems, respectively. In fact, since the bipolar switching can implement transit time of several 10 ns or shorter as resistance increases or decreases, a memory device utilizing this can write accumulated data at a very high rate. However, due to use of application of voltage pulses of both positive and negative polarities, configuration of a circuit for implementing a semiconductor memory device becomes complex and chip size expands, thus leading to increased manufacturing cost.

On the other hand, as the unipolar switching can implement switching operation with voltage pulses of a single polarity, circuit configuration can be simplified, chip size can be smaller than that of the bipolar switching, and thus the former is better in terms of the manufacturing cost. In addition, as a combination of a diode and a variable resistive element can be used for a unit memory device, possible effect of current leakage from adjacent memory cells, which will be a problem when a memory cell array is configured as a cross point type, can be substantially reduced, thereby resulting in considerably improved electric characteristics in readout operation. However, as the unipolar switching uses two long and short voltage pulses, and, in particular, the former one needs the pulse width of a few μs, writing thereof takes 100 times longer than that of the bipolar switching. In addition, since the memory cell current during writing ranges from about several hundreds μA to a few mA as with the case of the bipolar switching, to write each memory cell, the unipolar switching also requires about 100 times as high power consumption as the bipolar switching. Thus, it is severely inferior to the bipolar switching in terms of performance during writing.

As a memory element whose resistance varies other than the RRAM, a phase change random access memory (PCRAM) has been developed. As the PCRAM uses a chalcogenide material as a resistor, a resistor material is crystallized or non-crystallized by heat generated when an electric pulse signal is applied, and the low resistance state or high resistance state is determined by a crystal state thereof. In general, although the resistance state of the PCRAM is changed by a unipolar switching operation similar to the RRAM, it takes as long as 100 ns to 1 μs for a set operation, as compared with a reset operation (change from the low resistance state to the high resistance state). According to the following non-patent document 3, the reset operation time is 30 ns while the set operation time is 120 ns.

Non-patent Document 1: H. Pagnia, et. al, "Bistable Switching in Electroformed Metal-Insulator-Metal Devices", Physica Status Solidi (a), 108, pp. 11-65, 1988

Non-patent Document 2: W. W. Zhuang, et. al, "Novell Colossal Magnetoresistive Thin Film Nonvolatile Resistance Random Access Memory (RRAM)", IEDM Technical Digest, pp. 193-196, December 2002

Non-patent Document 3: W. Y. Cho, et. al, "A 0.18 µm 3.0V 64 Mb Non-Volatile Phase-Transition Random-Access Memory (PRAM)", 2004ISSCC Digest of Technical Papers, pp. 40-41, February 2004

DISCLOSURE OF THE INVENTION

First, before describing the problems to be resolved by the invention and the means for solving the problems, we describe conditions that can stably implement switching operations based on the bipolar and unipolar switching characteristics as described above, as technological idea on which the present invention is founded.

FIG. 23 is representative of current-voltage characteristics showing basic characteristics of resistance change due to application of voltage between both electrodes in a variable resistive element that is configured to sandwich a variable resistor between an upper electrode and a lower electrode. The current-voltage characteristics as shown in FIG. 23 were measured by using a commercially available measuring apparatus (e.g., a parameter analyzer made by Agilent Technologies with the model number 4156B) that can set the upper limit (compliance) of current. Specific voltage and current values differ, depending on a material, a device structure, a manufacturing process, and a device size of individual samples to be measured. However, irrespective of a type of a variable resistor, qualitative characteristics such as those in FIG. 23 can be seen, when a variable resistor is made of an oxide film or an oxynitride film of iron, nickel, copper, titanium or the like.

More specifically, when voltage equal to or higher than threshold voltage Va ($Va^+$ or $Va^-$) is applied to a variable resistive element showing resistive characteristics of high resistance state (A in the figure), it transits to resistive characteristics of low resistance state (B in the figure). The current flowing through the variable resistive element rises to the compliance value of Ic1 when applied voltage is Va or higher. Then, when the current compliance value Ic1 is set to a value that will not exceed a current value at a transition point Tb from the low resistance state (characteristics B) to the high resistance state (characteristics A), the current greater than the compliance value Ic1 does not run. Then, if applied voltage is lowered while maintaining the current value Ic1, a transition from the high resistance state (characteristics A) to the low resistance state (characteristics B) will take place. Since the applied voltage after the transition to the low resistance state is lower than the threshold voltage Vb ($Vb^+$ or $Vb^-$) at the transition point Tb, the resistive characteristics steadily transit to the low resistance state (characteristics B) rather than going back to the high resistance state (characteristics A). Next, either when the current compliance value is set greater than the current value at the transition point Tb or when the original setting is cancelled and voltage higher than the threshold voltage Vb is applied to a variable resistive element exhibiting the resistive characteristics (B in the figure) of the low resistance state, current flowing through the variable resistive element will decrease and the resistive characteristics will transit to high resistance value (A in the figure).

If voltage equal to or higher than the threshold voltage Va continues to be applied while the variable resistive element is in the high resistance state (A in the figure), without setting the current compliance value, a transition from the low resistance state (characteristics B) to the high resistance state (characteristics A) occurs immediately after a transition from the high resistance state (characteristics A) to the low resistance state (characteristics B) because the applied voltage is higher than the threshold voltage Vb. This results in an unstable oscillation phenomenon that the resistive characteristics of a variable resistive element keep on changing between the high resistance state (characteristics A) and the low resistance state (characteristics B). If the applied voltage is lowered in such the oscillating condition, oscillation stops when the applied voltage reaches voltage less than the higher threshold voltage Va. As the applied voltage is then higher than the threshold voltage Vb, the resistive characteristics of the variable resistive element are in the high resistance state (characteristics A), and thus no transition to the low resistance state (characteristics B) occurs even if voltage equal to or higher than the threshold voltage Va is actually applied. In sum, application of voltage to a variable resistive element alone without setting a current compliance value could not implement desired switching operations.

In addition, although FIG. 23 shows the case of resistive characteristics in which the threshold voltage Vb for a transition from the low resistance state to the high resistance state is lower than the threshold voltage Va for a transition from the high resistance state to the low resistance state, magnitude relation of these threshold voltages Va, Vb may be reversed. In such a case, although at the threshold voltage Va, a transition from the high resistance state to the low resistance state takes place in stable manner, oscillation occurs when the threshold voltage is equal to or higher than Vb, and application of voltage pulses higher than the threshold voltage Vb does not cause a transition to the high resistance state.

Thus, for a variable resistive element to perform switching operations in a stable manner, the following two conditions should be satisfied in each of the operations of transiting from the high resistance state to the low resistance state, and of transiting from the low resistance state to the high resistance state, respectively.

Firstly, when the resistive characteristics of a variable resistive element transit from the high resistance state to the low resistance state, it is necessary to apply voltage higher than the threshold voltage Va, wherein the threshold voltage Va is lower than the threshold voltage Vb. Secondly, when the resistive characteristics of a variable resistive element transit from the low resistance state to the high resistance state, it is necessary to apply voltage higher than the threshold voltage Vb, wherein the threshold voltage Vb is lower than the threshold voltage Va.

In a symmetrically configured variable resistive element that was reported in the past, if switching operations are performed in the variable resistive element alone, i.e., when voltage applied to the variable resistive element is turned ON and OFF under the condition that load resistance is zero or fixed to certain load resistive characteristics, applied voltages to cause transitions between the two resistance states cannot satisfy the above two conditions simultaneously if the respective applied voltages have a same polarity. Then, in order to meet the above two conditions, it was necessary to use asymmetric nature of the bipolar switching characteristics to an asymmetrically configured variable resistive element to be discussed later or the unipolar switching operation that uses changes in the resistive characteristics due to elevated temperatures.

FIG. 24 shows resistive characteristics (current-voltage characteristics) of a variable resistive element capable of bipolar switching operation by satisfying the above two conditions. FIG. 24 shows load resistive characteristics C of a load circuit as well as two resistive characteristics A, B of a variable resistive element. The load circuit forms a serial circuit by electrically connecting to the variable resistive element in series, and when voltage is applied to both ends of the serial circuit, resistive voltage division of the variable resistive element and the load circuit determines voltage to be applied to the variable resistive element. In FIG. 24, voltage at each intersection of the load resistive characteristics C and the resistive characteristics A, B is voltage to be actually applied to the variable resistive element, and the intersection of the load resistive characteristics C and the voltage axis represents voltage to be applied to both ends of the serial circuit. Increasing and decreasing voltage to be applied to both ends of the serial circuit results in lateral translation (in the direction of voltage axis) of a characteristic curve or a characteristic line representative of the load resistive characteristics C. In the example shown in FIG. 24, load resistance exhibiting linear load resistive characteristics as a load circuit is assumed in the description.

In the current-voltage characteristics shown in FIG. 24, threshold voltage VA+ for a transition from the high resistance state (characteristics A) to the low resistance state (characteristics B) as a result of application of voltage to the serial circuit on the side of one polarity (positive polarity) is smaller in absolute value than threshold voltage $VB^+$ for a transition from the low resistance state to the high resistance state on the side of the same polarity (positive polarity), wherein voltage equal to or higher than threshold voltage $Va^+$ is applied between both terminals of the variable resistive element when voltage absolute value of which is equal to or higher than the threshold voltage $VA^+$ is applied to both ends of the serial circuit, thus causing the transition from the high resistance state to the low resistance state. The example shown in FIG. 24 has achieved similar effect to that described in FIG. 23, by substituting a load circuit for setting a current compliance. In fact, due to presence of the load circuit, increase in the current through the variable resistive element caused by the transition from the high resistance state to the low resistance state lowers voltage through the load circuit, thus automatically reducing voltage applied to the variable resistive element. If the load resistive characteristics of a load circuit are properly set, an absolute value of the voltage applied to the variable resistive element after the transition to low resistance is lower than the threshold voltage $Vb^+$ that have the resistive characteristics transit from the low resistance state to the high resistance state, thus implementing the transition from the high resistance state to the low resistance state in a stable manner. However, even if voltage equal to or higher than the threshold voltage $VB^+$ of the same polarity (positive polarity) is applied to the serial circuit after the transition to the low resistance state, no transition from the low resistance state to the high resistance state occurs because voltage not less than the threshold voltage $Vb^+$ that is higher than the threshold voltage $Va^+$ is applied between both terminals of the variable resistive element.

On the contrary, threshold voltage $VB^-$ for a transition from the low resistance state (characteristics B) to the high resistance state (characteristics A) as a result of application of voltage to a serial circuit on the side of the other polarity (negative polarity) is smaller in absolute value than threshold voltage $VA^-$ for a transition from the high resistance state to the low resistance state on the side of the same polarity (negative polarity), wherein voltage absolute value of which is equal to or higher than threshold voltage $Vb^-$ is applied between both terminals of the variable resistive element when voltage absolute value of which is equal to or higher than the threshold voltage $VB^-$ is applied to both ends of the serial circuit, thus causing the transition from the low resistance state to the high resistance state. If the load resistive characteristics of the load circuit common to the positive and negative polarities are set, the absolute value of voltage applied to the variable resistive element after the transition to the high resistance state is lower than the threshold voltage $Va^-$ that has the resistive characteristics transit from the high resistance state to the low resistance state, thus implementing the transition from the low resistance state to the high resistance state in a stable manner. However, even if voltage absolute value of which is equal to or higher than the threshold voltage $VA^-$ of a same polarity (negative polarity) is applied to the serial circuit after the transition to the high resistance state, no transition from the high resistance state to the low resistance state occurs because voltage not less than the threshold voltage $Va^-$ that is higher than the threshold voltage $Vb^-$ is applied between both terminals of the variable resistive element.

The point to be noted here is as follows: for a variable resistive element alone, irrespective of polarity of applied voltage, threshold voltages $Vb^+$ and $Vb^-$ for a transition from the low resistance state to the high resistance state are respectively lower than threshold voltages $Va^+$ and $Va^-$ for a transition from the high resistance state to the low resistance state. Nevertheless, by making a correlation (e.g., voltage difference or voltage ratio) of the threshold voltages $Va^+$ and $Vb^+$ asymmetrical to that of the threshold voltages $Va^-$ and $Vb^-$, and by properly setting the load resistive characteristics of the load circuit, as threshold voltage of voltage applied to the serial circuit, it is possible to set the threshold voltage $VA^+$ lower in absolute value than the threshold voltage $VB^+$ on the side of positive polarity, and the threshold voltage $VB^-$ lower in absolute value than the threshold voltage $VA^-$ on the side of negative polarity. Consequently, the magnitude relation of the threshold voltages $VA^+$ and $VB^+$ and of the threshold voltages $VB^-$ and $VA^-$ can be reversed, thus enabling stable bipolar switching operations by applying voltages of both positive and negative polarities.

Now, the asymmetrical nature of both positive and negative polarities in the correlation of threshold voltages of the variable resistive element shown in FIG. 24 can be obtained by configuring in up-down asymmetrical manner a material of a lower electrode and an upper electrode of the variable resistive element, composition of a variable resistor, device shape, or device size or the like. In particular, implementation of stable bipolar switching may require extremely asymmetrical nature, for instance, the lower and upper electrodes being made of different materials, interface structure between the lower electrode and a variable resistor being different from that between the upper electrode and the variable resistor or the like. Excellent asymmetrical nature is easy to be occurred if rectifying characteristics such as Schottky junction is exhibited on either one of the interface between the lower electrode and the variable resistor and that between the upper electrode and the variable resistor.

However, since the conventional bipolar switching operations use voltage pulses of both the positive and negative polarities, as described above, not only the circuit configuration for implementing a semiconductor memory device becomes complex, chip size expands, and the manufacturing cost increases, but also such the structural asymmetrical nature of the variable resistive element necessitates use of different materials for the lower and upper electrodes in the manufacturing process, which thus complicates manufacturing processes and contributes to another rise in the manufacturing cost.

Aside from the bipolar switching operations to the variable resistive element of the asymmetrical structure as described above, the two conditions for conducting the stable switching operations described earlier may be satisfied even by application of voltage of a same polarity if two different values are set for the duration of voltage application to the variable resistive elements.

FIGS. 25A and 25B show resistive characteristics (current-voltage characteristics) of a variable resistive element that can satisfy the above two conditions and perform unipolar switching operations. FIG. 25A shows resistive characteristics (current-voltage characteristics) of a variable resistive element when voltage pulses having short pulse width (voltage application duration) are applied, and FIG. 25B shows resistive characteristics (current-voltage characteristics) of a variable resistive element when voltage pulses having long pulse width (voltage application duration) are applied. In addition, similar to FIG. 24, FIG. 25 also shows load resistive characteristics C as well as two resistive characteristics A, B of a variable resistive element.

In the current-voltage characteristics shown in FIG. 25A, threshold voltage VAs for a transition from the high resistance state (characteristics A) to the low resistance state (characteristics B) as a result of application of voltage having short pulse width to a serial circuit is lower in absolute value than threshold voltage VBs for a transition from the low resistance state to the high resistance state as a result of application of voltage having the same pulse width, wherein voltage equal to or higher than threshold voltage Vas is applied between both terminals of the variable resistive element when voltage pulses absolute value of which is equal to or higher than threshold voltage VAs is applied to both ends of the serial circuit, thus causing the transition from the high resistance state to the low resistance state. Now in the example shown in FIG. 25A, similar effect to that described in FIG. 23 is obtained by substituting a load circuit for setting a current compliance shown in FIG. 23. In fact, due to presence of the load circuit, increase in the current through the variable resistive element caused by the transition from the high resistance state to the low resistance state lowers voltage through the load circuit, thus automatically reducing voltage applied to the variable resistive element. If the load resistive characteristics of a load circuit are properly set, an absolute value of the voltage applied to the variable resistive element after the transition to low resistance is lower than the threshold voltage Vbs for having the resistive characteristics transit from the low resistance state to the high resistance state, thus implementing the transition from the high resistance state to the low resistance state in a stable manner. However, even if voltage equal to or higher than the threshold voltage VBs is applied to the serial circuit by applying voltage pulses of same pulse width after the transition to the low resistance state, no transition from the low resistance state to the high resistance state occurs because voltage not less than the threshold voltage Vbs that is higher than the threshold voltage Vas is applied between both terminals of the variable resistive element.

On the contrary, according to the current-voltage characteristics shown in FIG. 25B, the absolute value of a threshold voltage VB1 causing a transition from the low resistance state (characteristics B) to the high resistance state (characteristics A) when a voltage pulse having a long pulse width is applied to the serial circuit is smaller than that of a threshold voltage VA1 causing a transit from the high resistance state to the low resistance state with the same long pulse width, and when a voltage whose absolute value is equal to or higher than the threshold voltage VB1 is applied to both ends of the serial circuit, a voltage whose absolute value is equal to or higher than a threshold voltage Vb1 is applied to both ends of the variable resistive element, so that the low resistance state is changed to the high resistance state. When the load resistive characteristics of the load circuit are set for the long pulse width similar to the short pulse width, the absolute value of the voltage applied to the variable resistive element after transiting to the high resistance state is smaller than that of a threshold voltage Va1 causing the resistive characteristics to transit from the high resistance state to the low resistance state, so that the low resistance state transits to the high resistance state stably. However, even when the voltage of the threshold voltage VA1 or higher is applied to the serial circuit by the voltage pulse application having the same long pulse width after transiting to the high resistance state, since the voltage equal to or higher than the threshold voltage Va1 that is higher than the threshold voltage Vb1 is applied to both ends of the variable resistive element, the high resistance state does not transit to the low resistance state.

Thus, with the same pulse width, while the resistive characteristics of the variable resistive element only transit from one to the other of the high resistance state (characteristics A) and the low resistance state (characteristics B), it cannot transit in the reverse orientation, which thus makes stable switching operations impossible. In contrast, in the conventional unipolar switching operations, through the use of application of voltage pulses having two long and short pulse widths and of same polarity, a transition from the high resistance state to the low resistance state is stably implemented by application of voltage pulse of one of the two different pulse widths, while a transition from the low resistance state to the high resistance state can be stably implemented by application of voltage pulse of the other of the two different pulse widths.

The point to be noted here is as follows: for a variable resistive element alone, irrespective of whether pulse width is long or short, threshold voltages Vbs and Vb1 for a transition from the low resistance state to the high resistance state are respectively lower than threshold voltages Vas and Va1 for a transition from the high resistance state to the low resistance state. Nevertheless, by making a correlation (e.g., voltage difference or voltage ratio) of the threshold voltages Vas and Vbs differ from that of the threshold voltages Va1 and Vb1 in terms of whether pulse width is long or short, and by properly setting the load resistive characteristics of the load circuit, as threshold voltage of voltage applied to the serial circuit, it is possible to set the threshold voltage VAs lower in absolute value than the threshold voltage VBs in short pulse width, and the threshold voltage VB1 lower in absolute value than the threshold voltage VA1 in the long pulse width. Consequently, the magnitude relation of the threshold voltages VAs and VBs and of the threshold voltages VB1 and VAT can be reversed, thus enabling stable unipolar switching operations by applying voltage pulses of different pulse width.

Now it is believed that a difference in correlation between the threshold voltages Va1 and Vb1 of the variable resistive element shown in FIG. 25 due to the length of pulse width results from a change in the high resistance state (characteristics A) and the low resistance state (characteristics B) of the variable resistive element caused by changing a resistance value of the variable resistive element or resistance components in the vicinity thereof due to Joule heat generated at the variable resistive element when voltage pulses of longer pulse width are applied. In particular, when voltage amplitude of voltage pulses applied to the serial circuit is fixed, generation of Joule heat will be remarkable in the case that voltage pulses of long pulse width are applied to the variable resistive element in the low resistance state (characteristics B). Thus, it is believed that characteristic change due to difference in pulse width is most obvious in the resistive characteristics in the low resistance state (characteristics B). In fact as can be seen from a comparison of FIGS. 25A and 25B, due to effect of Joule heat, the resistive characteristics in the low resistance state (characteristics B) becomes less resistive when voltage pulses of long pulse width are applied, and the threshold voltage VB1 becomes lower than the threshold voltage VBs of when the pulse width is short.

However, the conventional unipolar switching operations are disadvantageous in terms of time and power consumption needed for writing, because two types of voltage pulses of long and short pulse widths should be used.

When the nonvolatile semiconductor memory device capable of writing data by random access similar to a conventional volatile RAM (SRAM or DRAM) is to be implemented by use of the two switching characteristics of the variable resistive element described above in detail, in the case where there are two or more variable resistive elements as the writing target, and the characteristic change from the high resistance state to the low resistance state and the characteristic change from the low resistance state to the high resistance state are mixed, that is, in the case where the programming operation of data "0" and the programming operation of data "1" are performed at the same time, it is necessary to use the voltage pulses having the two positive and negative polarities at the same time in the bipolar switching operation, or it is necessary to use the voltage pulses having two long and short pulse widths at the same time in the unipolar switching operation.

According to the former bipolar switching operation, when a cross point memory cell array structure having memory cells (1R type memory cells) each including a single variable resistive element is used, the writing voltage pulses having the positive and negative polarities cannot be selectively applied to the plurality of memory cells at the same time while prevented from being applied to the unselected memory cells, or when a cross point memory cell array structure having memory cells (1D1R type memory cells) each configured by a serial circuit of the variable resistive element and a diode element is used, the writing voltage pulse having the positive or negative polarity cannot be applied, so that the writing operation cannot be performed by the normal bipolar switching operation in either case. Furthermore, in order to perform the bipolar switching operation stably with a conventional variable resistive element, since the variable resistive element has to have asymmetric current-voltage characteristics with respect to the polarities of the applied voltage pulse, and the writing voltage pulse of the positive and negative polarities has to be used, and the selection transistor has to be provided in the memory cell, it is impossible or extremely difficult to implement the nonvolatile semiconductor memory device capable of random-access data writing with a simple structure.

In addition, according to the latter unipolar switching operation, since the writing operation speed is controlled by the longer voltage pulse application time, the writing time as long as 100 ns to several μs is needed, so that the high-speed writing operation (several ns to several tens of ns) like in the SRAM and the DRAM cannot be performed. In this respect, the same is applied not only to the RRAM as the variable resistive element but also to the above PCRAM.

The present invention was made in view of the above problems about the data writing by use of the conventional bipolar switching operation or the unipolar switching operation in the nonvolatile semiconductor memory device having the variable resistive element whose resistive characteristics are changed by the voltage application, and an object of the present invention is to provide a nonvolatile semiconductor memory device capable of implementing writing operations having different resistance changes at the same time with respect to it plurality of memory cells each having a variable resistive element, by a stable high-speed switching operation for the variable resistive elements.

A nonvolatile semiconductor memory device according to the present invention to achieve the above object is characterized as first characteristics by comprising: a memory cell array in which a plurality of two-terminal or three-terminal structured nonvolatile memory cells are arranged in a row direction and a column direction, first terminals of the plurality of memory cells arranged in the same row are connected to a common word line, and second terminals of the plurality of memory cells arranged in the same column are connected to a common bit line; a word line selection circuit adapted to select a predetermined number of word lines from a plurality of word lines; a bit line selection circuit adapted to select a predetermined number of bit lines from a plurality of bit lines; and a plurality of load resistive characteristic variable circuits connected to the respective bit lines, wherein each of the plurality of memory cells has a variable resistive element having two terminals, the variable resistive element is configured such that resistive characteristics defined by current-voltage characteristics between the two terminals can transit between two stable resistive characteristics of a low resistance state and a high resistance state when a voltage is applied from one terminal to the other terminal with at least one of positive and negative polarities, a first threshold voltage as a lower limit value of an absolute value of an applied voltage required for the resistive characteristics to transit from the low resistance state to the high resistance state is lower than a second threshold voltage as a lower limit value of an absolute value of an applied voltage required for the resistive characteristics to transit from the high resistance state to the low resistance state, and storage state of the variable resistive element is determined based on whether the resistive characteristics of the variable resistive element are the low resistance state or the high resistance state, each of the load resistive characteristic variable circuits has two different load resistive characteristics defined by the current-voltage characteristics and is configured to select one of the two load resistive characteristics individually based on whether a first writing operation is performed or a second writing operation is performed, the first writing operation having the resistive characteristics of the variable resistive element to be written transit from the low resistance state to the high resistance state, the second writing operation having the resistive characteristics of the variable resistive element to be written transit from the high resistance state to the low resistance state, and a writing voltage pulse application circuit is provided to apply a first voltage pulse to be applied in the first writing operation and a second voltage pulse to be applied in the second writing operation to the memory cells to be written through the load resistive characteristic variable circuits and the bit lines.

According to the nonvolatile semiconductor memory device having the first characteristics, even when the plurality of memory cells are to be written and the first writing operation and the second writing operation as their writing operations are mixed, since the load resistive characteristic variable circuit individually corresponding to the memory cell to be written is provided with respect to each bit line, when the load resistive characteristics of the corresponding load resistive characteristic variable circuit are switched between the two different load resistive characteristics based on one of the first writing operation and the second writing operation, the appropriate load resistive characteristics capable of performing the high-speed writing operation can be selected, as the load resistive characteristics of the load circuit (including the load resistive characteristic variable circuit) connected to the variable resistive element or the memory cell in series, for both first writing operation and second writing operation, so that both first writing operation and second writing operation can be executed at the same time as the stable high-speed switching operations for the variable resistive elements.

Next, a detailed description will be made of a reason why the stable high-speed switching operation can be performed for the variable resistive element of the memory cell to be written. Since the load resistive characteristics of the individual load resistive characteristic variable circuit can be switched between the two different load resistive characteristics, and the two load resistive characteristics can be selectively switched between the case where the resistive characteristics of the variable resistive element to be written transits from the low resistance state to the high resistance state (first writing operation) and the case where it transits from the high resistance state to the low resistance state (second writing operation), regardless of symmetric property of the element structure of the variable resistive element, a length of the voltage application time, or the polarity of the applied voltage, the load resistive characteristics can be set so as to separately satisfy the following two conditions to perform the stable switching operation as the variable resistive element, such that, (1) when the resistive characteristics of the variable resistive element transit from the high resistance state to the low resistance state, a voltage higher than the threshold voltage of the transition is to be applied while the threshold voltage of the transition is lower than a threshold voltage of a transition in an opposite direction, and (2) when the resistive characteristics of the variable resistive element transit from the low resistance state to the high resistance state, a voltage higher than the threshold voltage of the transition is to be applied while the threshold voltage of the transition is lower than the threshold voltage of the transition in the opposite direction. Thus, the stable switching operation can be implemented between the high resistance state and the low resistance state of the resistive characteristics of the variable resistive element. As a result, the problems in the conventional bipolar switching operation or unipolar switching operation can be solved, so that both first writing operation and second writing operation can be executed at the same time by the stable high-speed switching operation for the variable resistive element, in the nonvolatile semiconductor memory device having the variable resistive element whose resistive characteristics vary according to the voltage application.

In the following, with reference to the drawings, we describe how the present invention enables stable unipolar switching operations between the high resistance state and the low resistance state regardless of a length of the voltage application time in the variable resistive elements having one given set of resistive characteristics of the high resistance state and the low resistance state.

FIGS. 26A and 26B show an example of resistive characteristics (current-voltage characteristics) of a variable resistive element that can satisfy the above two conditions and perform unipolar switching operations. Both FIGS. 26A and 26B show resistive characteristics A, B of a variable resistive element when voltage pulses having same pulse width (duration of voltage application) are applied. In FIGS. 26A and 26B, the respective resistive characteristics A and B are same, while load resistive characteristics C1 and C2 are different. FIG. 26 shows the two resistive characteristics A and B of the variable resistive element as well as the load resistive characteristics C1 or C2 of the load circuit. The load resistive characteristics are switched between C1 and C2 by a load resistive characteristic variable circuit. A load circuit includes the load resistive characteristic variable circuit and forms a serial circuit by electrically connecting to the variable resistive element in series, and when voltage is applied to both ends of the serial circuit, resistive voltage division of the variable resistive element and the load circuit determines voltage to be applied to the variable resistive element. In FIG. 26, voltage at each intersection of the load resistive characteristics C1, C2 and the resistive characteristics A, B is voltage to be actually applied to the variable resistive element, and each intersection between the load resistive characteristics C1, C2 and the voltage axis represents voltage to be applied to both ends of the serial circuit. Increasing and decreasing voltage to be applied to both ends of the serial circuit results in lateral translation (in the direction of voltage axis) of a characteristic curve or a characteristic line representative of the load resistive characteristics C1, C2. In the example shown in FIG. 26, although the description assumes load resistance showing a linear load resistive characteristics as the load circuit, similar description is applicable even when the load resistive characteristics is nonlinear.

In the current-voltage characteristics shown in FIG. 26A, threshold voltage VA1 for a transition from the high resistance state (characteristics A) to the low resistance state (characteristics B) as a result of application of voltage pulses to a serial circuit including a load circuit of the load resistive characteristics C1 is lower in absolute value than threshold voltage VB1 for a transition from the low resistance state to the high resistance state, wherein voltage higher than threshold voltage Va1 is applied between both terminals of the variable resistive element when voltage pulses an absolute value of which is equal to or higher than the threshold voltage VA1 are applied to both ends of the serial circuit, thus causing the transition from the high resistance state to the low resistance state. Due to presence of the load circuit of the load resistive characteristics C1, increase in the current flowing through the variable resistive element caused by a transition from the high resistance state to the low resistance state lowers voltage through the load circuit, thus automatically reducing voltage applied to the variable resistive element. If the load resistive characteristics C1 of a load circuit are properly set, an absolute value of the voltage applied to the variable resistive element after the transition to low resistance is lower than the threshold voltage Vb1 for having the resistive characteristics transit from the low resistance state to the high resistance state, thus implementing a stable transition from the high resistance state to the low resistance state. However, even if voltage equal to or higher than threshold voltage VB1 is applied to the serial circuit including the load circuit of the same load resistive characteristics C1 after the transition to the low resistance state, no transition from the low resistance state to the high resistance state occurs because voltage not less than the threshold voltage Vb1 that is higher than the threshold voltage value Va1 is applied between both terminals of the variable resistive element. In fact, if voltage pulses equal to or higher than the threshold voltage VB1 are applied to both ends of the serial circuit, voltage equal to or higher than the threshold voltages Va1 and Vb1 is applied between both terminals of the variable resistive element while voltage pulses are being applied, thus causing transitions in both directions between the high resistance state and the low resistance state and leading to unstable condition (oscillation condition). However, since voltage is applied like pulses, and at the end of the voltage application duration, there will be voltage applied condition in which the absolute value of the applied voltage (voltage amplitude of the voltage pulses) is equal to or higher than the threshold voltage VA1 and lower than the threshold voltage VB1, the resistive characteristics of the variable resistive element will finally converge to the low resistance state.

In contrast, in the current-voltage characteristics shown in FIG. 26B, threshold voltage VB2 for a transition from the low resistance state (characteristics B) to the high resistance state (characteristics A) as a result of application of voltage pulse to a serial circuit including a load circuit of the load resistive characteristics C2 lower than the load resistive characteristics C1 is lower in absolute value than threshold voltage VA2 for a transition from the high resistance state to the low resistance state, wherein voltage of which an absolute value is equal or higher than threshold voltage Vb2 (=Vb1) is applied between both terminals of the variable resistive element when voltage of which an absolute value is equal to or higher than the threshold voltage VB2 is applied to both ends of the serial circuit, thus causing a transition from the low resistance state to the high resistance state. If the load resistive characteristics C2 of the load circuit are properly set, the absolute value of voltage applied to the variable resistive element after the transition to the high resistance state falls below threshold voltage Va2(=Va1) for having the resistive characteristics transit from the high resistance state to the low resistance state, thus implementing a stable transition from the low resistance state to the high resistance state. However, even if voltage not less than the threshold voltage VA2 is applied to the serial circuit including the load circuit of the same load resistance characteristics C2 after the transition to the high resistance state, no transition from the high resistance state to the low resistance state occurs because voltage not less than the threshold voltage Va2 that is higher than the threshold voltage Vb2 is applied between both terminals of the variable resistive element. In fact, if voltage pulses equal to or higher than the threshold voltage VA2 are applied to both ends of the serial circuit, voltage equal to or higher than the threshold voltages Va2 and Vb2 is applied between both terminals of the variable resistive element while voltage pulses are being applied, thus causing transitions in both directions between the high resistance state and the low resistance state and leading to unstable condition (oscillation condition). However, as voltage is applied like pulses, there will be voltage applied condition at the end of the voltage application duration, in which the absolute value of the applied voltage (voltage amplitude of the voltage pulses) is equal to or higher than the threshold voltage VB2 and lower than the threshold voltage VA2, and thus the resistive characteristics of the variable resistive element will finally converge to the high resistance state.

Therefore, according to the present invention, even for voltage pulses of same pulse width, by switching the load resistive characteristics C1, C2 of the load circuit according to switching direction (a first writing operation or a second writing operation), a transition from the high resistance state to the low resistance state can be implemented in a stable manner because of the resistive characteristics C1 and a transition from the low resistance state to the high resistance state can be implemented in a stable manner because of the resistive characteristics C2.

The point to be noted here is as follows: for a variable resistive element alone, irrespective of the load resistive characteristics, threshold voltage Vb1 (=Vb2) for a transition from the low resistance state to the high resistance state is lower than threshold voltage Va1 (=Va2) for a transition from the high resistance state to the low resistance state. Nevertheless, by properly setting the load resistive characteristics C1, C2 and switching them in accordance with the switching direction, as threshold voltage of voltage to be applied to the serial circuit, it is possible to set the threshold voltage VA1 lower in absolute value than the threshold voltage VB1 in a transition from the high resistance state to the low resistance state, and set the threshold voltage VB2 lower in absolute value than the threshold voltage VA2 in a transition from the low resistance state to the high resistance state. Consequently, the magnitude relations of the threshold voltages VA1 and VB1 and of the threshold voltages VB2 and VA2 can be reversed, thus enabling stable unipolar switching operations by applying voltage pulses of same pulse width.

Next, FIG. 27 shows the resistive characteristics (current-volume characteristics) of the variable resistive element that can satisfy the above two conditions and perform bipolar switching operations. In FIG. 27, two resistive characteristics A, B of the variable resistive element and load resistive characteristics C1, C2 of a load circuit are shown together. In addition, unlike the conventional bipolar switching characteristics (See FIG. 24), the two resistive characteristics A, B of the variable resistive element serve as symmetrical characteristics on the side of positive polarity and of negative polarity. The load circuit forms a serial circuit by electrically connecting to the variable resistive element in series, and when voltage is applied to both ends of the serial circuit, resistive voltage division of the variable resistive element and the load circuit determines voltage to be applied to the variable resistive element. In FIG. 27, voltage at each intersection of the load resistive characteristics C1, C2 and the resistive characteristics A, B is voltage to be actually applied to the variable resistive element, and each intersection between the load resistive characteristics C1, C2 and the voltage axis represents voltage to be applied to both ends of the serial circuit. Increasing and decreasing voltage to be applied to both ends of the serial circuit results in lateral translation (in the direction of voltage axis) of a characteristic curve or a characteristic line representative of the load resistive characteristics C1, C2. In the example shown in FIG. 27, although the description assumes load resistance showing a linear load resistive characteristics as the load circuit, similar description is applicable even when the load resistive characteristics are nonlinear.

In the current-voltage characteristics shown in FIG. 27, threshold voltage $VA^+$ for a transition from the high resistance state (characteristics A) to the low resistance state (characteristics B) as a result of application of voltage to a serial circuit on the side of one polarity (positive polarity) is lower in absolute value than threshold voltage $VB^+$ for a transition from the low resistance state to the high resistance state on the side of same polarity (positive polarity), wherein voltage equal to or higher than threshold voltage $Va^+$ is applied between both terminals of the variable resistive element, when voltage the absolute value of which is equal to or higher than the threshold voltage $VA^+$ is applied to both ends of the serial circuit, thus causing a transition from the high resistance state to the low resistance state. Due to presence of the load circuit, increase in the current flowing through the variable resistive element caused by a transition from the high resistance state to the low resistance state lowers voltage through the load circuit, thus automatically reducing voltage applied to the variable resistive element. If the load resistive characteristics C1 of a load circuit are properly set, an absolute value of the voltage applied to the variable resistive element after the transition to low resistance is lower than the threshold voltage $Vb^+$ for having the resistive characteristics transit from the low resistance state to the high resistance state, thus implementing a stable transition from the high resistance state to the low resistance state. However, even if voltage equal to or higher than threshold voltage $VB^+$ of the same polarity (positive polarity) is applied to the serial circuit including the load circuit of the same load resistive characteristics C1 after the transition to the low resistance state, no transition from the low resistance state to the high resistance state occurs because voltage not less than the threshold voltage $Vb^+$ that is higher than the threshold voltage value $Va^+$ is applied between both terminals of the variable resistive element. In fact, if voltage pulses equal to or higher than the threshold voltage $VB^+$ are applied to both ends of the serial circuit, voltage equal to or higher than the threshold voltages $Va^+$ and $Vb^+$ is applied between both terminals of the variable resistive element while voltage pulses are being applied, thus causing transitions in both directions between the high resistance state and the low resistance state and leading to unstable condition (oscillation condition). However, since voltage is applied like pulses, and at the end of the voltage application duration, there will be the voltage applied condition in which the absolute value of the applied voltage (voltage amplitude of the voltage pulses) is equal to or higher than the threshold voltage $VA^+$ and lower than the threshold voltage $VB^+$, the resistive characteristics of the variable resistive element will finally converge to the low resistance state.

In contrast, threshold voltage $VB^-$ for a transition from the low resistance state (characteristics B) to the high resistance state (characteristics A) as a result of application of voltage to a serial circuit on the side of other polarity (negative polarity) is lower in absolute value than threshold voltage $VA^-$ for a transition from the high resistance state to the low resistance state on the side of same polarity (negative polarity), wherein voltage of which an absolute value is equal to or higher than the threshold voltage $Vb^-$ is applied between both terminals of the variable resistive element when voltage of which an absolute value is equal to or higher than the threshold voltage $VB^-$ is applied to both ends of the serial circuit, thus causing a transition from the low resistance state to the high resistance state. If the load resistive characteristics C2 of the load circuit are properly set also on the side of negative polarity, the absolute value of voltage applied to the variable resistive element after the transition to the high resistance state is lower than the threshold voltage $Va^-$ for having the resistive characteristics transit from the high resistance state to the low resistance state, thus implementing transitions from the low resistance state to the high resistance state in a stable manner. However, even if voltage of the same polarity (negative polarity) the absolute value of which is equal to or higher than the threshold voltage $VA^-$ is applied to the serial circuit including the load circuit of the same load resistive characteristics C2, no transition from the high resistance state to the low resistance state occurs because voltage not less than the threshold voltage $Va^-$ that is higher than the threshold voltage $Vb^-$ is applied between both terminals of the variable resistive element. In fact, if negative voltage pulses the absolute value of which is equal to or higher than the threshold voltage $VA^-$ are applied to both ends of the serial circuit, voltage equal to or higher than the threshold voltages $Va^-$ and $Vb^-$ is applied between both terminals of the variable resistive element while voltage pulses are being applied, thus causing transitions in both directions between the high resistance state and the low resistance state and leading to unstable condition (oscillation condition). However, since voltage is applied like pulses, and at the end of the voltage application duration, there will be the voltage applied condition in which the absolute value of the applied voltage (voltage amplitude of the voltage pulses) is equal to or higher than the threshold voltage $VB^-$ and lower than the threshold voltage $VA^-$, the resistive characteristics of the variable resistive element will finally converge to the high resistance state.

Therefore, according to the present invention, even though the two resistive characteristics A, B of the variable resistive element are symmetrical on the side of positive polarity and of negative polarity, by switching the load resistive characteristics C1, C2 of the load circuit according to the polarity of applied voltage (i.e., switching direction), a transition from the high resistance state to the low resistance state can be stably implemented through voltage application on the side of positive polarity and the load resistive characteristics C1, while a transition from the low resistance state to the high resistance state can be stably implemented through voltage application on the side of negative polarity and the load resistive characteristics C2.

The point to be noted here is as follows: for a variable resistive element alone, irrespective of the load resistive characteristics and the polarities of applied voltage, the threshold voltage $Vb^+(=Vb^-)$ for a transition from the low resistance state to the high resistance state is lower in absolute value than the threshold voltage $Va^+(=Va^-)$ for a transition from the high resistance state to the low resistance state. Nevertheless, by properly setting the load resistive characteristics C1, C2 and switching them in accordance with the polarities of applied voltage (switching direction), as threshold voltage of voltage to be applied to the serial circuit, it is possible to set the threshold voltage $VA^+$ lower in absolute value than the threshold voltage $VB^+$ on the side of positive polarity, and the threshold voltage $VB^-$ lower in absolute value than the threshold voltage $VA^-$ on the side of negative polarity. Consequently, the magnitude relations of the threshold voltages $VA^+$ and $VB^+$ and of the threshold voltages $VB^-$ and $VA^-$ can be reversed, thus enabling stable bipolar switching operations irrespective of whether the variable resistive element has a symmetrical or a asymmetrical structure by applying voltage of both positive and negative polarities.

The nonvolatile semiconductor memory device having the first characteristics further has second characteristics that when the plurality of memory cells to be written includes the memory cells to be subjected to the first writing operation and the memory cells to be subjected to the second writing operation and exist in the same row, the word line selection circuit selects one word line connected to the memory cells to be written, and the bit line selection circuit selects the plurality of bit lines connected to the memory cells to be written, the load resistive characteristics of the load resistive characteristic variable circuits connected to the selected bit lines selected by the bit line selection circuit are set based on whether the memory cells to be written connected to the corresponding selected bit lines are to be subjected to the first writing operation or the second writing operation, and the writing voltage pulse application circuit applies the first voltage pulse or the second voltage pulse to each of the memory cells connected to the selected bit lines through a corresponding one of the load resistive characteristic variable circuits and a corresponding one of the selected bit lines at the same time.

According to the nonvolatile semiconductor memory device having the second characteristics, since the first writing operation and the second writing operation can be performed at the same time in parallel for the memory cells to be written existing in the same row, the writing operations of the first writing operation and the second writing operation can be collectively performed by the byte, by the word, or by the row.

The nonvolatile semiconductor memory device having the second characteristics has third characteristics that the load resistive characteristic variable circuits are electrically connected to the respective selected bit lines selected by the bit line selection circuit during writing operation instead of being connected to the respective bit lines.

According to the variable resistive element having the third characteristic, since only the same number of load resistive characteristic variable circuits as that of the memory cells selected by the bit line selection circuit are needed, the circuit configuration can be simplified.

The nonvolatile semiconductor memory device having any one of the first to third characteristics has fourth characteristics that the memory cells have a two-terminal structure having a serial circuit of the variable resistive element and a diode.

According to the nonvolatile semiconductor memory device having the fourth characteristics, a reading margin is prevented from being reduced due to a sneak path current through unselected memory cells during reading operation that is specific to the cross point memory cell array having memory cells configured only by the variable resistive element, by rectification efficiency by the diode in the memory cell, and when the variable resistive element and the diode are accumulated in a vertical direction, the reading margin can be improved without increasing a memory cell area.

The nonvolatile semiconductor memory device having any one of the first to third characteristics further has fifth characteristics that the memory cells have a three-terminal structure in which one terminal of the variable resistive element is connected to a drain terminal or a source terminal of an MOSFET, and each of the first terminals of the memory cells is a gate terminal of the MOSFET.

According to the nonvolatile semiconductor memory device having the fifth characteristics, since only the memory cells connected to the selected word line can be activated by only activating the word line connected to the memory cells to be written or to be read and turning on the MOSFETs of the memory cells connected to the selected word line, and the other unselected memory cells can be inactivated by turning off the MOSFETs of the unselected memory cells connected to the unselected word lines, the reading margin can be prevented from being reduced due to erroneous writing of the unselected memory cells and the sneak path current through the unselected memory cells. In addition, since the current can be applied to the memory cell bi-directionally, the writing operation can be performed by the bipolar switching.

The nonvolatile semiconductor memory device having any one of the first to fifth characteristics has sixth characteristics that the load resistive characteristics of the load resistive characteristic variable circuits selected in the first writing operation are lower than the load resistive characteristics of the load resistive characteristic variable circuits selected in the second writing operation.

According to the nonvolatile semiconductor memory device having the sixth characteristics, the unipolar switching operation in which the voltage polarity of the first voltage pulse and the second voltage pulse is the same can be performed with either a positive or negative voltage application polarity when the first threshold voltage of the variable resistive element is lower than the second threshold voltage thereof. In addition, when the variable resistive element has symmetric current-voltage characteristics in which the bipolar switching operation cannot be performed by itself, the bipolar switching operation in which the voltage polarities of the first voltage pulse and the second voltage pulse are different can be performed.

The nonvolatile semiconductor memory device having any one of the first to sixth characteristics further has seventh characteristics that the first voltage pulse and the second voltage pulse have the same voltage polarity.

According to the nonvolatile semiconductor memory device having the seventh characteristics, since the writing operation is performed by the unipolar switching operation, it is not necessary to generate a negative voltage during writing operation, so that a circuit configuration thereof can be simplified. Furthermore, the cross point memory cell array having the two-terminal memory cells each having the serial circuit configured by the variable resistive element and the diode can be used. In addition, since the polarity of the voltage pulse applied to each bit line is the same in the first writing operation and the second writing operation, when the cross point memory cell array having the memory cells each configured by a single variable resistive element is used, a voltage difference between the bit line and the unselected word line in the first writing operation, and a voltage difference between the bit line and the unselected word line in the second writing operation can be reduced at the same time, so that the erroneous writing operation to the unselected memory cells can be prevented.

The nonvolatile semiconductor memory device having the above seventh characteristics shall further has eighth characteristics that an absolute value of voltage amplitude is the same between the first voltage pulse and the second voltage pulse.

According to the nonvolatile semiconductor memory device having the eighth characteristics, particularly during unipolar switching operation, the writing voltage having the same voltage value can be applied to the memory cell to be written through the load resistive characteristic variable circuit in common in the first writing operation and the second writing operation, so that the circuit configuration can be simplified.

The nonvolatile semiconductor memory device having the above seventh or eighth characteristics shall further has ninth characteristics that both pulse width of the first voltage pulse and that of the second voltage pulse are 100 ns or less.

The nonvolatile semiconductor memory device having any of the seventh to ninth characteristics shall further has tenth characteristics that pulse width of the first voltage pulse and that of the second voltage pulse have the same length.

According to the nonvolatile semiconductor memory device having the ninth or the tenth characteristics, a plurality of bit data can be written in a writing time of 100 ns or less. In particular, according to the nonvolatile semiconductor memory device having the ninth characteristics, the same writing time can be implemented regardless of the writing data. Furthermore, when combined with the seventh characteristics, in the unipolar switching operation, the same voltage pulse can be used in the first writing operation and the second writing operation.

The nonvolatile semiconductor memory device having any one of the first to tenth characteristics further has eleventh characteristics that the variable resistive element comprises a variable resistor of an oxide or oxynitride containing a transition metal.

According to the nonvolatile semiconductor memory device having the eleventh characteristics, in the two-terminal structured variable resistive element, when the voltage having at least one of positive and negative polarities is applied to one terminal based on the other terminal, the variable resistive element can be specifically implemented in such a manner that the resistive characteristics defined by the current-voltage characteristics between two terminals can transit between the two stable resistive characteristics of the low resistance state and the high resistance state, the first threshold voltage as the lower limit value of the absolute value of the voltage required for the resistive characteristics to transit from the low resistance state to the high resistance state is lower than the second threshold voltage as the lower limit value of the absolute value of the voltage required for the resistive characteristics to transit from the high resistance state to the low resistance state, and the storage state is determined by whether the resistive characteristics are the low resistance state or the high resistance state, so that the non-volatile semiconductor memory device can be specifically implemented in such a manner that both first writing operation and second writing operation can be executed at the same time in the stable switching operation achieving the effect of the first characteristics.

BRIEF DESCRIPTION OF THE DRAWINGS

FIGS. 10A to 10D are circuit diagrams showing circuit configuration examples of the load resistive characteristic variable circuit shown in FIG. 9.

BEST MODE FOR CARRYING OUT THE INVENTION

In the following, we describe embodiments of a nonvolatile semiconductor memory device (hereinafter abbreviated as a "device of the present invention", as appropriate) with reference to the drawings.

First Embodiment

Figure 1:
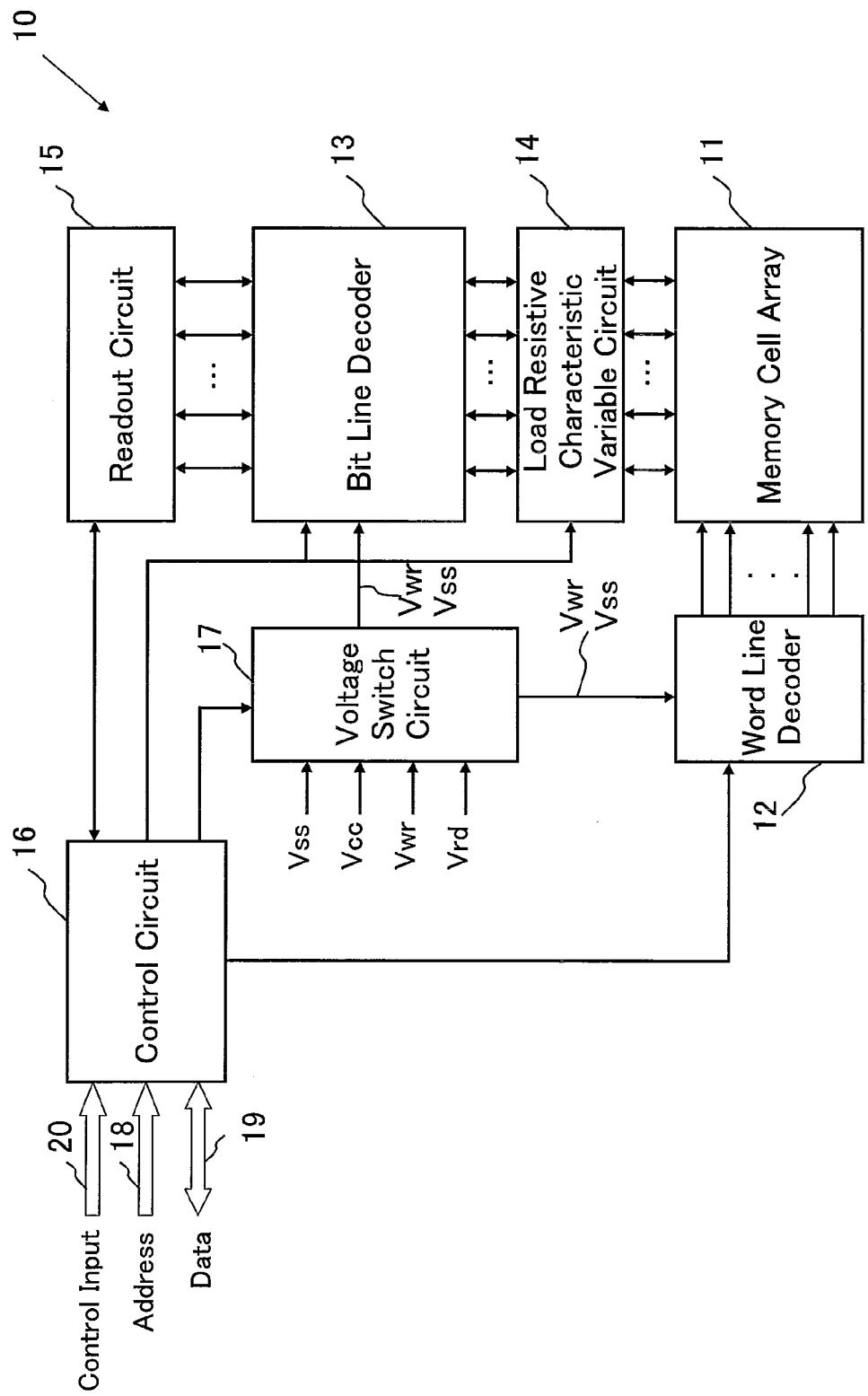
FIG. 1 is a block diagram of a schematic example of circuit configuration in the first embodiment of the nonvolatile semiconductor memory device according to the present invention.

FIG. 1 shows a block configuration of a device of the present invention 10 according to one embodiment. As shown in FIG. 1, the device of the present invention 10 comprises a memory cell array 11, a word line decoder (corresponding to a word line selection circuit) 12, a bit line decoder (corresponding to a bit line selection circuit) 13, a load resistance characteristic variable circuit 14, a readout circuit 15, a control circuit 16, and a voltage switch circuit 17.

The memory cell array 11 comprises a plurality of arrays of nonvolatile memory cells arranged in a row direction and in a column direction, respectively, and not only information can be electrically programmed into memory cells to be addressed from the external, but also information stored in the addressed memory cells can be read out. More specifically, information is stored in specific memory cells in the memory cell array 11 that correspond to an address signal entered from an address line 18, and the information is outputted to an external device through a data line 19.

When the information is programmed (or written) in the memory cell, either one of two types of writing operation: a first writing operation (hereinafter referred to as a reset operation) in which the resistive characteristics of a variable resistive element in the memory cell transit from a low resistance state to a high resistance state, and a second writing operation (hereinafter referred to as a set operation) in which the resistive characteristics of the variable resistive element transit from the high resistance state to the low resistance state is performed with respect to each memory cell as a writing target so as to be assigned based on data to be programmed. For example, data "0" is programmed in the reset operation, and data "1" is programmed in the set operation to the memory cell as the writing target at the same time.

Connecting to respective word lines of the memory cell array 11, the word line decoder 12 selects, as a selected word line, a word line of the memory cell array 11 that corresponds to an address signal entered in the address line 18 for row selection, and individually applies to the selected word line and an unselected word line selected word line voltage and unselected word line voltage for respective memory operations such as set, reset, and readout.

Connecting to respective bit lines of the memory cell array 11, the bit line decoder 13 selects, as a selected bit line, a bit line of the memory cell array 11 that corresponds to an address array that corresponds to an address signal entered the address line 18 for column selection, and individually applies to the selected bit line and an unselected bit line selected bit line voltage and unselected bit line voltage for respective memory operations.

The load resistive characteristic variable circuit 14 is included in a load circuit that electrically connects to a selected memory cell in series that was selected from the memory cell array 11 as a target of writing by the word line decoder 12 and bit line decoder 13 in writing operation (set, reset or both), and controlled by a control circuit 16 so as to switch the load resistive characteristics specified by the current-voltage characteristics of the load circuit between two different load resistive characteristics (low resistance state and high resistance state). In this embodiment, the load resistive characteristic variable circuit 14 is provided between the bit line decoder 13 and the memory cell array 11 for every bit line.

The control circuit 16 controls the respective memory operations of set, reset and read out of the memory cell array 11. Based on an address signal entered from the address line 18, data entry made from the data line 19 (in writing operation), and a control input signal entered from a control signal line 20, the control circuit 16 controls the word line decoder 12 and bit line decoder 13 to control readout, set and reset operations in the memory cell array 11. Specifically, in each memory operation, the control circuit executes control for applying to each of the selected word line, unselected word line, selected bit line and unselected bit line, predetermined voltage corresponding to the respective memory operations, on the voltage switch circuit 17, the word line decoder 12, bit line decoder 13 or the like. In particular, in writing operation, it controls voltage amplitude and pulse width of each voltage pulse to be applied to a memory cell to be written through the load circuit (including the load resistive characteristic variable circuit 14). Furthermore, in writing operation, it executes control for switching the load resistive characteristics of the load circuit on the load resistive characteristic variable circuit 14. In the example shown in FIG. 1, the control circuit 16 is provided with the capability in general as an address buffer circuit, a data input/output buffer circuit, a control input buffer circuit (not shown).

The voltage switch circuit 17 provides the word line decoder 12 and the bit line decoder 13 with selected word line voltage, unselected word line voltage, selected bit line voltage and unselected bit line voltage necessary for readout and writing operations of the memory cell array 11. Vcc represents service voltage (supply voltage) of the device of the present invention 10, Vss represents ground voltage, Vwr represents writing voltage for set and reset operations, and Vrd represents voltage for readout. In this embodiment, selected bit line voltage in writing operation is supplied to the selected bit line through the load resistive characteristic variable circuit 14.

Data readout is performed from the memory cell array 11 through the bit line decoder 13 and a readout circuit 15. The readout decoder 15 judges status of data, sends result thereof to the control circuit 16, and outputs it to the data line 19.

Figure 2:
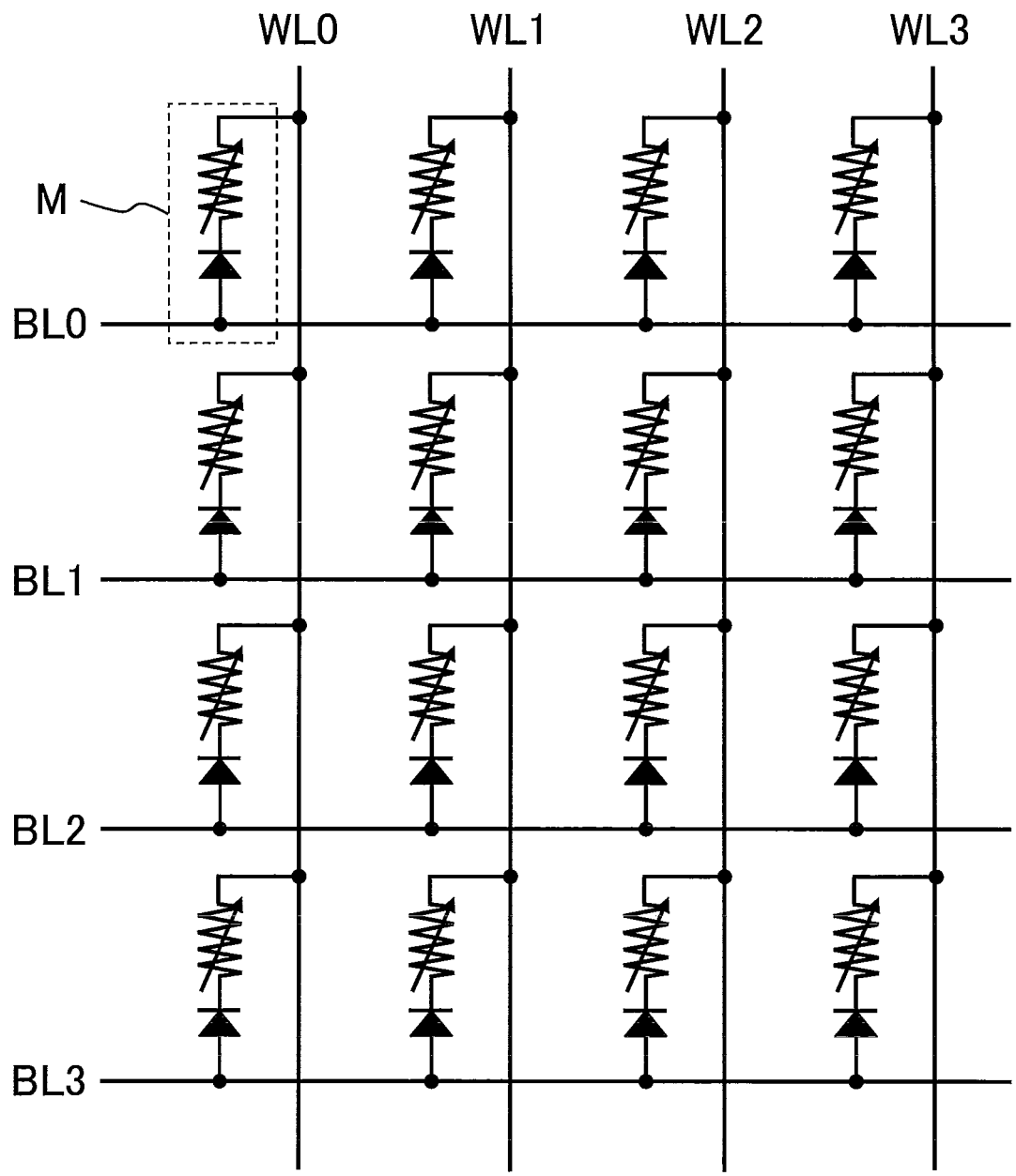
FIG. 2 is a circuit diagram showing partial configuration of a cross-point memory cell array shown in FIG. 1.

FIG. 2 schematically shows partial configuration of the cross-point type memory cell array 11. In FIG. 2, in the memory cell array 11, memory cells M are held at intersections of four bit lines BL0 to BL3 and four word lines WL0 to WL3. As shown in FIG. 2, the memory cell array 11 has the cross-point type memory cell array structure, wherein a plurality of memory cells M of two-terminal structure having variable resistive elements that store information as a result changes in electrical resistance are arranged in a row direction and in a column direction, respectively. It comprises a plurality of word lines extending in the row direction and a plurality of bit lines extending in the column direction, wherein each of the memory cells in the same row has one end of the memory cell connected to a common word line, and each of the memory cells in the same column has the other end of the memory cell connected to a common bit line.

Figure 3A:
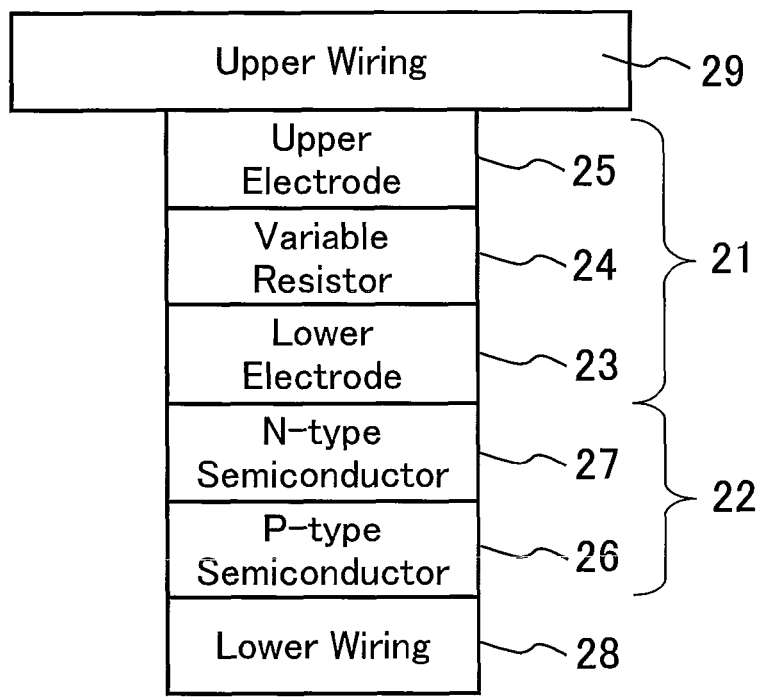
FIG. 3 is a schematic vertical sectional view showing a 1D1R type memory cell in the cross point memory cell array shown in FIG. 2.
Figure 3B:
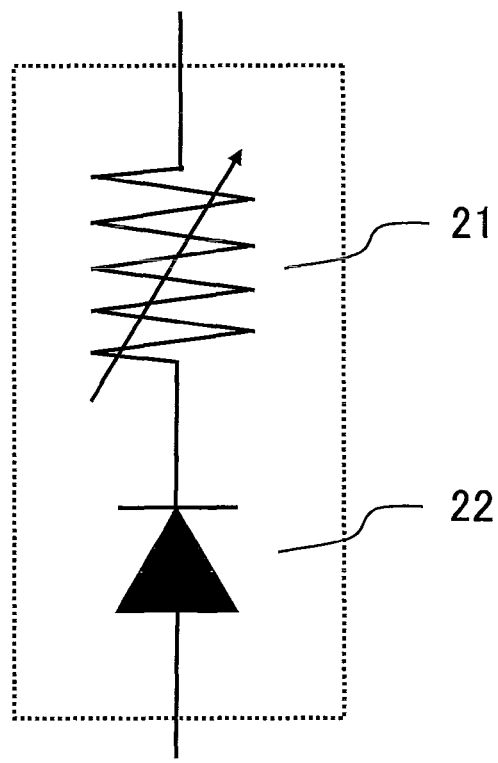

As memory cells in this embodiment, memory cells configured as follows are assumed: when voltage pulses for writing (for set and for reset) are applied between two terminals of the variable resistive element having two-terminal structure, resistive characteristics specified by current-voltage characteristics of the variable resistive element change, i.e., electrical resistance changes under certain bias conditions, which thus enables programming of information. As shown in FIG. 3, the memory cell M is a 1D1R type memory cell including a serial circuit in which a variable resistive element 21 having a three-layer structure including a lower electrode 23, a variable resistor 24, and an upper electrode 25, and a diode 22 configured by a PN junction of a P-type semiconductor layer 26 and an N-type semiconductor layer 27 are connected vertically. The variable resistor 24 can be formed of an oxide or oxynitride containing a transition metal (Ti, Cu, Co, Ni, V, W, Fe and the like) such as $TiO_xN_y$, and $Fe_2O_3$. The P-type semiconductor layer 26 and the N-type semiconductor layer 27 are formed by injecting P-type and N-type impurities to silicon, respectively. According to the present embodiment, the variable resistor 24 is formed of $TiO_xN_y$ produced by oxidizing TiN, the lower electrode 23 is formed of Ti or TiN, and the upper electrode 25 is formed of TiN. In addition, the variable resistive element 21 may be fabricated on a predetermined substrate of semiconductor or insulator by using thin-film forming methods such as sputtering or the like, and photolithography technology or etching technology. Details of fabrication methods are omitted herein.

One of the P-type semiconductor layer 26 and the upper electrode 25 serving as the two terminals of the memory cell M is connected to the word line, and the other of them is connected to the bit line. According to the present embodiment, a lower wiring 28 is connected to the lower side of the P-type semiconductor layer 26, and an upper wiring 29 is connected to the upper side of the upper electrode 25, and they are arranged orthogonally. The lower wiring 28 and the upper wiring 29 are formed of different materials or have different structures from the lower electrode 23 and the upper electrode 25 to reduce wiring resistance, and the lower wiring 28 is formed of AlCu or has a laminated layer structure of AlCu and TiN, for example, and the upper wiring 29 has a laminated structure of AlCu and TiN, for example. According to the present embodiment, since a positive writing voltage pulse is applied from the bit line side to the selected memory cell, the lower wiring 28 extends in a column direction to form the bit line, and the upper wiring 29 extends in a row direction to form the word line. In addition, the upper electrode 24 may extend in the row direction to form the word line without providing the upper wiring 29. Meanwhile, when the lower wiring 28 becomes the word line and the upper wiring 29 becomes the bit line, that is, when the lower wiring 28 and the upper wiring 29 are exchanged, it is necessary to apply a negative writing voltage pulse to the bit line or to reverse the PN junction by exchanging the P-type semiconductor layer 26 and the N-type semiconductor layer 27 of the diode 22.

Figure 4:
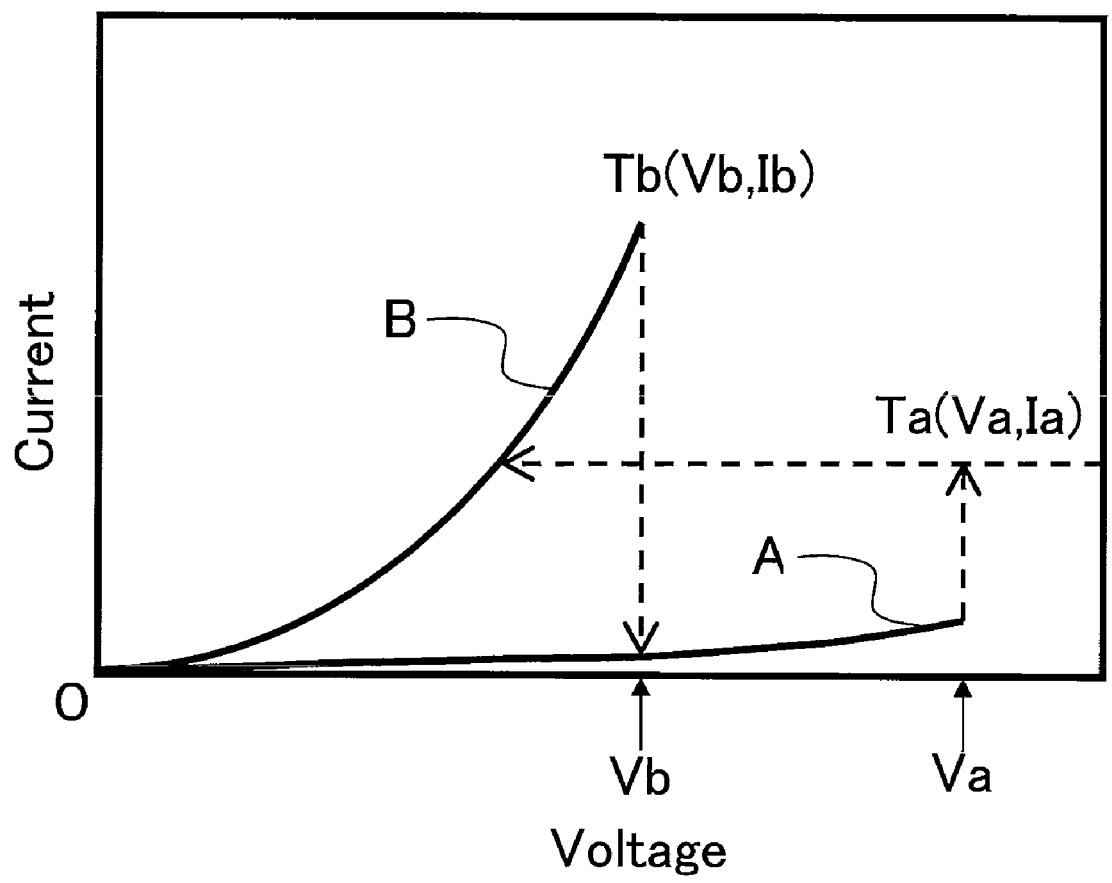
FIG. 4 is a current-voltage characteristic diagram showing resistive characteristics of the variable resistive element having the structure shown in FIG. 3.
Figure 23:
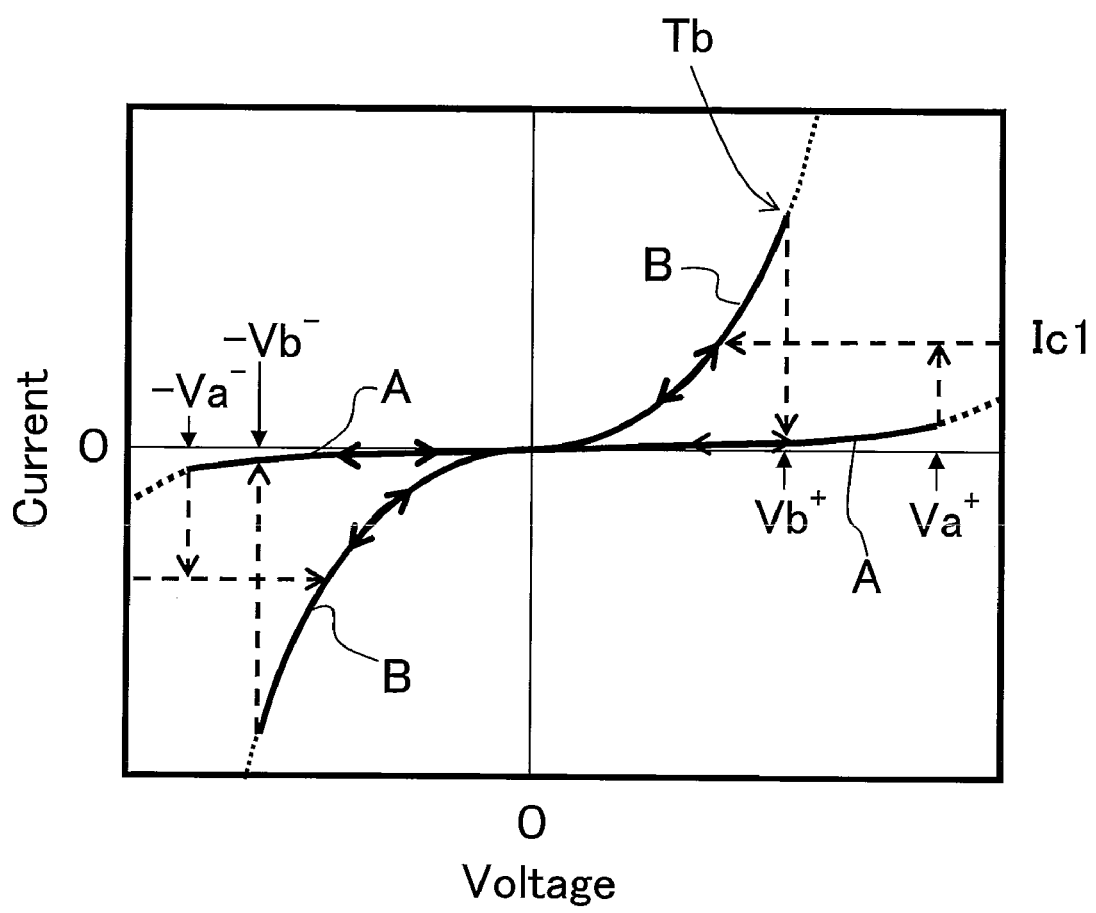
FIG. 23 is a current-voltage characteristic diagram showing the resistive characteristics of the conventional variable resistive element capable of bipolar switching operations measured without going through the load resistance.
Figure 24:
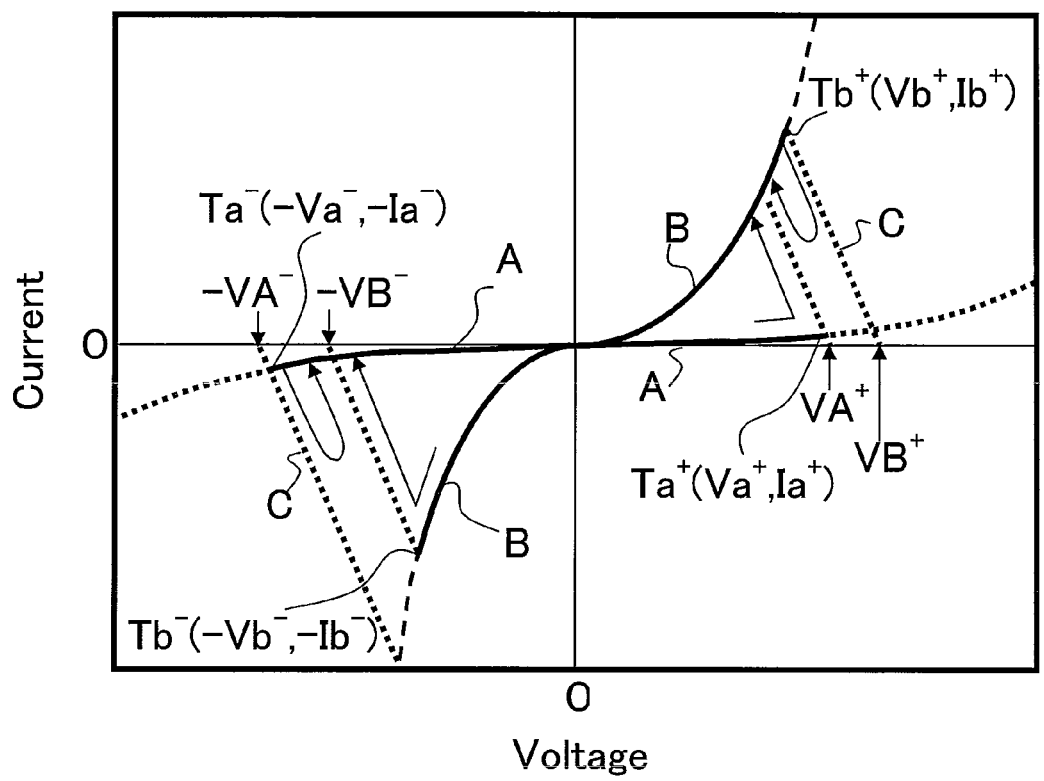
FIG. 24 is a current-voltage characteristic diagram showing the resistive characteristics of the conventional variable resistive element capable of bipolar switching operations measured through the load resistance.
Figure 25A:
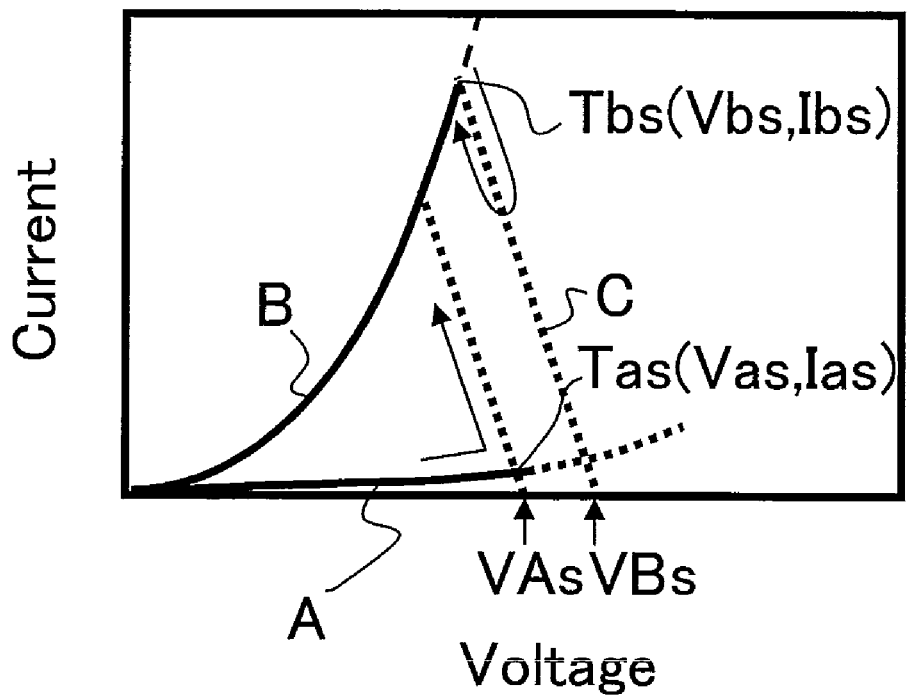
FIGS. 25A and 25B are two types of current-voltage characteristic diagrams showing the resistive characteristics of the conventional variable resistive element capable of unipolar switching operations measured through the load resistance.
Figure 25B:
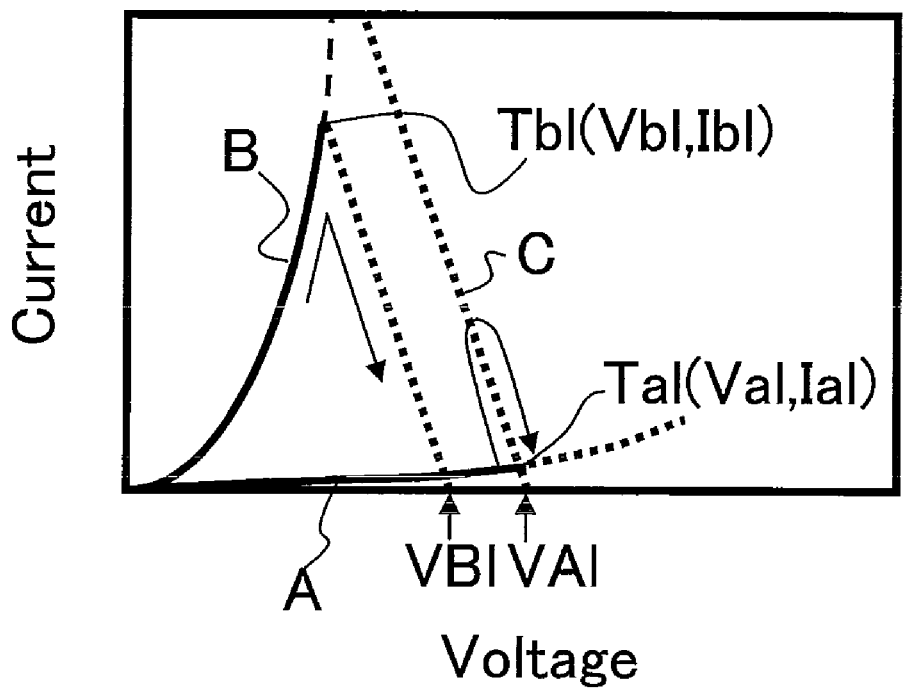
Figure 26A:
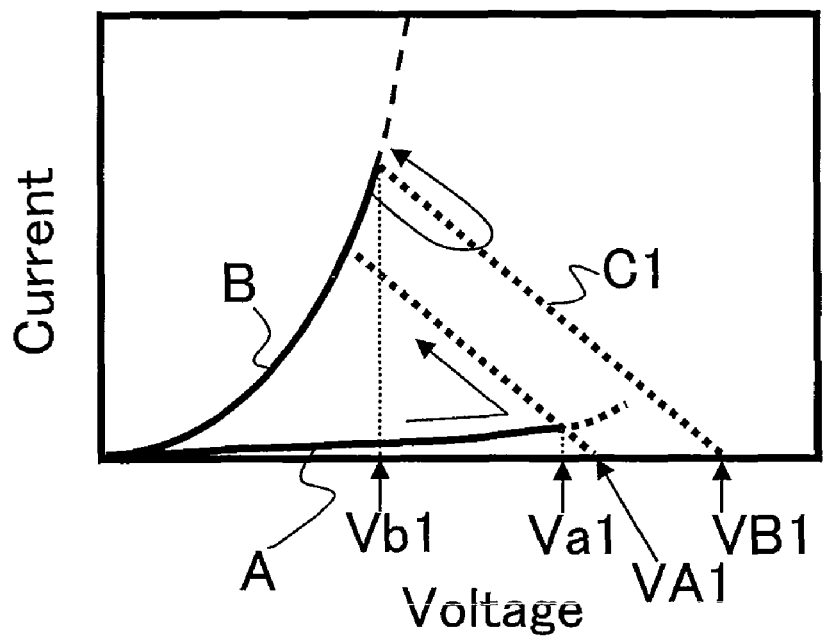
FIGS. 26A and 26B are two types of current-voltage characteristic diagrams showing the resistive characteristics of the variable resistive element capable of unipolar switching operations based on the present invention measured through the load resistance.
Figure 26B:
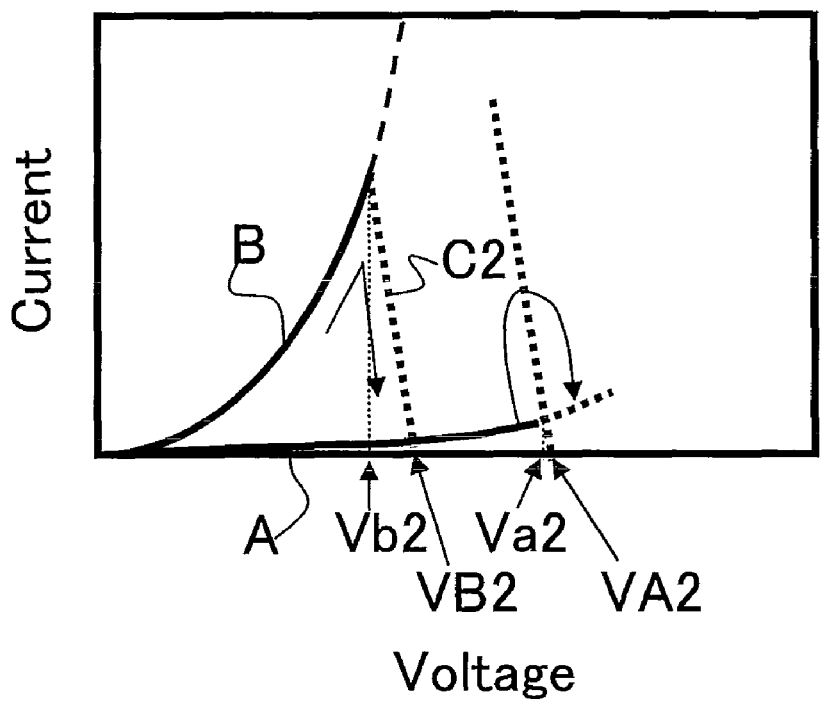
Figure 27:
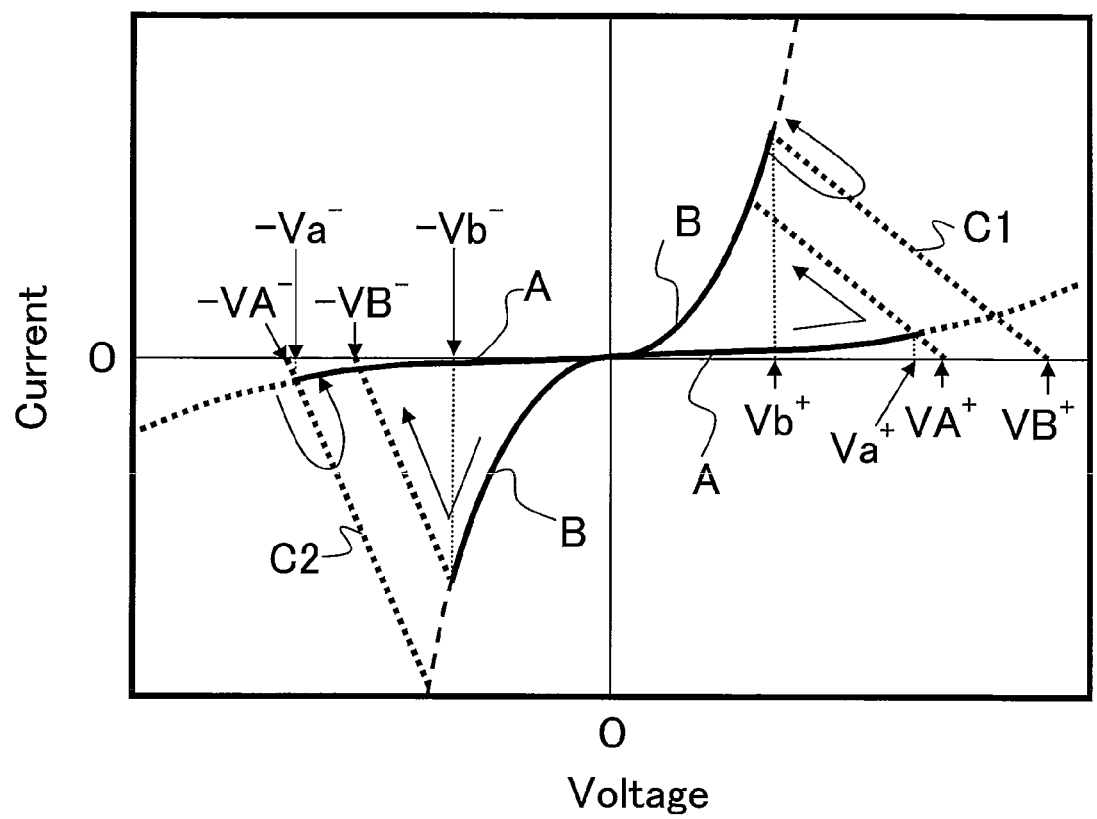
FIG. 27 is a current-voltage characteristic diagram showing the resistive characteristics of the variable resistive element capable of bipolar switching operations based on the present invention measured through the load resistance.

The variable resistive element 21 having the structure as shown in FIG. 3 has two resistive characteristics of high resistance state (characteristics A) and low resistance state (characteristics B), for instance, as shown in FIG. 4. The resistive characteristics of the variable resistive element can transit in both directions by applying voltage of same polarity between the two resistive characteristics. According to the present embodiment, when the element structure of the variable resistive element is asymmetric in a vertical direction, it is equivalent to the case where the positive or negative voltage polarity of the resistive characteristics shown in FIG. 23 is used. In addition, when the structure of the variable resistive element is symmetric in the vertical direction (when the materials of the upper electrode and the lower electrode and geometric dimensions thereof are the same), the two resistive characteristics A and B are symmetric to polarities of the applied voltages, respectively. Now, positive and negative of the voltage polarities may be specified by positive and negative polarities of voltage to be applied to the lower electrode 23 relative to the upper electrode 24.

According to the resistive characteristics of the high resistance state (characteristics A) and the low resistance state (characteristics B) shown in FIG. 4, in the high resistance state, the resistive characteristics transit from the high resistance state to the low resistance state by applying a voltage equal to or higher than a second threshold voltage Va that is a lower limit value of the absolute value of the applied voltage required for the resistive characteristics to transit from the high resistance state to the low resistance state, and setting a current compliance to be lower than a current value Ib provided when a first threshold voltage Vb, that is a lower limit value of the absolute value of the applied voltage required for the resistive characteristics to transit from the low resistance state to the high resistance state, is applied in the low resistance state, while in the low resistance state, the resistive characteristics transit from the low resistance state to the high resistance state by setting the current compliance to be higher than the current value Ib, and applying a voltage that is equal to or higher than the first threshold voltage Vb but lower than the second threshold voltage Va. Here, it is to be noticed that the switching operation between the high resistance state (characteristics A) and the low resistance state (characteristics B) can be implemented by switching the setting of the current compliance. When the current compliance is not set, the resistive characteristics do not transit from the low resistance state to the high resistance state stably. According to the present embodiment, the switching of the setting of the current compliance is equivalently implemented by changing the load resistive characteristics in the load resistive characteristic variable circuit 14.

In the following, referring to FIG. 5, we describe the principle of operation whereby stable unipolar switching operations at same short pulse width of 100 ns or shorter (e.g., 35 ns) in set and reset operations can be performed on the variable resistive element as shown in FIG. 3, by using the load circuit that can switch two different load resistive characteristics between set and reset operations, and a method of determining optimal load resistive characteristics. In the device of the present invention, the load circuit connecting in series with the variable resistive element that is a memory cell in the writing operation is assumed to be the word line decoder 12, the bit line decoder 13, the load resistive characteristic variable circuit 14 and a synthetic circuit such as parasitic resistance of signal wiring that connects these circuits. However, for simplicity of the description, as a load circuit, the description assumes stand-alone load resistance having linear load resistive characteristics.

Figure 5A:
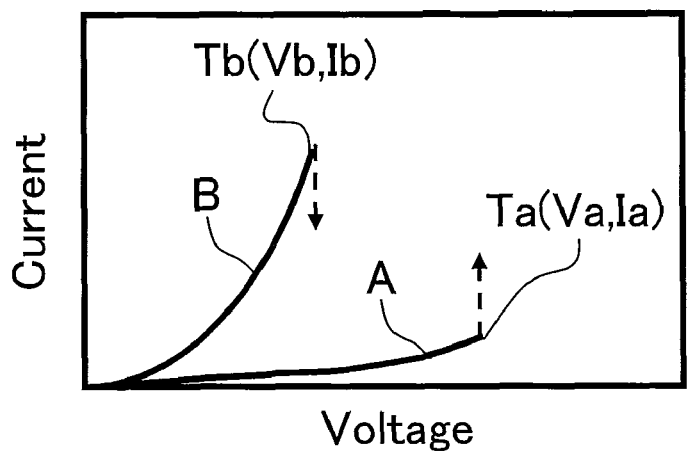
FIGS. 5A to 5C are a current-voltage characteristic diagram showing two resistive characteristics in a high resistance state and a low resistance state when measured not through a load resistance of the variable resistive element used in the first embodiment, and two types of current-voltage characteristic diagrams each showing two resistive characteristics in a high resistance state and a low resistance state when measured through the load resistor.
Figure 5B:
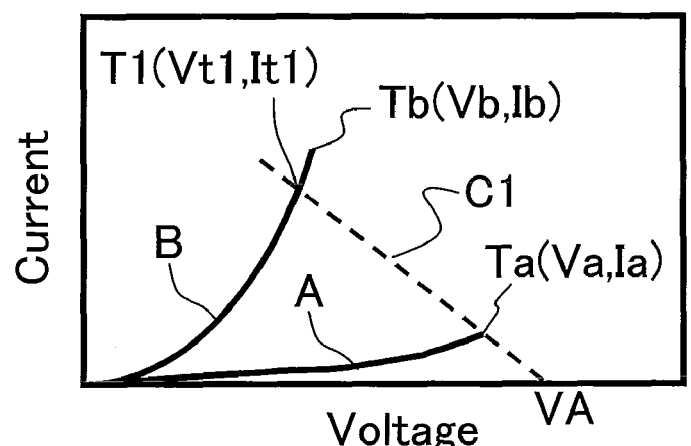

FIG. 5A is the I-V characteristic curve showing two resistive characteristics of high resistance state (characteristics A) and low resistance state (characteristics B) of a variable resistive element when it is measured without going through load resistance. In the high resistance state, a transition from the high resistance state to the low resistance state occurs at a transition point Ta (Va, Ia). In the low resistance state, a transition from the low resistance state to the high resistance state occurs at a transition point Tb (Vb, Ib). Now, voltage Va corresponds to the second threshold voltage, voltage Vb corresponds to the first threshold voltage, current Ia corresponds to the second threshold current, and current Ib is referred to as the first threshold current.

First, we describe a range of load resistive characteristics desirable for a transition from the high resistance state to the low resistance state, and a range of drive voltage Vda (voltage amplitude of voltage pulses) to be applied to a serial circuit of a load circuit and a variable resistive element (memory cell). If load resistance of resistance value R1 is connected in series to a variable resistive element having the resistive characteristics shown in FIG. 5A, the load resistive characteristics passing through the transition point Ta (Va, Ia) are plotted as a straight line C1 in FIG. 5B. Then, the drive voltage Vda is defined as the second critical voltage VA. In order to perform stable operation from the high resistance state to the low resistance state, it is required that the load resistive characteristic line C1 intersect the I-V characteristic curve in the low resistance state at a point T1 (Vt1, It1) on the low voltage side of the transition point Tb (Vb, Ib) from the low resistance state to the high resistance state. In fact, the load resistance characteristic line C1 going through the transition point Ta in FIG. 5B can be expressed by the Equation (1):

$$V = -R1 \times (I - Ia) + Va \tag{1}$$

Now, in order to satisfy the above requirement, V<Vb should be satisfied when I=Ib. Thus, the Equation (1) and the condition lead to the following Equation (2):

$$(Va - Vb)/(Ib - Ia) < R1 \tag{2}$$

Now, the resistance value in the left term of the Equation (2) is defined as the critical resistance value. The resistance value R1 can be expressed by the following Equation (3) by using respective coordinate values of the transition point Ta (Va, Ia) and the intersecting point T1 (Vt1, It1).

$$R1 = (Va - Vt1)/(It1 - Ia) \tag{3}$$

Furthermore, then, the voltage amplitude Vda of voltage pulses that have the variable resistive element transit from the high resistance state to the low resistance state through load resistance should have higher voltage than the second critical voltage VA. In fact, since the value obtained by substituting 0 for I in the Equation (1) showing the load resistive characteristic line C1 is the second critical voltage VA, the voltage amplitude Vda should satisfy the following Equation (4).

$$Vda > Va + R1 \times Ia \tag{4}$$

We continue to describe a range of load resistive characteristics desirable for a transition from the low resistance state to the high resistance state, and a range of drive voltage Vdb (voltage amplitude of voltage pulses) to be applied to a serial circuit of a load circuit and a variable resistive element (memory cell). If load resistance of resistance value R2 is connected in series to a variable resistive element having the resistive characteristics shown in FIG. 5A, the load resistive characteristics passing through the transition point Tb (Vb, Ib) are plotted as a straight line C2 in FIG. 5C. Then, the drive voltage Vdb is defined as the first critical voltage VB. In order to perform stable operation from the low resistance state to the high resistance state, it is required that the load resistive characteristic line C2 intersects the I-V characteristic curve in the high resistance state at a point T2 (Vt2, It2) on the low voltage side of the transition point Ta (Va, Ia) from the high resistance state to the low resistance state. In fact, the load resistance characteristic line C2 going through the transition point Tb in FIG. 5C can be expressed by the Equation (5):

$$V = -R2 \times (I - Ib) + Vb \tag{5}$$

Now, in order to satisfy the above requirement, V<Va should be satisfied when I=Ia. Thus, the Equation (5) and the condition lead to the following Equation (6):

$$(Va - Vb)/(Ib - Ia) > R2 \tag{6}$$

Now, the resistance value in the left term of the Equation (6) is the same critical resistance value as the resistance value in the left term of the Equation (2). The resistance value R2 can be expressed by the following Equation (7) by using respective coordinate values of the transition point Tb (Vb, Ib) and the intersecting point T2 (Vt2, It2).

$$R2 = (Vt2 - Vb)/(Ib - It2) \tag{7}$$

Furthermore, then, the voltage amplitude Vdb of voltage pulses that have the variable resistive element transit from the low resistance state to the high resistance state through load resistance should have higher voltage than the first critical voltage VB. In fact, since the value obtained by substituting 0 for I in the Equation (5) showing the load resistive characteristic line C2 is the first critical voltage VB, the voltage amplitude Vdb should satisfy the following Equation (8).

$$Vdb > Vb + R2 \times Ib \tag{8}$$

In the above description, although the second critical voltage VA and the first critical voltage VB are different, it is possible to set same voltage to voltage amplitude Vda of voltage pulses for having the variable resistive element from the high resistance state to the low resistance state and voltage amplitude Vdb for having the variable resistive element from the low resistance state to the high resistance state, as far as they satisfy the Equations (4) and (8).

Figure 5C:
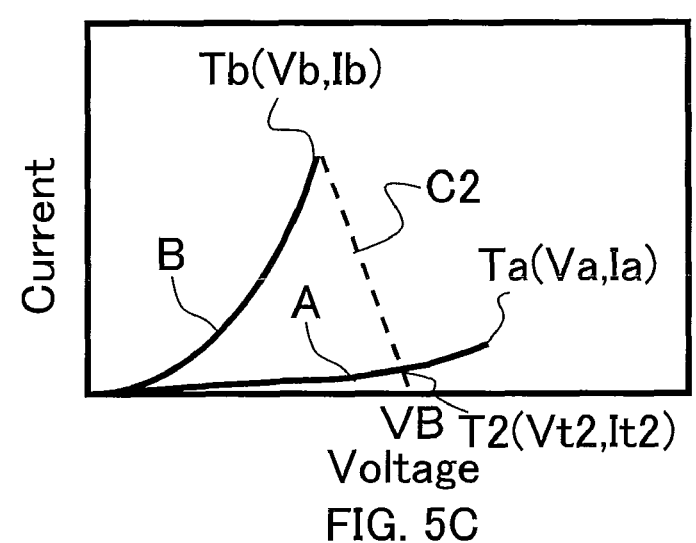

In this case, for instance, in switching operation from the low resistance state to the high resistance state, the voltage amplitude Vdb has considerably higher voltage than the first critical voltage VB, and in FIG. 5C, even if the load resistive characteristic line C2 moves in parallel to the right (the high voltage direction) and the intersection between the load resistive characteristic line C2 and the I-V characteristic curve in the high resistance state (characteristics A) moves to the high voltage side of the transition point Ta (Va, Ia), then bidirectional transitions occur between the high resistance state and the low resistance state, thus leading to unstable oscillation condition. However, when application of voltage pulses ends, the load resistive characteristic line C2 moves in parallel to the left (direction of low voltage) as the voltage amplitude Vdb lowers, and the intersection between the load resistive characteristic line C2 and the I-V characteristic curve in the high resistance state (characteristics A) moves to the low voltage side of the transition point Ta (Va, Ia). Thus, a transition to the high resistance state finally occurs and the resistive characteristics become stable in the high resistance state. Furthermore, in switching operation from the high resistance state to the low resistance state, the voltage amplitude Vda has considerably higher voltage than the second critical voltage VA, and in FIG. 5B, even if the load resistive characteristic line C1 moves in parallel to the right (the high voltage direction) and the intersection between the load resistive characteristic line C1 and the I-V characteristic curve in the low resistance state (characteristics B) moves to the high voltage side of the transition point Tb (Vb, Ib), then bidirectional transitions occur between the high resistance state and the low resistance state, thus leading to unstable oscillation condition. However, when application of voltage pulses ends, the load resistive characteristic line C1 moves in parallel to the left (direction of low voltage) as the voltage amplitude Vda lowers, and the intersection between the load resistive characteristic line C1 and the I-V characteristic curve in the low resistance state (characteristics B) moves to the low voltage side of the transition point Tb (Vb, Ib). Thus, a transition to the low resistance state finally occurs and the resistive characteristics become stable in the low resistance state. Then, due to the above, it is possible to set the voltage amplitude Vda and the voltage amplitude Vdb to same voltage in the device of the present invention.

Figure 6:
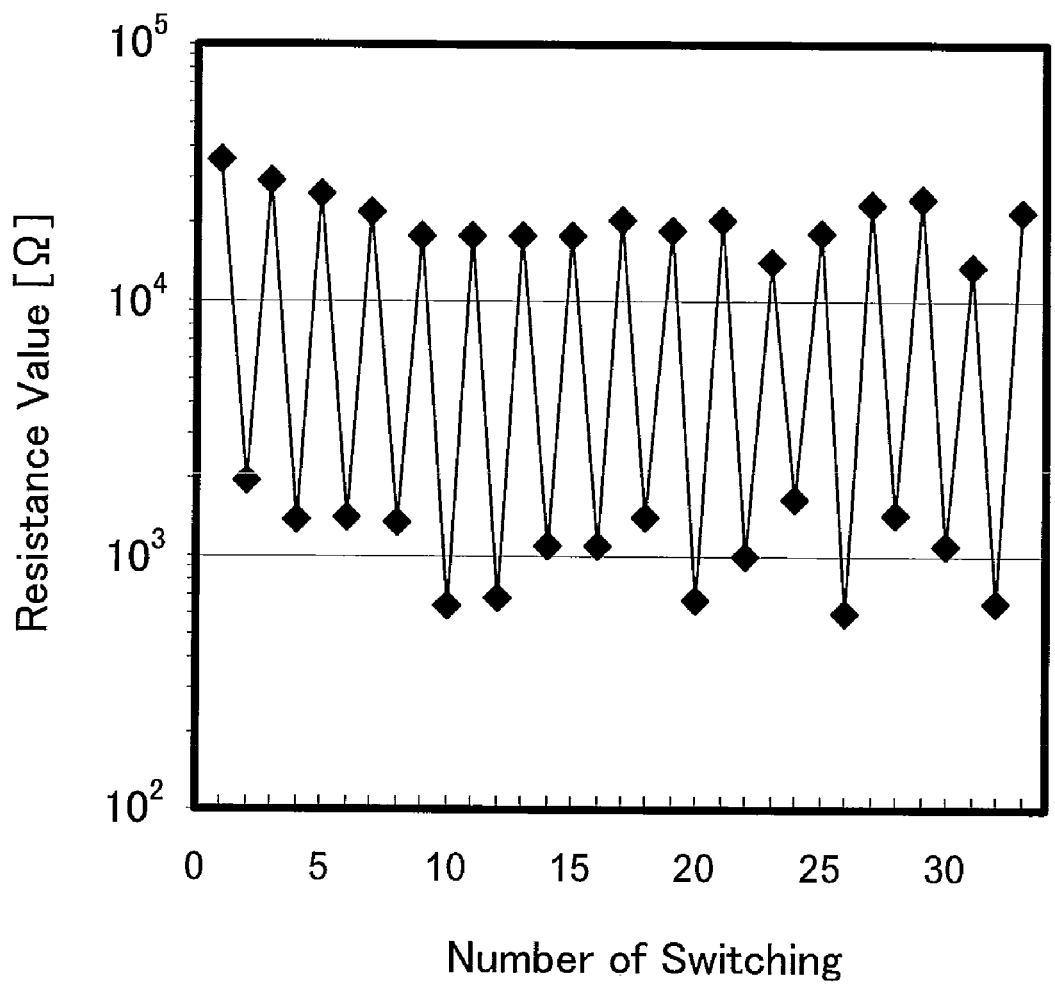
FIG. 6 is a view showing variations in the resistance value when an experiment of unipolar switching operation was conducted on the variable resistive element used in the first embodiment, through the load resistor.
Figure 7:
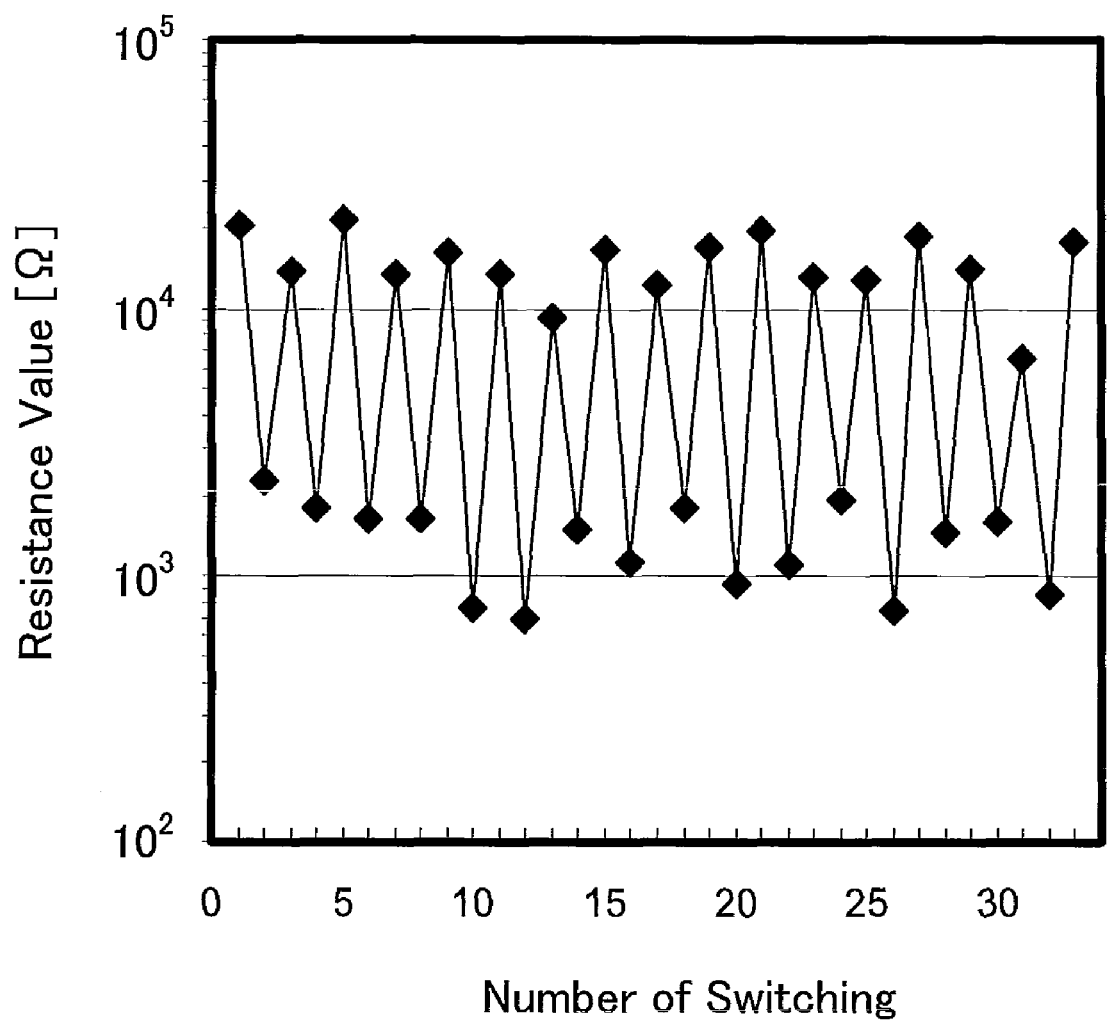
FIG. 7 is a view showing variations in the resistance value when the experiment of unipolar switching operation was conducted on the variable resistive element used in the first embodiment, through load resistor.

FIGS. 6 and 7 show examples of the measurement results when the load resistive characteristics are switched stably by switching the set operation and reset operation repeatedly. FIG. 6 shows the switching characteristics when a voltage pulse having a voltage amplitude of 5 V is applied for 30 ns by use of a load resistance of 1.5 kΩ during the set operation, and a voltage pulse having a voltage amplitude of 3 V is applied for 30 ns without using the load resistance (load resistance is 0Ω) during the reset operation. In addition, FIG. 7 shows the switching characteristics when a voltage pulse having a voltage amplitude of 5 V is applied for 30 ns by use of a load resistance of 1.5 kΩ during the set operation, and a voltage pulse having a voltage amplitude of 5 V is applied for 30 ns without using the load resistance (load resistance is 0Ω) during the reset operation. Although the voltage amplitude in the set operation is different from that in the reset operation in FIG. 6, the set operation and the reset operation have the same voltage amplitude in FIG. 7. In either case, the stable switching operation is confirmed.

In the above description of the principle of operation and a method of determining optimal load resistive characteristics, although stand-alone load resistance having linear load resistive characteristics is assumed as a load circuit, the load resistive characteristics are nonlinear in actual circuit configuration, as the load circuit includes transistors, that have nonlinear current-voltage characteristics for selecting a word line or a bit line, of the word line decoder 12 or the bit line decoder 13. Even when the load resistive characteristics are nonlinear, the idea about the above principle operation and the method of determining optimal load resistive characteristics would be the same.

Figure 8:
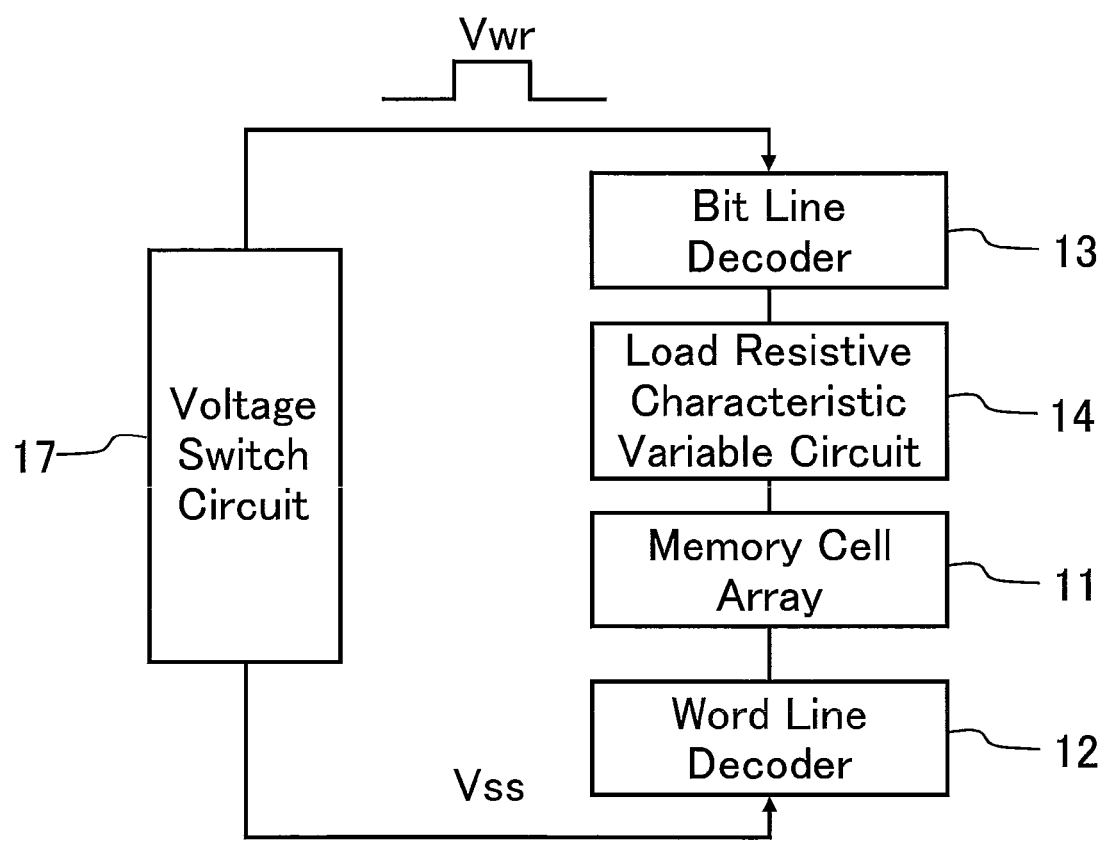
FIG. 8 is a block diagram schematically showing relations among the variable resistive element of the selected memory cell as a writing target, the load circuit, and the voltage switch circuit in the first embodiment.

In the following, we describe specific circuit configuration of the load resistive characteristic variable circuit 14 to be used in this embodiment, with reference to FIGS. 8, 9 and 10. FIG. 8 schematically shows a relation of the variable resistive element 21 of the selected memory cell to be written, the load circuit and the voltage switch circuit 17. In FIG. 8, the load circuit can be treated as all circuits to which voltage pulses are applied from the voltage switch circuit 17 excluding the selected memory cell, and include the word line decoder 12, the bit line decoder 13, the load resistive characteristic variable circuit 14, and parasitic resistance of signal wiring such as the selected word line or selected bit line or the like. Thus, the load resistive characteristics are assumed as the current-voltage characteristics of synthetic circuit of all circuits excluding the selected memory cell. According to the example shown in FIG. 8, the ground voltage Vss is applied from the voltage switch circuit 17 to one selected word line through the word line decoder 12, and a voltage Vwr is applied as the writing voltage pulse to the plurality of selected bit lines through the bit line decoder 13 and the load resistive characteristic variable circuit 14. In addition, the voltage Vwr is applied to the unselected word line through the word line decoder 12, the same writing voltage pulse is applied to both ends of the unselected memory cell positioned between the unselected word line and the selected bit line at the same time, and the effective writing voltage is not applied thereto. In addition, the ground voltage Vss is applied to the unselected bit line through the bit line decoder 13 and the load resistive characteristic variable circuit 14, and the ground voltage Vss is applied to both ends of the unselected memory cell positioned between the unselected bit line and the selected word line at the same time, and the effective writing voltage is not applied thereto. Although the writing voltage pulse is applied to both ends of the unselected memory cell positioned between the unselected bit line and the unselected word line so as to be biased reversely to the selected memory cell, the diode in the unselected memory cell becomes the reversely biased state, so that the reversely biased writing voltage pulse is not applied to the variable resistive element.

Figure 9:
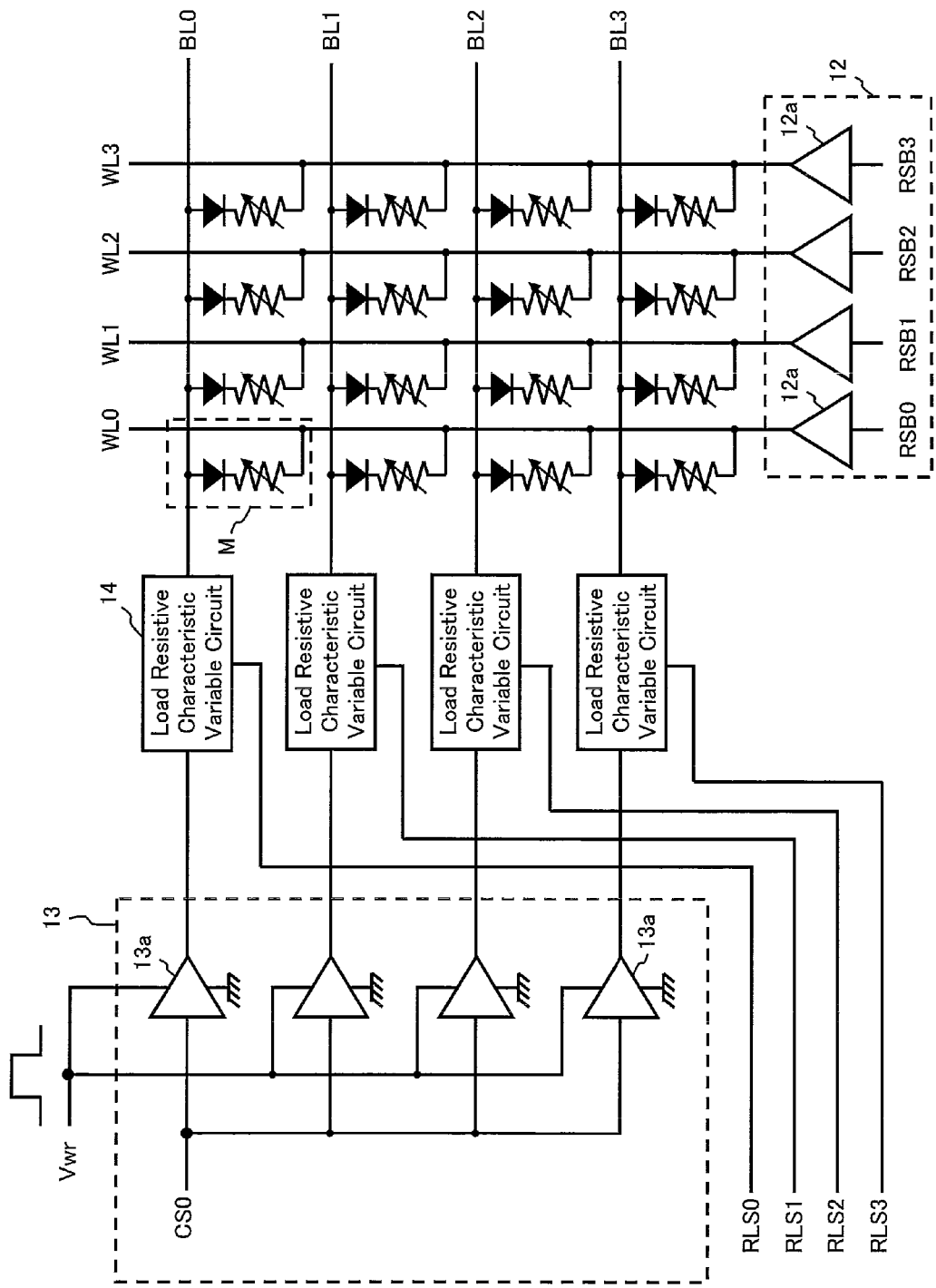
FIG. 9 is a circuit diagram schematically showing connection relations of a memory cell array, a word line decoder, a bit line decoder, and a load resistive characteristic variable circuit in the first embodiment.

FIG. 9 shows connection relations among the word line decoder 12, the bit line decoder 13 and the load resistive characteristic variable circuit 14 to four bit lines BL0 to 3 and four word lines WL0 to 3 in the memory cell array 11. In the word line decoder 12 and the bit line decoder 13, only a last-stage word line driver 12a and a bit line driver 13a are shown, respectively and driven by row selecting signals RSB0 to 3 and column selecting signal CS0, respectively.

According to the example shown in FIG. 9, the four bit lines BL0 to 3 are all selected or unselected at the same time, and the four bit lines correspond to bits of four-bit writing data D0 to 3. Therefore, the switching operations of the load resistive characteristics of the four load resistive characteristic variable circuits 14 are controlled by load resistance switching signals RLS0 to 3 corresponding to the writing data D0 to 3, respectively.

In FIG. 9, each of the word line driver 12a and the bit line driver 13a is provided with a buffer circuit having a level shifter (refer to FIG. 10C), in which as a high potential during writing operation, not the power supply voltage Vcc but the write voltage pulse Vwr is supplied. In addition, the row selecting signals RSB0 to 3 inputted to the word line drivers 12a select the corresponding word lines WL0 to 3 at low level but do not select them at high level. In addition, the column selection signal CS0 inputted to the bit line driver 13a selects the bit lines BL0 to 3 at the same time at high level but does not select them at the same time at low level.

FIG. 10A shows one example of a specific circuit configuration of the load resistive characteristic variable circuit 14. The load resistive characteristic variable circuit 14 shown in FIG. 10A includes switch circuits 30 and 31 having two CMOS transfer gates, two high and low resistive elements RH (11 kΩ) and RL (0.1 kΩ) connected to the above circuits in series, respectively so that two serial circuits are connected in parallel, an inverter circuit 32, and a buffer circuit 33 to generate complimentary input signals having the same voltage amplitude as that of the writing voltage Vwr inputted to the two switch circuits 30 and 31, from the load resistance switching signals RLS0 to 3. As have been described in detail with reference to FIG. 5, in the reset operation (first writing operation) to have the resistive characteristics of the variable resistive element transit from the low resistance state to the high resistance state, the load resistive characteristics of the low resistance are to be used, while in the set operation (second writing operation) to transit the resistive characteristics of the variable resistive element from the high resistance state to the low resistance state, the load resistive characteristics of the high resistance are to be used. Thus, in the reset operation (programming of the data "0"), the signal level of the load resistance switching signals RLS0 to 3 are set to high level, to turn on the switch circuit 30 and turn off the switch circuit 31 to select the side of the resistive element RL (0.1 kΩ), and in the set operation (programming of the data "1"), the signal level of the load resistance switching signals RLS0 to 3 are set to low level, to turn on the switch circuit 31 and turn off the switch circuit 30 to select the side of the resistive element RL (1 kΩ). As a result, the stable unipolar switching operation can be performed as shown in FIG. 7.

FIGS. 10B and 10C show examples of the circuit configurations of the inverter circuit 32 and the buffer circuit 33, respectively. When the voltage amplitude of the load resistance switching signals RLS0 to 3 inputted to the inverter circuit 32 and the buffer circuit 33 is the power supply voltage Vcc, and the voltage amplitude of the complementary input signal outputted from the inverter circuit 32 and the buffer circuit 33 is the writing voltage Vwr that is higher than the power supply voltage Vcc, the inverter circuit 32 and the buffer circuit 33 are provided with level shifter circuits as shown in FIGS. 10B and 10C. When the voltage signals of the input signal and the output signal are the same between the inverter circuit 32 and the buffer circuit 33, the inverter circuit 32 and the buffer circuit 33 are configured such that the normal inverter circuits are connected in two stages vertically.

In addition, the circuit configuration of the buffer circuit 33 shown in FIG. 10C can be applied to the word line driver 12a and the bit line driver 13a.

FIG. 10D shows an example of circuit configuration in which the load resistive characteristic variable circuit 14 shown in FIG. 10A is further simplified.

Figure 11A:
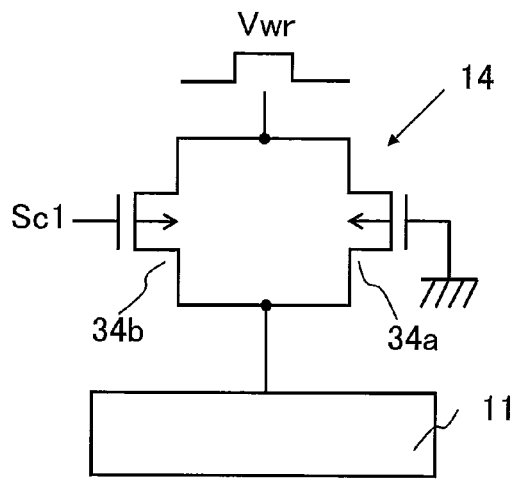
FIGS. 11A to 11E are circuit diagrams showing other circuit configuration examples of the load resistive characteristic variable circuit.

FIGS. 11A to 11E show five examples of circuit configurations of the load resistive characteristic variable circuit 14. FIG. 11A shows the load resistive characteristic variable circuit 14 configured by parallel connection of P-type MOSFET 34a that is always in ON state and P-type MOSFET 34b that can be switched ON and OFF by a control signal Sc1. If the P-type MOSFET 34a and P-type MOSFET 34b are set to the same size, switching of the nonlinear load resistive characteristics becomes possible by the control signal Sc1. In addition, use of a resistive element having linear or nonlinear resistive characteristics or a diode adapted to voltage polarities could also implement the load resistance characteristic circuit 14 capable of switching the load resistive characteristics by turning the P-type MOSFET 34b ON and OFF.

Figure 11B:
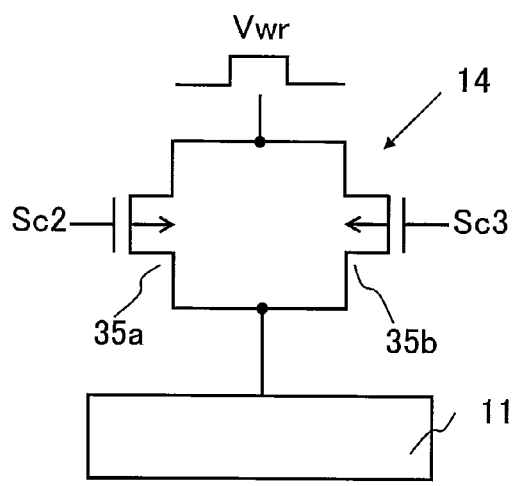

FIG. 11B shows the load resistive characteristic variable circuit 14 configured by parallel connection of P-type MOSFETs 35a, 35b that can be switched ON or OFF by two control signals Sc2, Sc3. The P-type MOSFETs 35a, 35b are controlled so that one is turned ON while the other is turned OFF. In the example shown in FIG. 11B, switching of the nonlinear load resistive characteristics becomes possible by making a difference in gate width or the like of the P-type MOSFETs 35a, 35b. In addition, the P-type MOSFETs 35a, 35b may have the same size and resistance component of different resistance values may be added in series to both or any one of them.

Figure 11C:
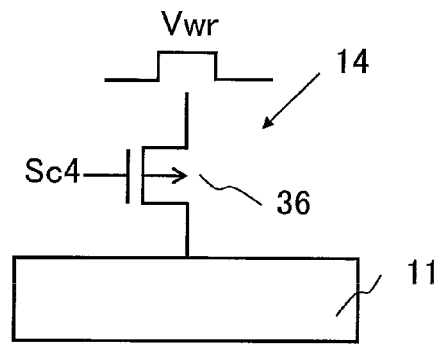

FIG. 11C shows the load resistive characteristic variable circuit 14 configured by one P-type MOSFET 36 that can control the gate voltage in multiple stages by one control signal Sc4. Switching of the nonlinear load resistive characteristics becomes possible, by configuring the control signal Sc4 so that one signal level for turning OFF the P-type MOSFET 36 and two signal levels for turning ON the P-Type MOSFET 36 can be outputted, and by switching the two signal levels for turning ON the P-type MOSFET 36.

Figure 11D:
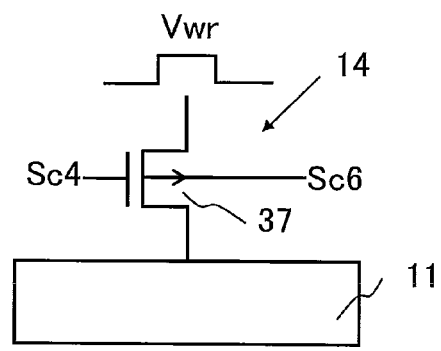

FIG. 11D shows the load resistive characteristic variable circuit 14 configured by one P-type MOSFET 37 that can control the gate voltage and back gate (substrate) voltage in two stages, respectively, with two control signals Sc5, Sc6. The control signal Sc5 controls whether to turn ON or OFF the P-type MOSFET 37, while the control signal Sc6 adjusts the back gate voltage of the P-type MOSFET 37, thus changing the threshold voltage. Switching of the nonlinear load resistive characteristics becomes possible by turning ON the P-type MOSFET 37 and switching the threshold voltage in two ways to high or low, with the back gate voltage.

Figure 11E:
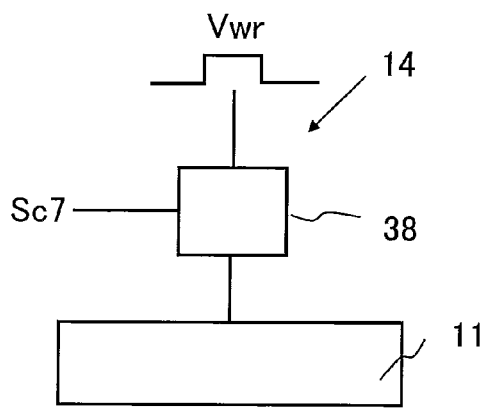

FIG. 11E shows the load resistive characteristic variable circuit 14 configured by one resistive control element 38 that can control the gate voltage in multiple stages with one control signal Sc7. As the resistive control element 38, a transfer gate composed of anything other than MOSFET or that composed of a single channel transistor or the like can be used. Switching of the load resistive characteristics becomes possible by switching signal levels of the control signal Sc7.

Next, a description will be made of the writing operations in which the set operation and reset operation for the plurality of memory cells of the device 10 of the present invention are mixed.

First, when the control circuit 16 is instructed by an address signal, a data entry signal, a control input signal, or the like from the external to write into a memory cell to be written specified by the address signal, it activates the voltage switch circuit 17 and gives instruction to output voltage to be applied to each of the selected word line, unselected word line, selected bit line, and unselected bit line, during writing operation. The voltage switch circuit 17 supplies the word line driver 12a, the bit line driver 13a, the inverter circuit 32 and the buffer circuit 33 with the writing voltage Vwr generated in a voltage generation circuit (not shown), and supplies the word line decoder 12 and the bit line decoder 13 with the ground voltage Vss. As a result, the ground voltage Vss and the writing voltage Vwr are applied to the selected word line and the unselected word line, respectively, and the writing voltage Vwr and the ground voltage Vss are supplied to the selected bit line and the unselected bit line through the load resistive characteristic variable circuit 14, respectively. Therefore, the forward biased writing voltage Vwr is only applied to the selected memory cell connected between the plurality of selected bit lines and the one selected word line, and the voltage is not applied to the other unselected memory cells or reversely biased writing voltage Vwr is applied thereto. Thus, neither the set operation nor the reset operation is performed in the unselected memory cell.

In addition, the control circuit 16 controls the load resistive characteristic variable circuit 14 connected to each selected bit line connected to the selected memory cell as the writing target by a load resistance switching signal RLSi (i corresponds to each bit of the programming data) so as to implement the load resistive characteristics for the reset operation or the set operation corresponding to the writing data "0" or "1" of the selected memory cell. More specifically, in the load resistive characteristic variable circuit 14, when the programming data is "0", the load resistive characteristics on the low resistance side are selected, and when the programming data is "1", the load resistive characteristics on the high resistance side are selected. Since the writing voltage Vwr is set such that the absolute value is to be equal to or higher than the first critical voltage VB mentioned above, and higher than the second critical voltage VA, the reset operation for the memory cell whose programming data is "0" and the set operation for the memory cell whose programming data is "1" are performed at the same time.

As for the memory cell whose programming data is "0" and stored data is "1", since the load resistive characteristics of the load circuit are set on the low resistance side, the voltage fluctuation applied to the load circuit before and after the reset operation is controlled to be small, so that the voltage applied to both ends of the variable resistive element after the reset operation can be controlled to be equal to or lower than the second threshold voltage (Va) and the reset operation can be completed stably. Even when the voltage equal to or higher than the second threshold voltage (Va) is applied to both ends of the variable resistive element after the reset operation while the writing voltage pulse is applied, at a final stage, as the writing voltage Vwr is lowered, the state in which the applied voltage after the reset operation becomes lower than the second threshold voltage (Va) occurs prior to the state in which the applied voltage before the reset operation becomes lower than the first threshold voltage (Vb), so that the reset operation can be executed stably. Here, similarly, even when the original stored data is "0" (resistive characteristics are the high resistance state), the data "0" is programmed eventually. Therefore, in the reset operation, the data "0" is programmed regardless of the original stored data.

As for the memory cell whose programming data is "1" and stored data is "0", since the load resistive characteristics of the load circuit are set on the high resistance side, the voltage fluctuation applied to the load circuit before and after the set operation is larger than that before and after the reset operation, so that the voltage applied to both ends of the variable resistive element after the set operation can be controlled to be equal to or lower than the first threshold voltage (Vb) and the set operation can be completed stably. Even when the voltage equal to or higher than the first threshold voltage (Vb) is applied to both ends of the variable resistive element after the set operation while the writing voltage pulse is applied, at a final stage, as the writing voltage Vwr is lowered, the state in which the applied voltage after the set operation becomes lower than the first threshold voltage (Vb) occurs prior to the state in which the voltage before the set operation becomes lower than the second threshold voltage (Va), so that the set operation can be executed stably. Here, similarly, even when the original stored data is "1" (resistive characteristics are the low resistance state), the data "1" is programmed eventually. Therefore, in the set operation, the data "1" is programmed regardless of the original stored data.

A known readout operation for memory cells written through the conventional unipolar switching operation or bipolar switching operations may be used as readout operations of memory cells of the device of the present invention. In addition, we omit detailed description of the readout operation as it is not the main object of the present invention.

Second Embodiment

Next, a second embodiment of the device of the present invention will be described. According to the first embodiment, when the 1D1R type memory cell is used, the writing operations in which the set operation and reset operation are mixed can be performed for the plurality of memory cells at the same time by the unipolar switching operation in which the load resistive characteristics of the load circuit are switched between the set operation and the reset operation and the application time of the writing voltage Vwr is set to be equal. However, the memory cell is not limited to the 1D1R type, and even when the memory cell is a 1T1R type memory cell configured by the variable resistive element and a transistor for selecting the memory cell (MOSFET and the like), similarly, the writing operations in which the set operation and reset operation are mixed can be performed for the plurality of memory cells at the same time by the unipolar switching operation in which the load resistive characteristics of the load circuit are switched between the set operation and the reset operation and the application time of the writing voltage Vwr is set to be equal. Hereinafter, a description will be made of the second embodiment in which the 1T1R type memory cell is used with reference to the drawings. It should be noted that the same reference symbols are given to the same components as those in the first embodiment.

Figure 12:
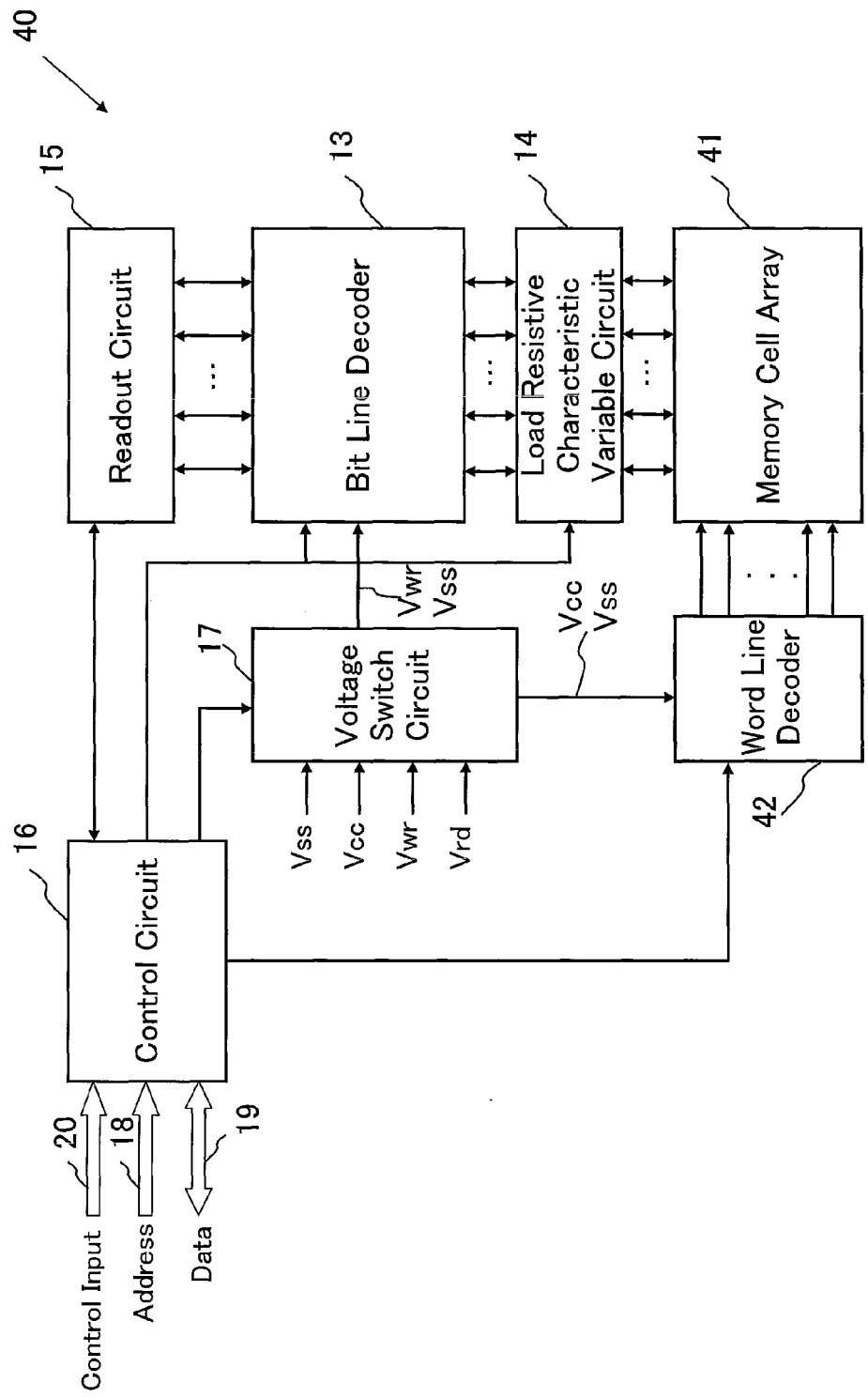
FIG. 12 is a block diagram showing a schematic example of circuit configuration in the second embodiment of the nonvolatile semiconductor memory device according to the present invention.

As shown in FIG. 12, a block configuration of a device 40 of the present invention in the second embodiment is substantially the same as the block configuration in the first embodiment shown in FIG. 1, and differs from the first embodiment only by a memory cell array 41 and a word line decoder 42.

Figure 13A:
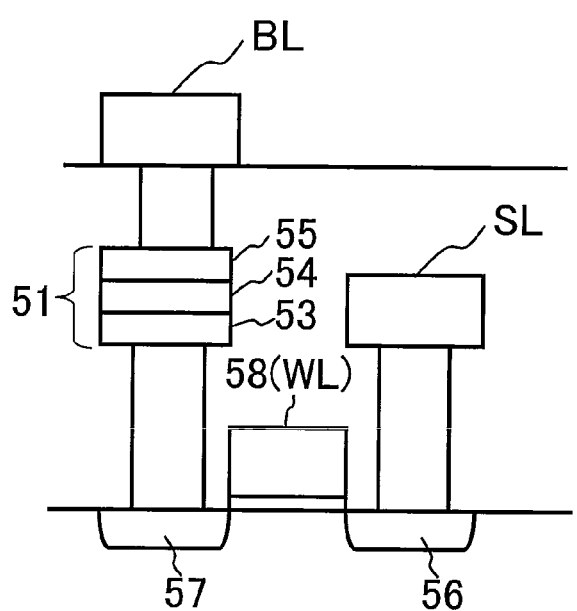
FIGS. 13A and 13B are a schematic vertical sectional view and an equivalent circuit diagram showing one example of configuration of a 1T1R type memory cell in the second embodiment.
Figure 13B:
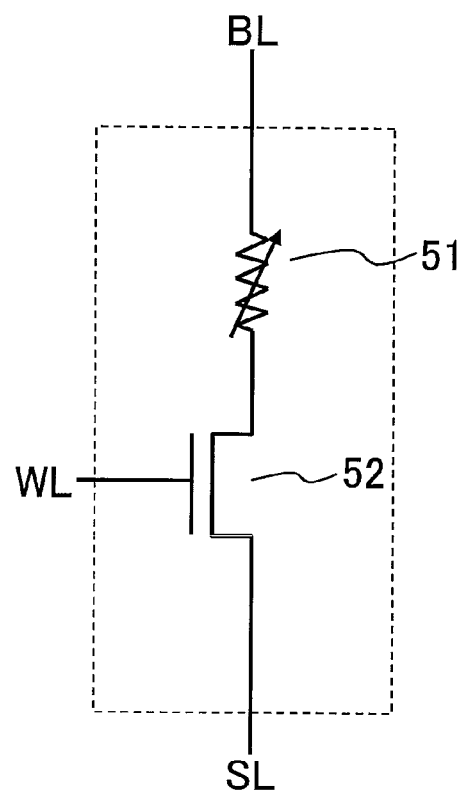

FIG. 13A shows a schematic sectional view of 1T1R memory cell. Memory cells comprising the memory cell 41 is formed as a serial circuit of a selection transistor 52 and a variable resistive element 51, the selection transistor 52 consisting of a source region 56 and a drain region 57 formed on a semiconductor substrate and a gate electrode 58 formed on a gate oxide film, and the variable resistive element 51 having the three-layered structure composed by laminating a lower electrode 53, a variable resistor 54 and an upper electrode 55, by electrically connecting the drain region 57 of the selection transistor 52 and the lower electrode 53 of the variable resistive element 51. The gate electrode 58 is connected to the word line WL, the source region 56 is connected to the source line SL, and the upper electrode 55 is connected to the bit line BL. The variable resistor 54 is made of TiON made by oxidizing TiN, and both the upper and lower electrodes are made of TiN. FIG. 13B is an equivalent circuit diagram of 1T1R type memory cell of the cross sectional structure shown in FIG. 13A. In addition, although it is assumed that the selection transistor 52 is the N-type MOSFET in the present embodiment, it may be a P-type MOSFET or a bipolar transistor. In the case of the bipolar transistor, a base electrode is connected to the word line WL, one of an emitter region or a collector region is connected to the source line SL or the bit line, and the other of the emitter region or the collector region is connected to one end of the variable resistive element 51.

Figure 14:
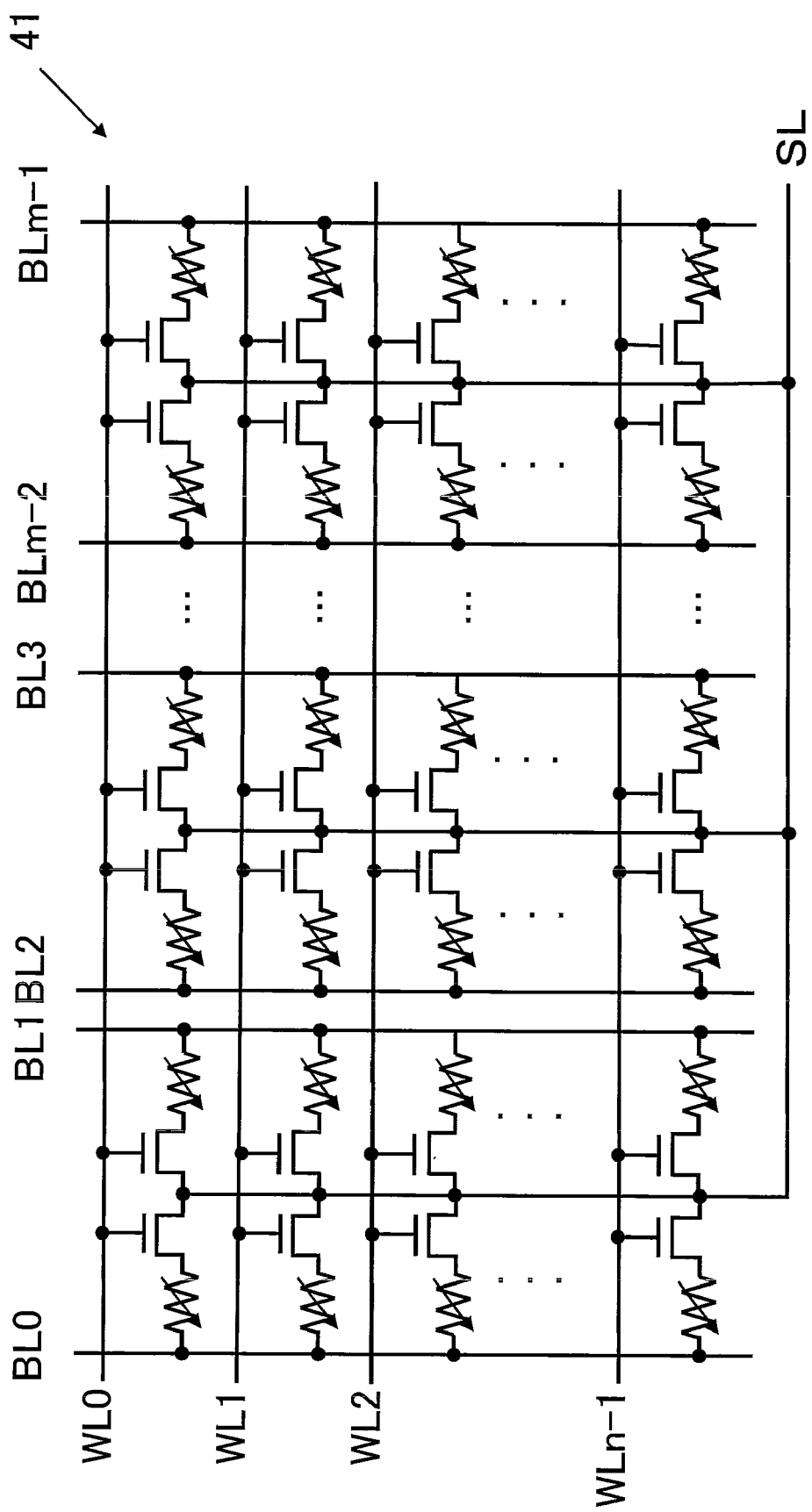
FIG. 14 is a circuit diagram showing a partial configuration of a memory cell array using the 1T1R type memory cell shown in FIG. 13.

FIG. 14 schematically shows partial configuration of the memory cell array 41 in which 1T1R type memory cells are arranged like a matrix. In FIG. 14, a gate of a selection transistor of each memory cell is connected to the word line (WL0 to WLn−1), a source of the selection transistor of each memory cell is connected to the common source line SL, and one end (on the side of upper electrode) of the variable resistive element of each memory cell is connected to the bit line (BL0 to BLm−1). In this embodiment, as unipolar switching operations are assumed, ground voltage is applied to the source line in respective memory operations of set, reset, and readout. Thus, as there is no need of switching the source line voltage depending on a type of memory operation, direct fixing to the ground voltage without going through the voltage switch circuit 17 is possible.

The word line decoder 42 connects to each word line of the memory cell array 41, and selects, as a selected word a word line of the memory cell array 41 corresponding to an address signal for row selection entered into the address line 18. It individually applies to the selected word line and an unselected word line selected word line voltage and unselected word line voltage for respective memory operations of set, reset, and readout. Then, it turns on the selected transistor of the memory cell connecting to the selected word line, and turns off the selected transistor of the memory cell connecting to the unselected word line. Since the selected word line voltage during the writing operation only has to turn on the selection transistor of the selected memory cell, and does not necessarily have the same voltage as the writing voltage Vwr, the selected word line may be driven by the power supply voltage Vcc.

Figure 15:
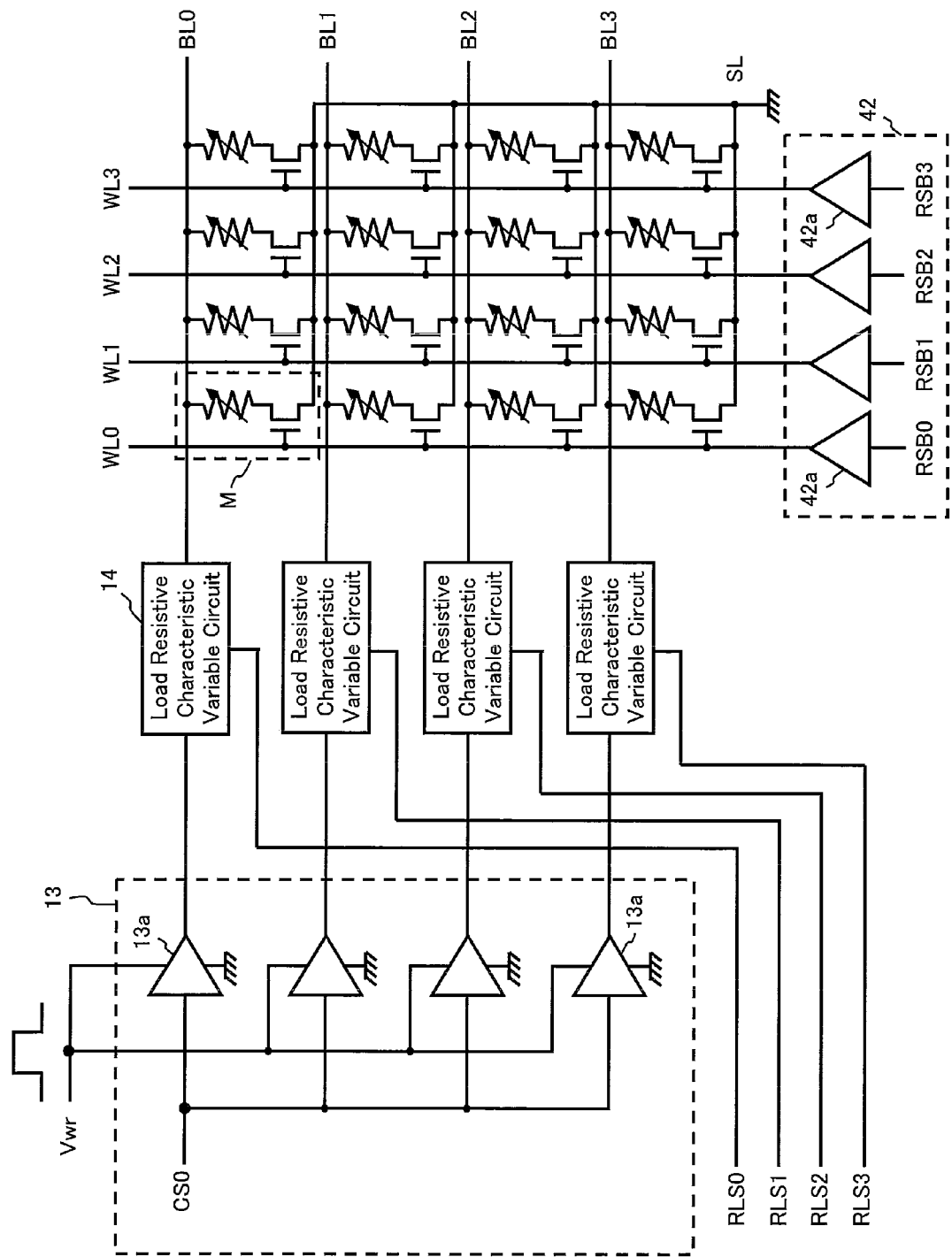
FIG. 15 is a circuit diagram schematically showing connection relations among a memory cell array, a word line decoder, a bit line decoder, and a load resistive characteristic variable circuit in the second embodiment.

FIG. 15 shows connection relations among the word line decoder 42, the bit line decoder 13 and the load resistive characteristic variable circuit 14 to four bit lines BL0 to 3 and four word lines WL0 to 3 in the memory cell array 41. In the word line decoder 42 and the bit line decoder 13, only a last-stage word line driver 42a and a bit line driver 13a are shown, respectively and driven by row selecting signals RSB0 to 3 and column selecting signal CS0, respectively. According to the example shown in FIG. 15, the four bit lines BL0 to 3 are all selected or unselected at the same time, and the four bit lines correspond to bits of four-bit writing data D0 to 3. Therefore, the switching operations of the load resistive characteristics of the four load resistive characteristic variable circuits 14 are controlled by load resistance switching signals RLS0 to 3 corresponding to the writing data D0 to 3, respectively.

In FIG. 15, the word line driver 42a is provided with a normal inverter circuit. In contrast, the bit line driver 13a is provided with a buffer circuit having a level shifter (refer to FIG. 10C), in which as a high potential during writing operation, not the power supply voltage Vcc but the write voltage pulse Vwr is supplied. In addition, the row selecting signals RSB0 to 3 inputted to the word line drivers 42a select the corresponding word lines WL0 to 3 at low level but do not select them at high level. In addition, the column selection signal CS0 inputted to the bit line driver 13a selects the bit lines BL0 to 3 at the same time at high level but does not select them at the same time at low level.

The load resistive characteristic variable circuit 14 may have the circuit configuration shown in FIGS. 10A and 10D or FIGS. 11A to 11E similar to the first embodiment.

Since the bit line decoder 13, the readout circuit 15, the control circuit 16, and the voltage switch circuit 17 are the same as those in the first embodiment, the overlapping description will not be given. In addition, regarding the writing operations for the plurality of memory cells in the device 40 of the present invention, in which the set operation and reset operation are mixed, since only the voltages applied to the selected word line and the unselected word line determined by the word line decoder 42 are different from those in the first embodiment, the overlapping description will not be given.

Third Embodiment

Next, a third embodiment of the device of the present invention will be described. According to the first embodiment, when the 1D1R type memory cell is used, the writing operations in which the set operation and reset operation are mixed can be performed for the plurality of memory cells at the same time by the unipolar switching operation in which the load resistive characteristics of the load circuit are switched between the set operation and the reset operation and the application time of the writing voltage Vwr is set to be equal. However, the memory cell is not limited to the 1D1R type, even when the memory cell is a 1R type memory cell configured only by the variable resistive element, similarly, the writing operations in which the set operation and reset operation are mixed can be performed for the plurality of memory cells at the same time by the unipolar switching operation in which the load resistive characteristics of the load circuit are switched between the set operation and the reset operation and the application time of the writing voltage Vwr is set to be equal. A description will be made of the third embodiment in which the 1R type memory cell is used with reference to the drawings. It should be noted that the same reference symbols are given to the same components as those in the first embodiment.

Figure 16:
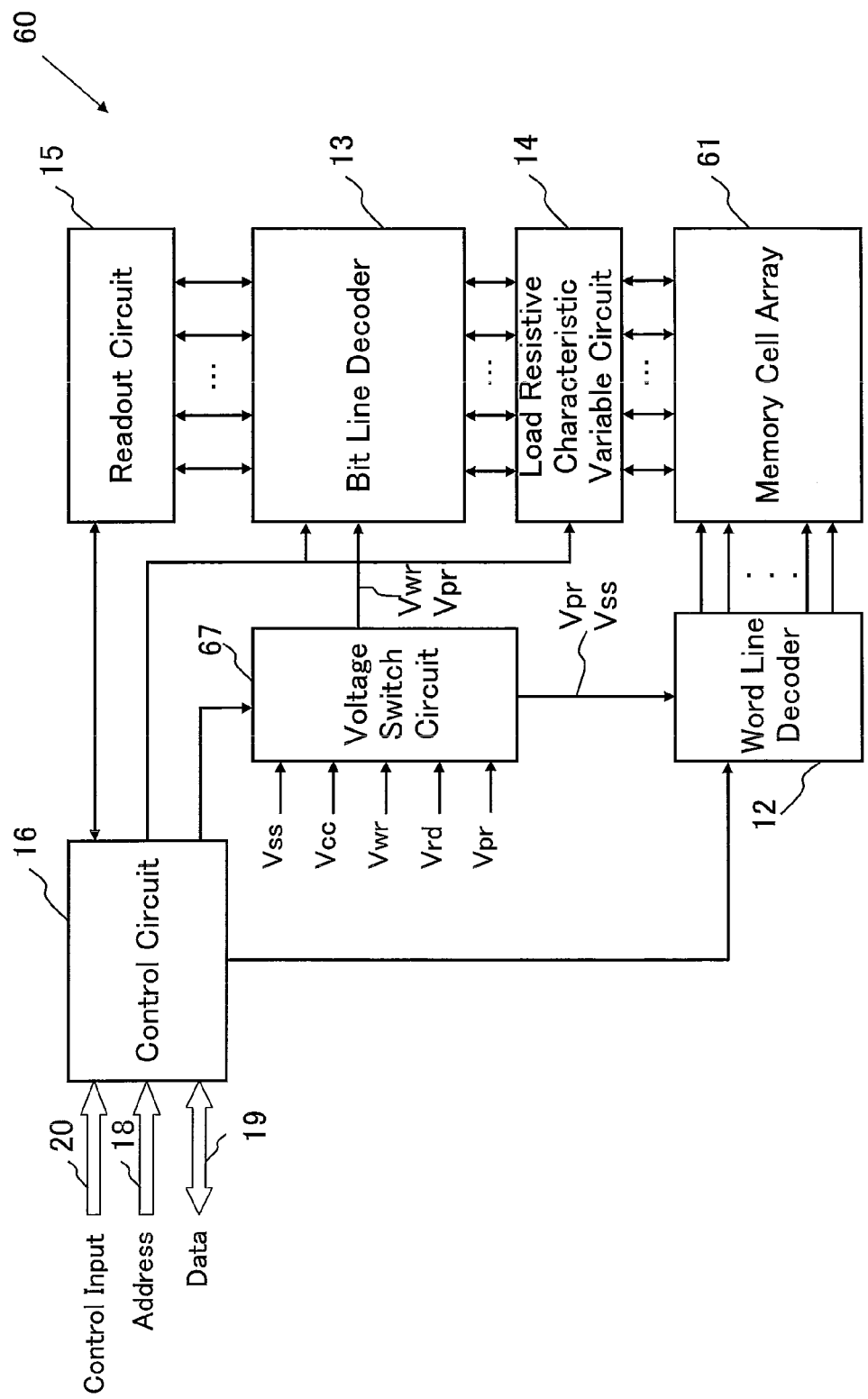
FIG. 16 is a block diagram showing a schematic example of circuit configuration in a third embodiment of the nonvolatile semiconductor memory device according to the present invention.

As shown in FIG. 16, a block configuration of a device 60 of the present invention in the third embodiment is substantially the same as the block configuration in the first embodiment shown in FIG. 1, and differs from the first embodiment only by a memory cell array 61 and a voltage switch circuit 67.

Figure 17:
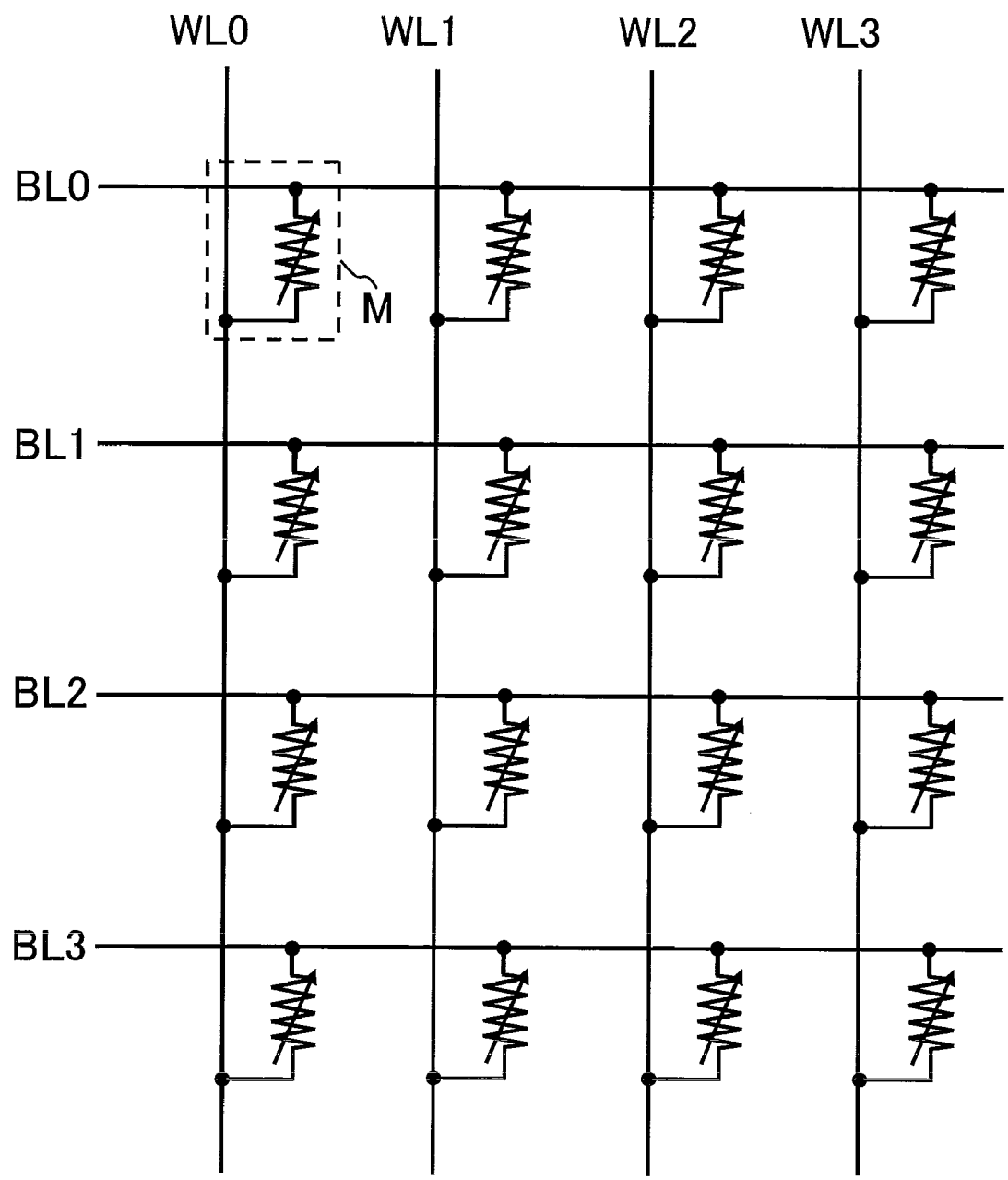
FIG. 17 is a circuit diagram showing a partial configuration of a cross point memory cell array shown in FIG. 16.

FIG. 17 is a schematic view showing a partial configuration of a cross point memory cell array 61. In FIG. 17, in the memory cell array 61, memory cells M are arranged at points where four bit lines BL0 to 3 and four word lines WL0 to 3 cross. As shown in FIG. 17, the memory cell array 61 has a cross point memory cell array structure in which a plurality of two-terminal structured memory cells M each having the variable resistive element to store information according to the change of the electric resistance are arranged in a row direction and a column direction. The memory cell array 61 includes a plurality of word lines extending in the row direction and a plurality of bit lines extending in the column direction, where each of the memory cells in the same row has one end of the memory cell connected to a common word line, and each of the memory cells in the same column has the other end of the memory cell connected to a common bit line. The memory cell M is configured only by the variable resistive element 21 used in the memory cell according to the first embodiment. Therefore, the resistive characteristics of the variable resistive element 21 are the same as in the first embodiment, and as shown in FIG. 4, the resistive characteristics take the high resistance state (characteristics A) and the low resistance state (characteristics B) and can transit between the two resistive characteristics bi-directionally in response to the application of the voltage having the same polarity.

The voltage switch circuit 67 applies a selected word line voltage, an unselected word line voltage, a selected bit line voltage, and an unselected bit line voltage necessary in the reading operation and writing operation in the memory cell array 61, to the word line decoder 12 and the bit line decoder 13. Vcc represents a supply voltage (power supply voltage) of the device 10 of the present invention, Vss represents the ground voltage, Vwr represents a writing voltage for both set operation and reset operation, Vrd represents a reading voltage, and Vpr represents a writing preventing voltage. According to the present embodiment, the selected bit line voltage during writing operation is supplied to the selected bit line through the bit line decoder 13 and the load resistive characteristic variable circuit 14. The writing preventing voltage Vpr is applied to the unselected bit line through the bit line decoder 13 and applied to the unselected word line through the word line decoder 12.

Although the ground voltage Vss is applied to the unselected bit line and the writing voltage Vwr is applied to the unselected word line in the first embodiment, since the diode as the rectifying element is not provided in the cross point memory cell array in the third embodiment, the writing preventing voltage Vpr that is intermediate in level between the writing voltage Vwr and the ground voltage Vss is applied to the unselected bit line and the unselected word line in order to prevent the set operation and the reset operation in the unselected memory cell with respect to either of the positive and negative voltage polarities. The writing voltage Vwr is applied to the plurality of selected bit lines through the load resistive characteristic variable circuit 14 similar to the first embodiment, and the ground voltage Vss is applied to the one selected word line similar to the first embodiment. Therefore, as the writing preventing voltage Vpr or a voltage calculated by subtracting the writing preventing voltage Vpr from the writing voltage Vwr (Vwr−Vpr) is applied to both ends of the unselected memory cell connected between the unselected bit line and the selected word line, and the unselected memory cell connected between the selected bit line and the unselected word line, when both writing preventing voltage Vpr and the difference voltage (Vwr−Vpr) are equal to or lower than the first threshold voltage with respect to either the positive or negative polarities of the applied voltage, the absolute value of the first threshold voltage is smaller than the absolute value of the second threshold voltage. Thus, the set operation and the reset operation can be prevented with respect to either the positive or negative applied voltage polarities. In addition, since both ends of the unselected memory cell connected between the unselected bit line and the unselected word line are at the same voltage, the voltage is not applied thereto, so that the set operation and the reset operation are prevented.

Since the word line decoder 12, the bit line decoder 13, the readout circuit 15, and the control circuit 16 are the same as those in the first embodiment, the overlapping description will not be given. In addition, regarding the writing operations for the plurality of memory cells in the device 60 of the present invention in which the set operation and reset operation are mixed, since only the voltages applied to the unselected bit line and the unselected word line differ from the first embodiment, the overlapping description will not be given.

Fourth Embodiment

Next, a fourth embodiment of the device of the present invention will be described. Although the description has been made of the case where the writing voltage pulse having the same voltage amplitude Vwr is applied to the selected memory cell and the serial circuit of the load circuit in both set operation and the reset operation in the first embodiment, a set voltage pulse and a reset voltage pulse having different voltage amplitudes Vwr1 and Vwr2, are separately used based on the programming data "0" and "1" in the set operation and the reset operation in the fourth embodiment. The memory cell is the 1D1R type memory cell similar to the first embodiment. Hereinafter, the fourth embodiment using the 1D1R type memory cell will be described with reference to the drawing. It should be noted that the same reference symbols are given to the same components as those in the first embodiment.

Here, the voltage amplitude Vwr1 of the set voltage pulse is set to be higher than the second critical voltage VA, and the voltage amplitude Vwr2 of the reset voltage pulse is set to be higher than the first critical voltage VB but lower than the second critical voltage VA. That is, the voltage amplitude Vwr1 of the set voltage pulse is higher than the voltage amplitude Vwr2 of the reset voltage pulse (Vwr1>Vwr2). In addition, since the first critical voltage VB and the second critical voltage VA have been described in the first embodiment, the overlapping description will not be given.

Figure 18:
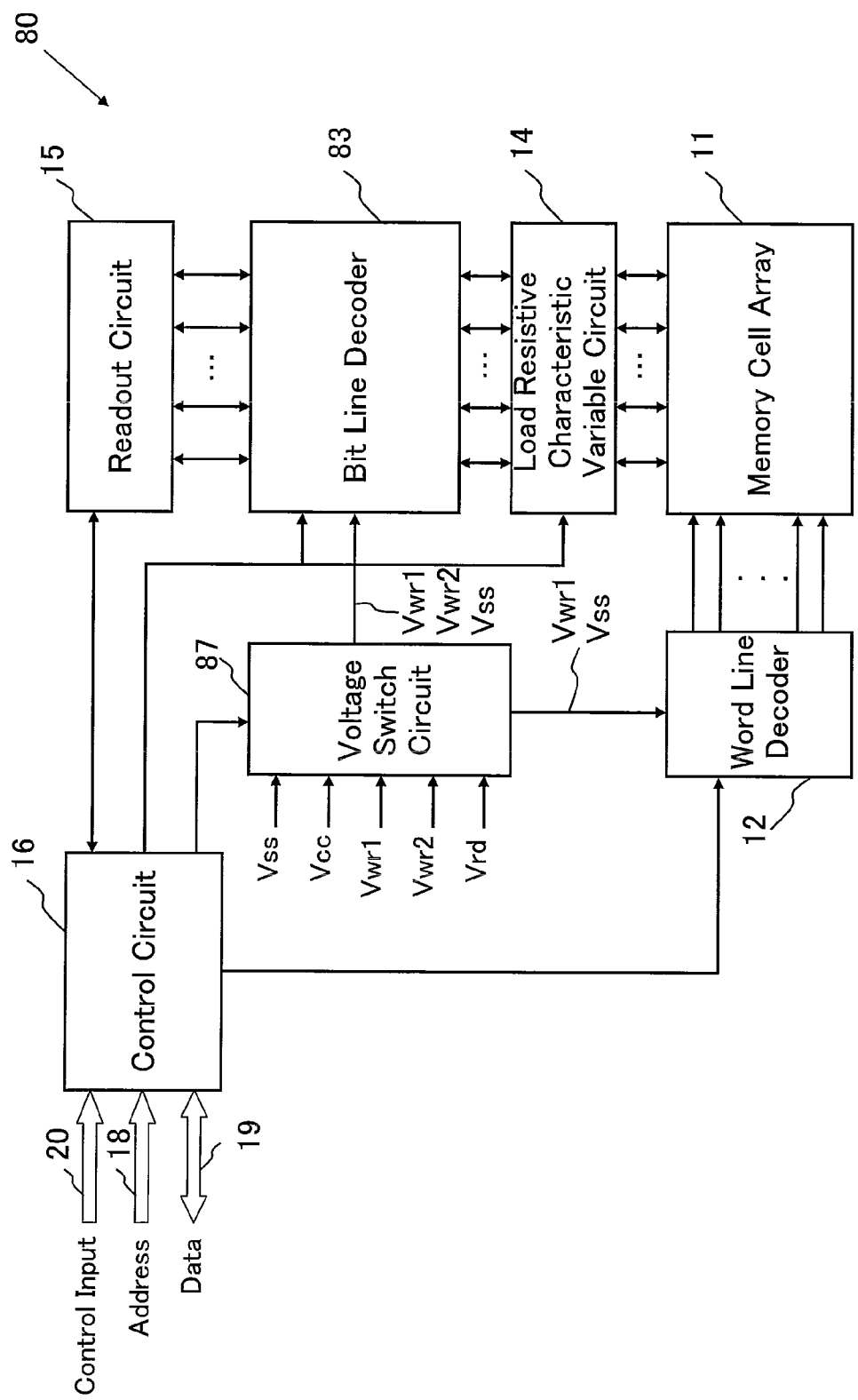
FIG. 18 is a block diagram showing a schematic example of circuit configuration in a fourth embodiment of the nonvolatile semiconductor memory device according to the present invention.

As shown in FIG. 18, a block configuration of a device 80 of the present invention in the fourth embodiment, is substantially the same as the block configuration shown in FIG. 1 in the first embodiment, and differs from the first embodiment only by a bit line driver 83a of a bit line decoder 83 and a voltage switch circuit 87.

Figure 19:
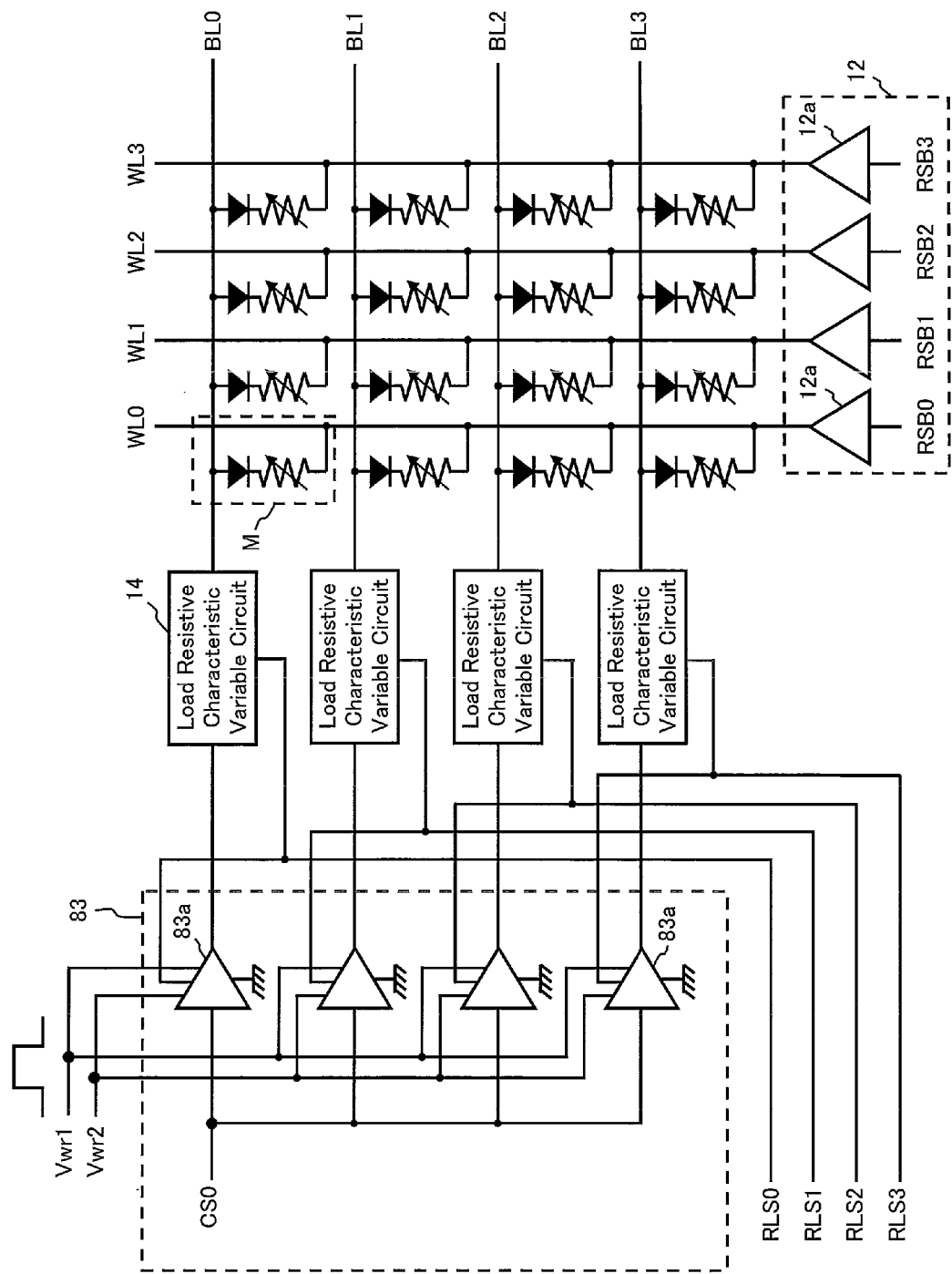
FIG. 19 is a circuit diagram schematically showing connection relations among a memory cell array, a word line decoder, a bit line decoder, and a load resistive characteristic variable circuit in the fourth embodiment.

FIG. 19 shows connection relations among the word line decoder 12, the bit line decoder 83 and the load resistive characteristic variable circuit 14 to four bit lines BL0 to 3 and four word lines WL0 to 3 in the memory cell array 11. In the word line decoder 12 and the bit line decoder 83, only a last-stage word line driver 12a and a bit line driver 83a are shown, respectively and driven by row selecting signals RSB0 to 3 and column selecting signal CS0, respectively. According to the example shown in FIG. 19, the four bit lines BL0 to 3 are all selected or unselected at the same time, and the four bit lines correspond to bits of four-bit writing data D0 to 3. Therefore, the switching operations of the load resistive characteristics of the four load resistive characteristic variable circuits 14 are controlled by load resistance switching signals RLS0 to 3 corresponding to the writing data D0 to 3, respectively.

In FIG. 19, the word line driver 12a is provided with a buffer circuit having a level shifter (refer to FIG. 10C), in which as a high potential during writing operation, not the power supply voltage Vcc but the set voltage pulse Vwr1 (>Vwr2) is supplied. In addition, the row selecting signals RSB0 to 3 inputted to the word line drivers 12a select the corresponding word lines WL0 to 3 at low level but do not select them at high level.

Figure 20:
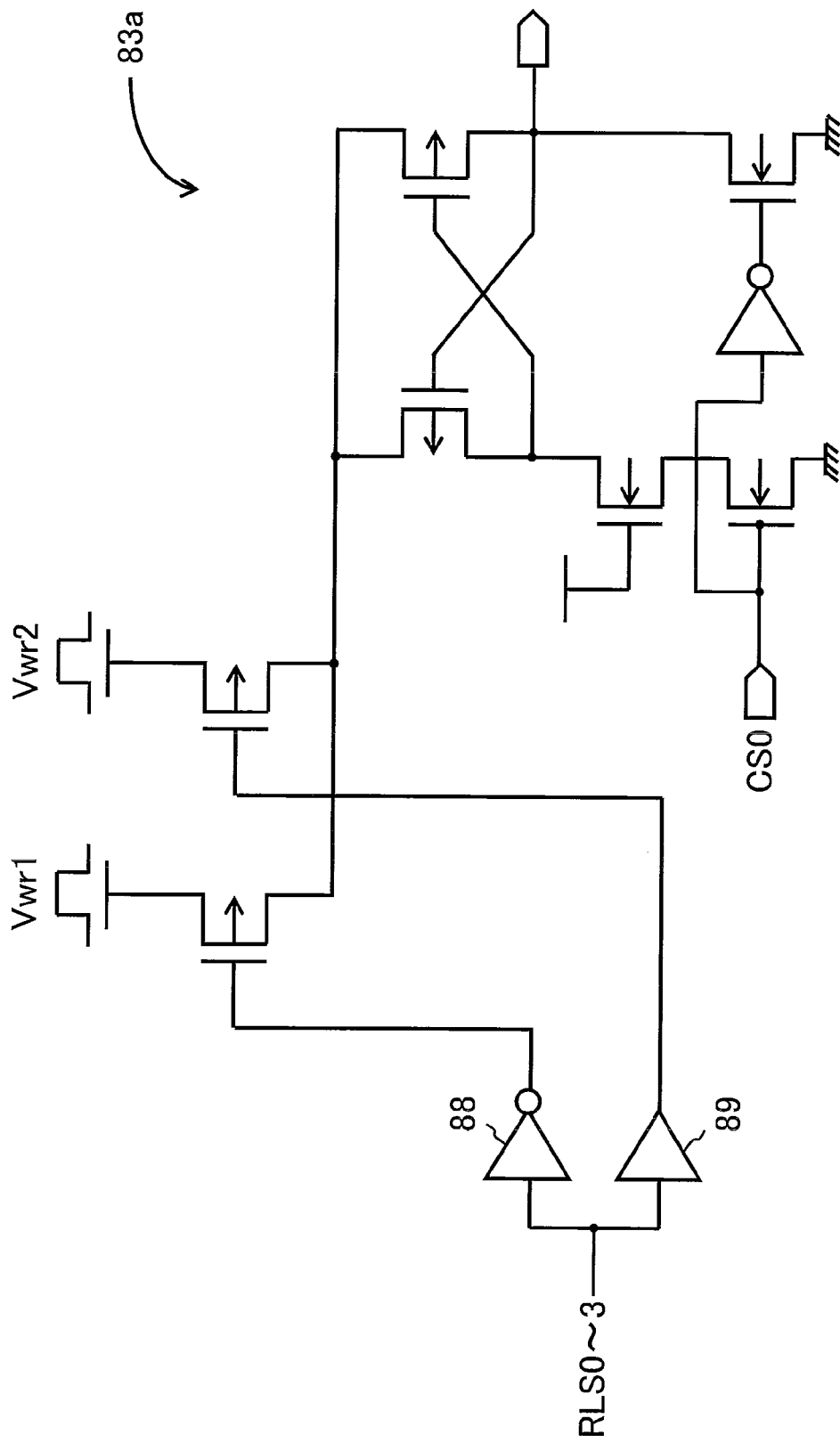
FIG. 20 is a circuit diagram showing a circuit configuration example of a bit line driver shown in FIG. 19.

As shown in FIG. 20, the bit line driver 83a is a buffer circuit provided with a level shifter, in which the high potential during writing operation can be individually selected by load resistance switching signals RLS0 to 3 between the voltage amplitude Vwr1 of the set voltage and the voltage amplitude Vwr2 of the reset voltage. A column selecting signal CS0 inputted to the bit line driver 83a selects the bit lines BL0 to 3 at high level at the same time and does not select them at low level at the same time. An inverter circuit 88 and a buffer circuit 89 to receive the load resistance switching signal RLS0 to 3 are each provided with a level shifter, and the circuit configurations thereof are the same as the inverter circuit 32 and the buffer circuit 33 shown in FIGS. 10B and 10C. The inverter circuit 88 becomes unselected state when the load resistance switching signals RLS0 to 3 are at low level and outputs the voltage Vwr2, and becomes selected state when the load resistance switching signals RLS0 to 3 are at high level and outputs the ground voltage Vss (0 V). Meanwhile, the buffer circuit 89 becomes unselected state when the load resistance switching signals RLS0 to 3 are at high level and outputs the voltage Vwr1, and becomes selected state when the load resistance switching signals RLS0 to 3 are at low level and outputs the ground voltage Vss (0 V).

The load resistive characteristic variable circuit 14 may have the circuit configuration shown in FIGS. 10A and 10D or FIGS. 11A to 11E similar to the first embodiment.

Since the word line decoder 12, the readout circuit 15, and the control circuit 16 are the same as those in the first embodiment, the overlapping description will not be given.

Next, a description will be made of the writing operation in the plurality of memory cells in the device 80 of the present invention in which the set operation and reset operation are mixed.

First, when the control circuit 16 is instructed by an address signal, a data entry signal, a control input signal, or the like from the external to write into a memory cell to be written specified by the address signal, it activates the voltage switch circuit 87 and gives instruction to output voltage to be applied to each of the selected word line, unselected word line, selected bit line, and unselected bit line, during writing operation. The voltage switch circuit 87 supplies the bit line driver 83a, the inverter circuit 88 and the buffer circuit 89 with the writing voltages Vwr1 and Vwr2 generated in a voltage generation circuit (not shown), supplies the word line driver 12a with the writing voltage Vwr1, and supplies the word line decoder 12 and the bit line decoder 83 with the ground voltage Vss. As a result, the ground voltage Vss and the writing voltage Vwr1 are applied to the selected word line and the unselected word line, respectively. In addition, the writing voltage Vwr1 or Vwr2 is supplied to the selected bit line through the load resistive characteristic variable circuit 14, and the ground voltage Vss is applied to the unselected bit line through the load resistive characteristic variable circuit 14. Therefore, the forward biased writing voltage Vwr1 or Vwr2 is only applied to the selected memory cells connected between the plurality of selected bit lines and the one selected word line, and the voltage is not applied to the other unselected memory cells or reversely biased writing voltage Vwr1 or the difference between the two writing voltages Vwr1 and Vwr2 (Vwr1-Vwr2) is applied thereto. Thus, neither the set operation nor the reset operation is performed in the unselected memory cell.

In addition, the control circuit 16 controls the load resistive characteristic variable circuit 14 connected to each selected bit line connected to the selected memory cell as the writing target by a load resistance switching signal RLSi (i corresponds to each bit of the programming data) so as to implement the load resistive characteristics for the reset operation or the set operation corresponding to the writing data "0" or "1" of the selected memory cell. More specifically, in the load resistive characteristic variable circuit 14, when the programming data is "0", the load resistive characteristics on the low resistance side are selected, and when the programming data is "1", the load resistive characteristics on the high resistance side are selected.

Furthermore, the control circuit 16 individually controls the high potential level outputted from the bit line driver 83a connected to the load resistive characteristic variable circuit 14 corresponding to the respective selected memory cell as the writing target to be the reset voltage Vwr2 or the set voltage Vwr1 based on the programming data "0" or "1" of the selected memory cell, by the load resistance switching signal RLSi (i corresponds to each bit of the programming data). In addition, according to the present embodiment, the pulse widths of the set voltage pulse Vwr1 and the reset voltage pulse Vwr2 outputted from the bit line driver 83a are controlled by the control circuit 16 to be the same pulse width (application time).

Thus, the control circuit 16 controls the load resistive characteristic variable circuit 14 and the bit line driver 83a, so that the absolute value of the reset voltage Vwr2 is set to be equal to or higher than the first critical voltage VB, and the absolute value of the set voltage Vwr1 is set to be equal to or higher than the second critical voltage VA, and the reset operation for the memory cell of the programming data "0" and the set operation for the memory cell of the programming data "1" are executed at the same time.

As for the memory cell whose programming data is "0" and stored data is "1", since the load resistive characteristics of the load circuit are set on the low resistance side, the voltage fluctuation applied to the load circuit before and after the reset operation is controlled to be small, so that the voltage applied to both ends of the variable resistive element after the reset operation can be controlled to be equal to or lower than the second threshold voltage (Va) and the reset operation can be completed stably. Even when the voltage equal to or higher than the second threshold voltage (Va) is applied to both ends of the variable resistive element after the reset operation while the writing voltage pulse is applied, at a final stage, as the reset voltage Vwr2 is lowered, the state in which the applied voltage after the reset operation becomes lower than the second threshold voltage (Va) occurs prior to the state in which the applied voltage before the reset operation becomes lower than the first threshold voltage (Vb), so that the reset operation can be executed stably. Here, similarly, even when the original stored data is "0" (resistive characteristics are the high resistance state), the data "0" is programmed eventually. Therefore, in the reset operation, the data "0" is programmed regardless of the original stored data.

As for the memory cell whose programming data is "1" and stored data is "0", since the load resistive characteristics of the load circuit are set on the high resistance side, the voltage fluctuation applied to the load circuit before and after the set operation is larger than that before and after the reset operation, so that the voltage applied to both ends of the variable resistive element after the set operation can be controlled to be equal to or lower than the first threshold voltage (Vb) and the set operation can be completed stably. Even when the voltage equal to or higher than the first threshold voltage (Vb) is applied to both ends of the variable resistive element after the set operation while the writing voltage pulse is applied, at a final stage, as the set voltage Vwr1 is lowered, the state in which the applied voltage after the set operation becomes lower than the first threshold voltage (Vb) occurs prior to the state in which the voltage before the set operation becomes lower than the second threshold voltage (Va), so that the set operation can be executed stably. Here, similarly, even when the original stored data is "1" (resistive characteristics are the low resistance state), the data "1" is programmed eventually. Therefore, in the set operation, the data "1" is programmed regardless of the original stored data.

Fifth Embodiment

Next, a fifth embodiment of the device of the present invention will be described. According to the fourth embodiment, when the 1D1R type memory cell is used, the writing operations in which the set operation and reset operation are mixed can be performed for the plurality of memory cells at the same time by the unipolar switching operation in which the load resistive characteristics of the load circuit are switched between the set operation and the reset operation and the application time of the writing voltages Vwr1 and Vwr2 are set to be equal. However, the memory cell is not limited to the 1D1R type, even when the memory cell is a 1T1R type memory cell configured by the variable resistive element and a transistor for selecting the memory cell (MOSFET and the like), similarly, the writing operations in which the set operation and reset operation are mixed can be performed for the plurality of memory cells at the same time by the unipolar switching operation in which the load resistive characteristics of the load circuit are switched between the set operation and the reset operation and the application time of the writing voltages Vwr1 and Vwr2 are set to be equal to each other. Hereinafter, a description will be made of the fifth embodiment in which the 1T1R type memory cell is used with reference to the drawings. It should be noted that the same reference symbols are given to the same components as those in the first embodiment and the second embodiment.

Figure 21:
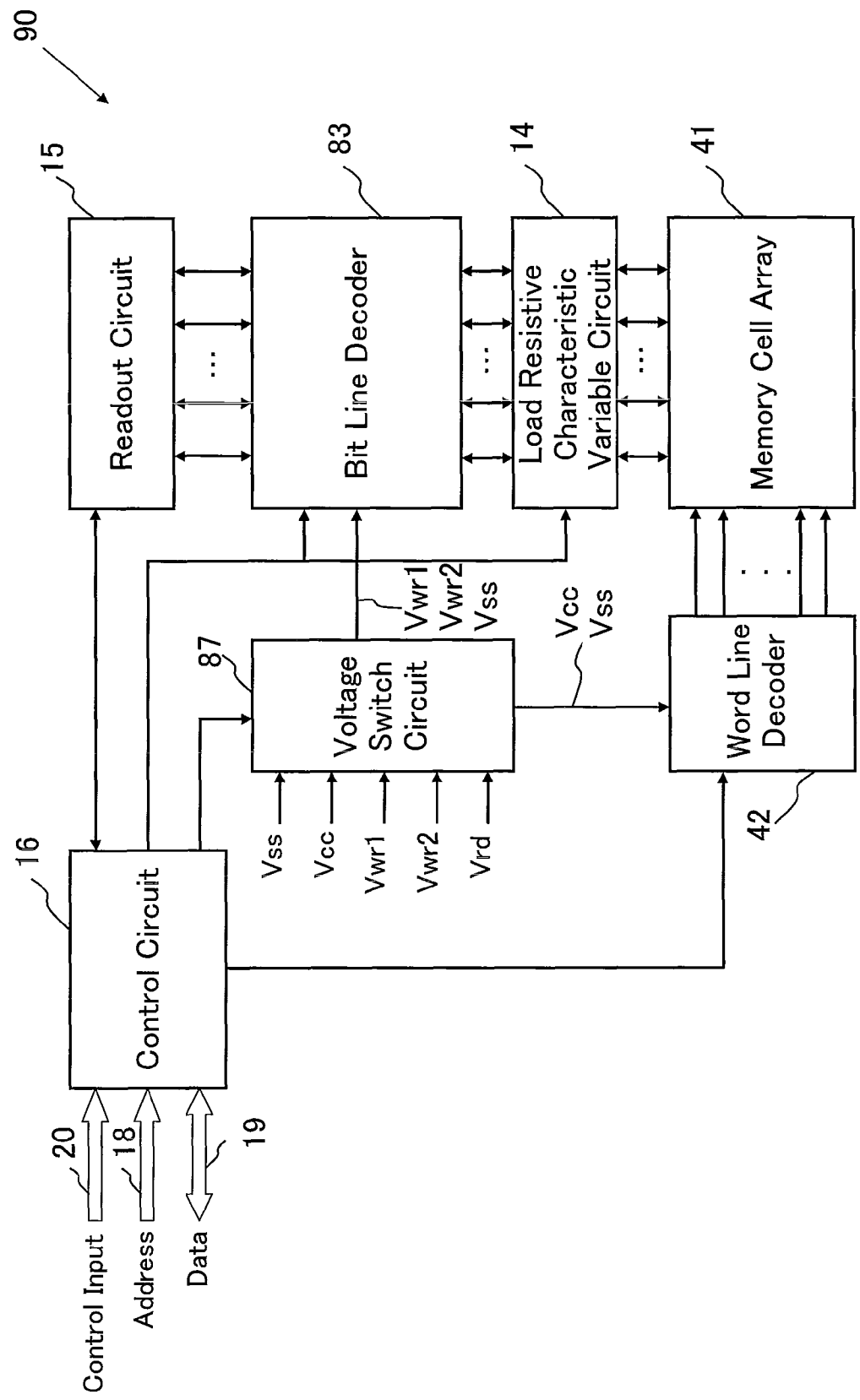
FIG. 21 is a block diagram showing a schematic example of circuit configuration in a fifth embodiment of the nonvolatile semiconductor memory device according to the present invention.

As shown in FIG. 21, a block configuration of a device 90 of the present invention in the fifth embodiment is substantially the same as the block configuration shown in FIG. 18 in the fourth embodiment or the block configuration shown in FIG. 12 in the second embodiment, and differs from the fourth embodiment only by the memory cell array 41 and the word line decoder 42, and differs from the second embodiment by the bit line driver 83a of the bit line decoder 83 and the voltage switch circuit 87.

Since the 1T1R type memory cell, the memory cell array 41, and the word line decoder 42 are the same as those described in the second embodiment, the overlapping description will not be given. In addition, the bit line driver 83a of the bit line decoder 83 and the voltage switch circuit 87 are the same as those described in the fourth embodiment, the overlapping description will not be given.

Since the readout circuit 15 and the control circuit 16 are the same as those described in the first embodiment, the overlapping description will not be given. In addition, since the writing operations for the plurality of memory cells in the device 90 of the present invention in which the set operation and reset operation are mixed are the same as those in the fourth embodiment except that the applied voltages of the selected word line and the unselected word line determined by the word line decoder 42 are different, and the set operation and the reset operation for the selected memory cell are replaced with the selection transistor in which the forward biased diode is on in the selected memory cell, the overlapping description will not be given.

In addition, according to the fifth embodiment, since the selection transistors are off in all of the unselected memory cells connected to the unselected word line, the writing voltages Vwr1 and Vwr2 are not applied to both ends of the variable resistive element, so that both the set operation and the reset operation are not performed. In addition, as for the unselected memory cells connected to the selected word line and the unselected bit line, since the unselected bit line and the source line are at the ground voltage Vss, even when the selection transistor is on, the voltage is not applied to the variable resistive element, so that both the set operation and the reset operation are not performed.

In the following, we describe alternative embodiments of the device of the present invention.

(1) In the respective embodiments described above, as a variable resistive element comprising memory cells, Ti/TiON/TiN structure or TiN/TiON/TiN structure is adopted. However, the structure and material of the variable resistive element in each embodiment shall not be limited to the materials of the respective structures described above. As the variable resistive element, when voltage is applied to the other terminal relative to one terminal with at least one of positive and negative polarities, the resistive characteristics specified by the current-voltage characteristics between two terminals can transmit between two resistive characteristics of low resistance state and high resistance state that can be taken stably, and if the variable resistive element has a first threshold voltage being the lower limit of an absolute value of applied voltage necessary for said resistive characteristics to transit from the low resistance state to the high resistance state and a second threshold voltage being the lower limit of an absolute value of applied voltage necessary for said resistive characteristics to transit from the high resistance state to the low resistance state, in which the first threshold voltage is lower than the second threshold voltage, the present invention may be applicable to any material or structure.

As a variable resistor of a variable resistive element to which the present invention can apply, metal oxides, metal oxynitrides, or organic thin film, etc. may be applied. In particular, the variable resistive element using oxides or oxynitrides including transition metal, oxides or oxynitrides including elements to be selected from Mn, Fe, Ni, Co, Ti, Cu and V or the variable resistive element using perovskite-type oxides such as PCMO, etc. is a variable resistive element having a first threshold voltage that is lower than a second threshold voltage and capable of producing similar effect when used in the present invention, although voltage values of the first threshold voltage and the second threshold voltage differ for individual structure or every material.

In addition, not only material of the upper and lower electrodes of the variable resistive element but also that of the word line and bit line shall not be limited to those in the respective embodiments described above.

(2) In the above first and fourth embodiment, the diode 22 comprising the memory cells may be formed either on upper or lower side of the variable resistive element 21. In addition, the diode 22 shall not be limited to the PN-junction type diode, and may be formed of Schottky barrier diodes. Otherwise, depending on polarity of applied voltage, forward direction of the diode 22 may be reversed to the direction shown in the above first and fourth embodiment.

In addition, use of a nonlinear device such as a varistor, etc. that does not show rectification behavior, but does not conduct electricity unless applied voltage exceed certain point instead of the diode 22 comprising the memory cells could produce the effect of reducing sneak path current in the cross-point type memory cell array. In this case, the circuit configuration of the third embodiment may be used.

(3) In the second and fifth embodiments, the variable resistive element 51 is connected to the bit line, and the source region 56 of the selection transistor 52 is connected to the source line. However, as another memory cell configuration, the arrangement of the variable resistive element 51 and the selection transistor 52 may be exchanged so that the selection transistor is connected to the bit line, and the variable resistive element is connected to the source line.

Figure 22:
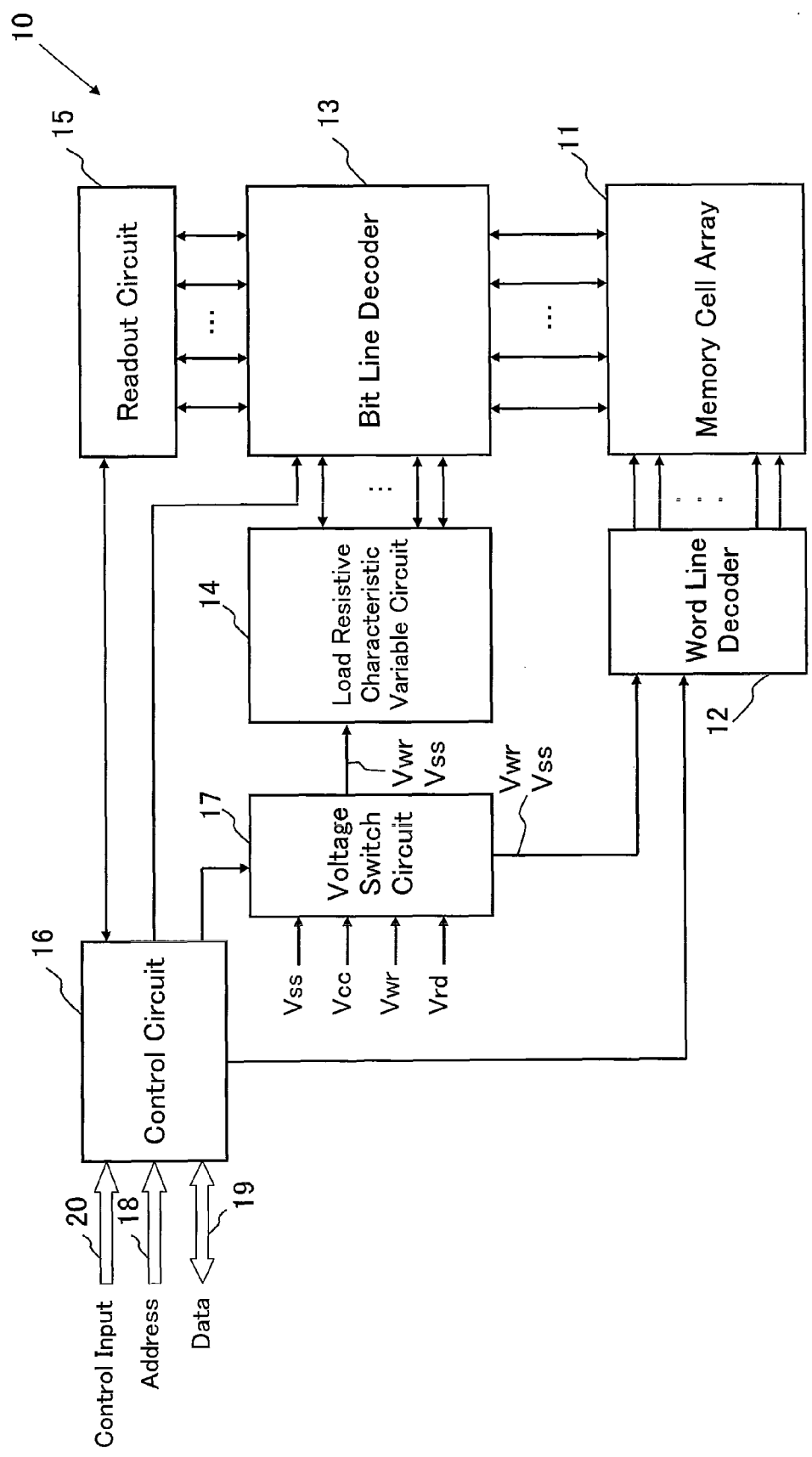
FIG. 22 is a block diagram showing a schematic example of circuit configuration in another embodiment of the nonvolatile semiconductor memory device according to the present invention.

(4) In the respective embodiments described above, the load resistive characteristic variable circuit 14 is provided between the bit line decoder 13, 83 and the memory cell array 11, 41 with respect to each bit line. However, the arranged position of the load resistive characteristic variable circuit 14 is not limited to the position between the bit line decoder 13, 83 and the memory cell array 11, 41, and it may not be arranged with respect to each bit line. For example, as shown in FIG. 22, as compared with the block configuration in the first embodiment, the load resistive characteristic variable circuit 14 may be provided between the bit line decoder 13 and the voltage switch circuit 17 so as to be electrically connected to each of the plurality of selected bit lines selected by the bit line decoder 13. In this case, the load resistive characteristics of the load circuit connected to each of the selected bit lines are set to either one of the two different load resistive characteristics by the load resistive characteristic variable circuit 14, based on whether the programming data is "0" or "1". The control for the load resistive characteristic variable circuit 14 is the same as that in the first embodiment, the overlapping description will not be given.

(5) In the respective embodiments described above, although the description has been made assuming that the pulse width of the writing voltage pulse is the same between the set operation and the reset operation, the pulse widths of the set operation and the reset operation may be different within a range of being 100 ns or less although it is not to be as different as the pulse widths in a conventional unipolar switching operation. Thus, since the writing operation that completes earlier because of the shorter pulse width can be finished first, the power consumption can be reduced during writing, and in addition, the high-speed writing as fast as 100 ns or less can be kept regardless of the set operation and the reset operation.

(6) In the above first, third, and fourth embodiments, although the configuration of the cross point memory cell array is such that the plurality of word lines extend in the row direction, the bit lines extend in the column direction, the first ends of the plurality of memory cells arranged in the same row are connected to the common word line, and the second ends of the plurality of memory cells arranged in the same column are connected to the common bit line, in the case where the memory cell has the two-terminal structure, even when the word lines are replaced with the bit lines and the load resistive characteristic variable circuits are connected to the respective word lines, the same operation effect can be achieved as those in the above first, third, and fourth embodiments by replacing the word line decoder with the bit line decoder similarly.

(7) In the respective embodiments described above, although the description has been made of the case where the set operation and the reset operation are executed at the same time by the high-speed unipolar switching operation, when the memory cell is the 1T1R type, the set operation and the reset operation can be performed at the same time by the bipolar switching operation without using the negative voltage, by providing a pair of bit line and source line with respect to each column and switching the polarities of the writing voltage applied between the bit line and the source line between the set operation and the reset operation.

INDUSTRIAL APPLICABILITY

The present invention can be used in a nonvolatile semiconductor memory device comprising a variable resistive element resistive characteristics of which change as result of voltage application, and, in particular, is effective in implementation of the nonvolatile semiconductor memory device capable of writing a plurality of memory cells at the same time by high-speed switching operations to the variable resistive element in a stable manner.

The invention claimed is:

1. A nonvolatile semiconductor memory device comprising:
   a memory cell array in which a plurality of two-terminal or three-terminal structured nonvolatile memory cells are arranged in a row direction and a column direction, first terminals of the plurality of memory cells arranged in a same row are connected to a common word line, and second terminals of the plurality of memory cells arranged in a same column are connected to a common bit line;
   a word line selection circuit adapted to select a predetermined number of word lines from a plurality of word lines;
   a bit line selection circuit adapted to select a predetermined number of bit lines from a plurality of bit lines; and
   a plurality of load resistive characteristic variable circuits connected to the respective bit lines, wherein
   each of the memory cells has a variable resistive element having two terminals,
   the variable resistive element is configured such that resistive characteristics defined by current-voltage characteristics between the two terminals can transit between two stable resistive characteristics of a low resistance state and a high resistance state when a voltage is applied from one terminal to the other terminal with at least one of positive and negative polarities, a first threshold voltage as a lower limit value of an absolute value of an applied voltage required for the resistive characteristics to transit from the low resistance state to the high resistance state is lower than a second threshold voltage as a lower limit value of an absolute value of an applied voltage required for the resistive characteristics to transit from the high resistance state to the low resistance state, and storage state of the variable resistive element is determined based on whether the resistive characteristics of the variable resistive element are the low resistance state or the high resistance state,
   each of the load resistive characteristic variable circuits has two different load resistive characteristics defined by the current-voltage characteristics and is configured to select one of the two load resistive characteristics individually based on whether a first writing operation is performed or a second writing operation is performed, the first writing operation having the resistive characteristics of the variable resistive element to be written transit from the low resistance state to the high resistance state, the second writing operation having the resistive characteristics of the variable resistive element to be written transit from the high resistance state to the low resistance state, and
   a writing voltage pulse application circuit is provided to apply a first voltage pulse to be applied in the first writing operation and a second voltage pulse to be applied in the second writing operation to the memory cells to be written through the load resistive characteristic variable circuits and the bit lines.

2. The nonvolatile semiconductor memory device according to claim 1, wherein
   when the plurality of memory cells to be written includes the memory cells to be subjected to the first writing operation and the memory cells to be subjected to the second writing operation and exist in the same row,
   the word line selection circuit selects one word line connected to the memory cells to be written,
   the bit line selection circuit selects the plurality of bit lines connected to the memory cells to be written,
   the load resistive characteristics of the load resistive characteristic variable circuits connected to the selected bit lines selected by the bit line selection circuit are set based on whether the memory cells to be written connected to the corresponding selected bit lines are to be subjected to the first writing operation or the second writing operation, and
   the writing voltage pulse application circuit applies the first voltage pulse or the second voltage pulse to each of the memory cells connected to the selected bit lines through a corresponding one of the load resistive characteristic variable circuits and a corresponding one of the selected bit lines at the same time.

3. The nonvolatile semiconductor memory device according to claim 2, wherein
   the load resistive characteristic variable circuits are electrically connected to the respective selected bit lines selected by the bit line selection circuit during writing operation instead of being connected to the respective bit lines.

4. The nonvolatile semiconductor memory device according to claim 1, wherein
   the memory cells have a two-terminal structure having a serial circuit of the variable resistive element and a diode.

5. The nonvolatile semiconductor memory device according to claim 1, wherein
   the memory cells have a three-terminal structure in which one terminal of the variable resistive element is connected to a drain terminal or a source terminal of an MOSFET, and
   each of the first terminals of the memory cells is a gate terminal of the MOSFET.

6. The nonvolatile semiconductor memory device according to claim 1, wherein
   the load resistive characteristics of the load resistive characteristic variable circuits selected in the first writing operation are lower than the load resistive characteristics of the load resistive characteristic variable circuits selected in the second writing operation.

7. The nonvolatile semiconductor memory device according to claim 1, wherein
   the first voltage pulse and the second voltage pulse have a same voltage polarity.

8. The nonvolatile semiconductor memory device according to claim 7, wherein
   an absolute value of voltage amplitude is same between the first voltage pulse and the second voltage pulse.

9. The nonvolatile semiconductor memory device according to claim 7, wherein
   both pulse width of the first voltage pulse and pulse width of the second voltage pulse are 100 ns or less.

10. The nonvolatile semiconductor memory device according to claim 7, wherein pulse width of the first voltage pulse and pulse width of the second voltage pulse have a same length.

11. The nonvolatile semiconductor memory device according to claim 1, wherein
    the variable resistive element comprises a variable resistor of an oxide or oxynitride containing a transition metal.

* * * * *